United States Patent
Kasai et al.

(10) Patent No.: US 10,074,660 B2
(45) Date of Patent: Sep. 11, 2018

(54) SEMICONDUCTOR MEMORY DEVICE

(71) Applicant: Floadia Corporation, Kodaira-shi, Tokyo (JP)

(72) Inventors: Hideo Kasai, Tokyo (JP); Yasuhiro Taniguchi, Tokyo (JP); Yasuhiko Kawashima, Tokyo (JP); Ryotaro Sakurai, Tokyo (JP); Yutaka Shinagawa, Tokyo (JP); Tatsuro Toya, Tokyo (JP); Takanori Yamaguchi, Tokyo (JP); Fukuo Owada, Tokyo (JP); Shinji Yoshida, Tokyo (JP); Teruo Hatada, Tokyo (JP); Satoshi Noda, Tokyo (JP); Takafumi Kato, Tokyo (JP); Tetsuya Muraya, Tokyo (JP); Kosuke Okuyama, Tokyo (JP)

(73) Assignee: FLOADIA CORPORATION, Tokyo (JP)

(*) Notice: Subject to any disclaimer, the term of this patent is extended or adjusted under 35 U.S.C. 154(b) by 0 days.

(21) Appl. No.: 15/553,465

(22) PCT Filed: Feb. 19, 2016

(86) PCT No.: PCT/JP2016/054809
§ 371 (c)(1),
(2) Date: Aug. 24, 2017

(87) PCT Pub. No.: WO2016/136604
PCT Pub. Date: Sep. 1, 2016

(65) Prior Publication Data
US 2018/0019248 A1    Jan. 18, 2018

(30) Foreign Application Priority Data
Feb. 25, 2015   (JP) .................... 2015-035858

(51) Int. Cl.
| | |
|---|---|
| *H01L 27/108* | (2006.01) |
| *H01L 27/112* | (2006.01) |
| *H01L 23/525* | (2006.01) |

(52) U.S. Cl.
CPC .... *H01L 27/11206* (2013.01); *H01L 23/5252* (2013.01)

(58) Field of Classification Search
CPC ......... H01L 23/49833; H01L 23/49855; H01L 23/4985; H01L 23/5227; H01L 23/5252;
(Continued)

(56) References Cited

U.S. PATENT DOCUMENTS

| | | |
|---|---|---|
| 6,667,902 B2 | 12/2003 | Peng |
| 2008/0042235 A1 | 2/2008 | Kodama |

(Continued)

FOREIGN PATENT DOCUMENTS

| | | |
|---|---|---|
| JP | 2008-047702 A | 2/2008 |
| JP | 2009-147003 A | 7/2009 |

(Continued)

OTHER PUBLICATIONS

International Search Report issued in Patent Application No. PCT/JP2016/054809 dated May 17, 2016.
(Continued)

*Primary Examiner* — Brook Kebede
(74) *Attorney, Agent, or Firm* — Pearne & Gordon LLP

(57) ABSTRACT

In a semiconductor memory device, voltage application from a memory gate electrode of the memory capacitor to a word line can be blocked by a rectifier element depending on values of voltages applied to the memory gate electrode and the word line without using a conventional control circuit. The configuration eliminates the need to provide a switch transistor and a switch control circuit for turning on and off the switch transistor as in conventional cases, and accord- (Continued)

ingly achieves downsizing. In the semiconductor memory device, for example, each bit line contact is shared by four anti-fuse memories adjacent to each other and each word line contact is shared by four anti-fuse memories adjacent to each other, thereby achieving downsizing of the entire device as compared to a case in which the bit line contact and the word line contact are individually provided to each anti-fuse memory.

13 Claims, 18 Drawing Sheets

(58) Field of Classification Search
CPC ........... H01L 23/5329; H01L 23/53257; H01L 23/53271; H01L 23/66; H01L 27/0629; H01L 27/105; H01L 27/11206; H01L 27/112; H01L 27/124
USPC ............................................ 257/57, 71, 296
See application file for complete search history.

(56) References Cited

U.S. PATENT DOCUMENTS

| | | |
|---|---|---|
| 2009/0152610 A1 | 6/2009 | Minami et al. |
| 2010/0061136 A1* | 3/2010 | Koyama ................ G11C 17/16 365/96 |
| 2010/0072474 A1* | 3/2010 | Abe .................. H01L 23/49855 257/57 |
| 2013/0051113 A1 | 2/2013 | Kwon |

FOREIGN PATENT DOCUMENTS

| | | |
|---|---|---|
| JP | 2010-087494 A | 4/2010 |
| JP | 5756971 B1 | 7/2015 |

OTHER PUBLICATIONS

Written Opinion issued in Patent Application No. PCT/JP2016/054809 dated May 17, 2016.

* cited by examiner

SEMICONDUCTOR MEMORY DEVICE

TECHNICAL FIELD

The present invention relates to a semiconductor memory device, and is suitable for application to for example, a semiconductor memory device including anti-fuse memories arranged in a matrix of rows and columns.

BACKGROUND ART

An anti-fuse memory having a configuration as disclosed in U.S. Pat. No. 6,667,902 (Patent Literature 1) is a known example of a conventional anti-fuse memory to which data can be programmed only once by breaking an insulating film. The anti-fuse memory disclosed in Patent Literature 1 has a two-transistor configuration including a switch transistor and a memory capacitor arranged side by side on a well.

In the switch transistor included in the transistor configuration, a switch gate electrode is disposed on the well through a switch gate insulating film and connected with a word line, and one of diffusion regions formed on the surface of the well is connected with a bit line. In the memory capacitor in a pair with the switch transistor, a memory gate electrode is disposed on the well through a memory gate insulating film and connected with a programming word line different from the word line connected with the switch gate electrode.

At data programming operation, in the memory capacitor, dielectric breakdown occurs to the memory gate insulating film due to a voltage difference between a breakdown word voltage applied from the programming word line to the memory gate electrode and a dielectric breakdown bit voltage applied to the bit line of the switch transistor. Accordingly, the memory gate electrode, which has been insulated from the well, is electrically connected with the surface of the well, in other words, a region in which a memory channel is formed, due to the dielectric breakdown of the memory gate insulating film.

At data reading operation, when breakdown has occurred to the memory gate insulating film and voltage is applied to a programming word line connected with a bit line to be read, the voltage applied to the programming word line is applied to the other diffusion region of the switch transistor through the memory channel. The switch transistor is turned on due to voltages applied from the word line connected with the switch gate electrode and the bit line connected with the diffusion region. Accordingly, the state of electrical connection between the memory gate electrode of the corresponding memory capacitor and the memory channel can be determined based on change in the voltage applied to the bit line to determine whether data is programmed.

CITATION LIST

Patent Literature

Patent Literature 1: U.S. Pat. No. 6,667,902

SUMMARY OF INVENTION

Technical Problem

However, in the conventional anti-fuse memory having the above-described configuration, since the switch transistor is provided separately and independently from the memory capacitor, a switch control circuit for turning on and off the switch transistor needs to be provided in addition to a control circuit configured to apply a breakdown word voltage to the memory capacitor, which provides difficulties in downsizing.

In such a semiconductor memory device including anti-fuse memories arranged in a matrix of rows and columns, optimum voltages need to be applied to anti-fuse memories arranged in the matrix to cause dielectric breakdown to the memory gate insulating film of a certain anti-fuse memory but no dielectric breakdown to the memory gate insulating film of any other anti-fuse memories. Thus, it is needed to efficiently arrange wires for applying the voltages to the anti-fuse memories while achieving downsizing of the entire device.

The present invention is intended to solve the above-described problem by disclosing a semiconductor memory device that achieves downsizing as compared to conventional cases.

Solution to Problem

To solve the above-described problem, a semiconductor memory device according to an aspect of the present invention is a semiconductor memory device including anti-fuse memories at intersections between a plurality of word lines and a plurality of bit lines. Each anti-fuse memory includes: a memory capacitor in which a memory gate electrode is disposed through a memory gate insulating film and the bit line is connected to, through a bit line contact, a diffusion region disposed in a well; and a rectifier element disposed between the memory gate electrode and the word line and configured to allow voltage application from the word line to the memory gate electrode through a word line contact and block voltage application from the memory gate electrode to the word line depending on values of voltages applied to the memory gate electrode and the word line. Each bit line contact is shared by two or more of the anti-fuse memories.

A semiconductor memory device according to another aspect of the present invention is a semiconductor memory device including anti-fuse memories at intersections between a plurality of word lines and a plurality of bit lines. Each anti-fuse memory includes: a memory capacitor in which a memory gate electrode is disposed through a memory gate insulating film and the bit line is connected to, through a bit line contact, a diffusion region disposed on a well; and a rectifier element disposed between the memory gate electrode and the word line and configured to allow voltage application from the word line to the memory gate electrode through a word line contact and block voltage application from the memory gate electrode to the word line depending on values of voltages applied to the memory gate electrode and the word line. Each word line contact is shared by two or more of the anti-fuse memories.

Advantageous Effects of Invention

According to the present invention, the voltage applied to the memory gate electrode of the memory capacitor and the voltage applied to the word line allow a rectifier element to block the application of voltage from the memory gate electrode to the word line, without using a conventional control circuit. Hence, the conventional switch transistor that selectively applies a voltage to the memory capacitor and the conventional switch control circuit that turns the switch transistor on or off are unnecessary, so that miniaturization is achieved correspondingly.

In addition, according to the present invention, each bit line contact and/or each word line contact is shared by at least two of anti-fuse memories, thereby downsizing as compared to a case in which the bit line contact and the word line contact are provided to each anti-fuse memory.

DESCRIPTION OF EMBODIMENTS

Figure 1:
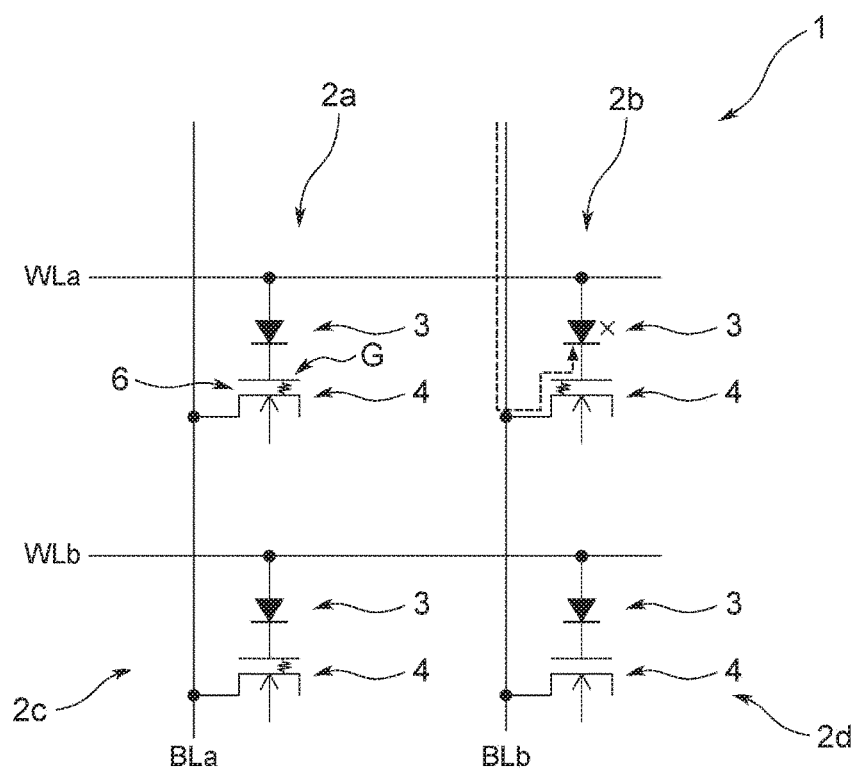
FIG. 1 is a circuit diagram illustrating a basic circuit configuration of a semiconductor memory device according to the present invention.

Embodiments of the present invention will be described below in detail with reference to the accompanying drawings.

Hereinafter, embodiments of the present invention will be described in the following order.

1. Basic concept of semiconductor memory device according to the present invention including anti-fuse memories provided in a matrix of rows and columns
1-1. Basic configuration
1-2. Data programming operation
1-3. Data reading operation
1-4. Operations and effects of semiconductor memory device having the above-described configuration
2. Case in which each word line contact and each bit line contact are shared by four anti-fuse memories
2-1. Planar layout configuration
2-2. Planar layout configuration of bit lines and word lines
3. Planar layout configuration of bit lines and word lines according to another embodiment
4. Case in which each word line contact is shared by two anti-fuse memories and each bit line contact is shared by a plurality of anti-fuse memories arranged in column direction
5. Case in which each word line contact is shared by a plurality of anti-fuse memories arranged in row direction and each bit line contact is shared by two anti-fuse memories
6. Anti-fuse memory including rectifier element as N-type Metal-oxide-semiconductor (MS) transistor
6-1. Basic configuration
6-2. Data programming operation
6-3. Operations and effects of semiconductor memory device having the above-described configuration
7. Case in which each word line contact and each bit line contact are shared by four anti-fuse memories
7-1. Planar layout configuration
7-2. Planar layout configuration of bit lines and word lines
8. Planar layout configuration of bit lines and word lines according to another embodiment
9. Case in which each word line contact is shared by two anti-fuse memories and each bit line contact is shared by a plurality of anti-fuse memories arranged in column direction
10. Case in which each word line contact is shared by a plurality of anti-fuse memories arranged in row direction and each bit line contact is shared by two anti-fuse memories
11. Other embodiments
11-1. Anti-fuse memory including rectifier element as B-type MOS transistor 11-2. Configurations of anti-fuse memory including rectifier element having transistor configuration according to other embodiments
11-3. Others
(1) Basic Concept of Semiconductor Memory Device According to the Present Invention Including Anti-fuse Memories Provided in a Matrix of Rows and Columns
(1-1) Basic Configuration In FIG. 1, reference numeral 1 denotes a semiconductor memory device according to the present invention. The semiconductor memory device 1 has a configuration in which, for example, four anti-fuse memories 2a, 2b, 2c, and 2d are arranged in a matrix of rows and columns. In the semiconductor memory device 1, a word line WLa (WLb) is shared by the anti-fuse memories 2a and 2b (2c and 2d) arranged in a row direction, and a bit line BLa (BLb) is shared by the anti-fuse memories 2a and 2c (2b and 2d) arranged in a column direction. The anti-fuse memories 2a, 2b, 2c, and 2d all have identical configurations, and thus the following description will be made mainly on, for example, the anti-fuse memory 2a on the first row and the first column. The anti-fuse memory 2a includes a rectifier element 3 having a semiconductor junction structure of a PN junction diode, and a memory capacitor 4 including a memory gate insulating film 6 in which dielectric breakdown occurs depending on a voltage difference between a memory gate electrode G and a bit line BLa.

In the present embodiment, the rectifier element 3 includes a P-type semiconductor region and an N-type semiconductor region joined with each other. The P-type semiconductor region is connected with the word line WLa, and the N-type semiconductor region is connected with the memory gate electrode G of the memory capacitor 4. With the configuration, in the anti-fuse memory 2a, voltage is applied from the word line WLa to the memory gate electrode G of the memory capacitor 4 through the rectifier element 3, and voltage applied from the memory gate electrode G to the word line WLa is reverse-biased voltage at the rectifier element 3 and thus blocked by the rectifier element 3.

At data programming operation in each of the anti-fuse memories 2a, 2b, 2c, and 2d, when the voltage applied to the word line WLa or WLb is applied to the memory gate electrode G of the memory capacitor 4 through the rectifier element 3 to generate a large voltage difference between the memory gate electrode G and the bit line BLa or BLa at the memory capacitor 4, dielectric breakdown occurs to the memory gate insulating film 6 of the memory capacitor 4, thereby programming data to the memory capacitor 4.

Figure 2A:
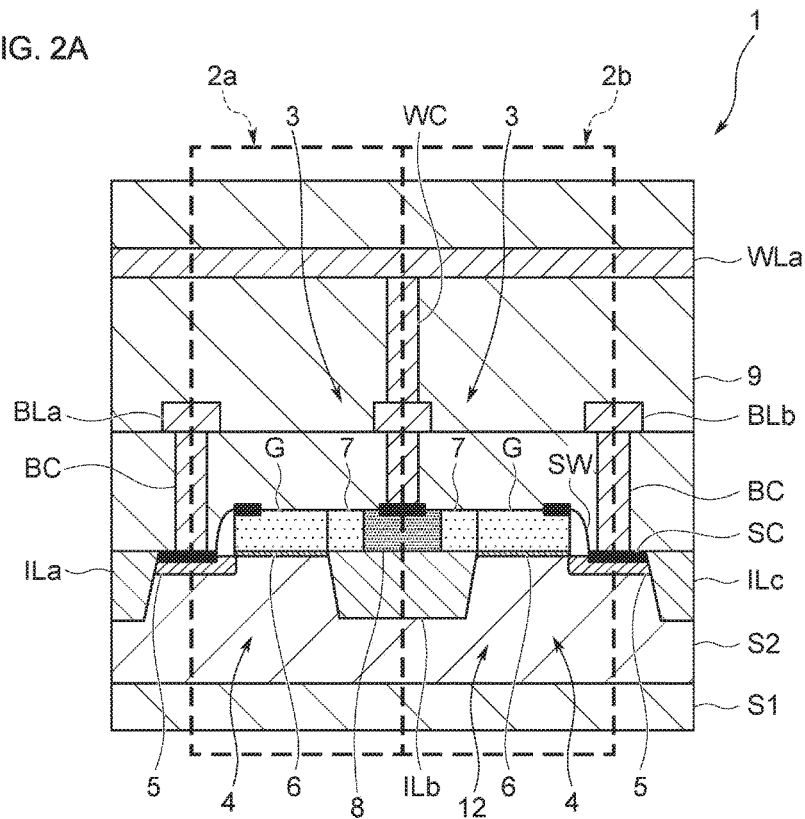
FIG. 2A is a schematic view illustrating a sectional configuration where two anti-fuse memories are arranged side by side.

The following describes the anti-fuse memories 2a, 2b, 2c, and 2d according to the present invention provided to the semiconductor memory device 1 in detail. The following description will be made mainly on, for example, the two anti-fuse memories 2a and 2b arranged on the first row in FIG. 1. As illustrated in FIG. 2A, in the semiconductor memory device 1, a P-type or N-type well S2 made of, for example, Si is formed on a semiconductor substrate S1, and a rectifier element formation layer ILb made of an insulating material is disposed on the surface of the well S2. Element isolation layers ILa and ILc made of an insulating material are disposed on the surface of the well S2, sandwiching the rectifier element formation layer ILb at predetermined intervals from the rectifier element formation layer ILb.

In the semiconductor memory device 1 thus configured, the memory capacitor 4 of the anti-fuse memory 2a is disposed between the rectifier element formation layer ILb and the element isolation layer ILa, and the memory capacitor 4 of the anti-fuse memory 2b is disposed between the rectifier element formation layer ILb and the element isolation layer ILc.

A diffusion region 5 is disposed adjacent to the element isolation layer ILa between the rectifier element formation layer ILb and the element isolation layer ILa on the surface of the well S2, and the memory gate electrode G is disposed between the diffusion region 5 and the rectifier element formation layer ILb on the well S2 through the memory gate insulating film 6. The configuration serves as a memory capacitor 4.

Another diffusion region 5 is disposed adjacent to the element isolation layer ILc between the rectifier element formation layer ILb and the element isolation layer ILc on the surface of the well S2, and the memory gate electrode G is disposed between the diffusion region 5 and the rectifier element formation layer ILb on the well S2 through the memory gate insulating film 6. The configuration serves as another memory capacitor 4.

In each diffusion region 5, a bit line contact BC is erected on a silicide SC, and a leading end of the bit line contact BC is connected with corresponding one of the bit lines BLa and BLb. With the configuration, for example, voltage is applied from the bit line BLa to the diffusion region 5 of the memory capacitor 4 of the anti-fuse memory 2a through the bit line contact BC. In addition to the configuration, the rectifier element 3 is disposed on the surface of the rectifier element formation layer ILb. In the present embodiment, the P-type semiconductor region 8 and the N-type semiconductor regions 7 on both sides of the P-type semiconductor region 8 are provided on the surface of the rectifier element formation layer ILb, and the semiconductor junction structure of each N-type semiconductor region 7 and the P-type semiconductor region 8 serves as the rectifier element 3 as a PN junction diode.

In this case in each of the anti-fuse memories 2a and 2b, the memory gate electrode G of the memory capacitor 4 is formed of an N-type semiconductor, and an end part of the memory gate electrode G is formed integrally with an end part of an N-type semiconductor region 7 of the rectifier element 3 disposed on the rectifier element formation layer ILb. In each of the anti-fuse memories 2a and 2b, the N-type semiconductor region 7 and the P-type semiconductor region 8 of the rectifier element 3 and the memory gate electrode G of the memory capacitor 4 are disposed within one wiring layer (within the same layer) and have identical thicknesses.

With the configuration, the anti-fuse memories 2a and 2b have no steps on the surfaces of junctions of the N-type semiconductor region 7 and the P-type semiconductor region 8 of the rectifier element 3 and the memory gate electrode G of the memory capacitor 4, thereby achieving reduction in the thickness of the entire device. In addition, the N-type semiconductor region 7 and the P-type semiconductor region 8 of the rectifier element 3 and the memory gate electrode G of the memory capacitor 4 of each of the anti-fuse memories 2a and 2b can be formed through the same deposition process, which leads to a simplified manufacturing process as compared to a case of separately forming the N-type semiconductor region 7, the P-type semiconductor region 8, and the memory gate electrode G of the memory capacitor 4.

A word line contact WC is erected on the silicide SC in the P-type semiconductor region 8 of the rectifier element 3, and the word line WLa disposed above the bit lines BLa and BLa is connected with the P-type semiconductor region 8 through the word line contact WC. Accordingly, for example, in the anti-fuse memory 2a, when voltage that is positive with respect to the memory gate electrode G is applied to the word line WLa, the voltage is applied from the word line WLa to the memory gate electrode G of the memory capacitor 4 sequentially through the word line contact WC and the P-type semiconductor region 8 and the N-type semiconductor region 7 of the rectifier element 3. In the anti-fuse memory 2a, when voltage that is positive with respect to the word line WLa is applied to the memory gate electrode G of the memory capacitor 4, the voltage from the memory gate electrode G, which is reverse-biased voltage at the rectifier element 3, is blocked between the N-type semiconductor region 7 and the P-type semiconductor region 8. The bit line contact BC, the word line contact WC, the rectifier element 3, the memory gate electrode G, the bit lines BLa and BLb, and the word line WLa formed on the well S2 are covered by an interlayer insulation layer 9.

Figure 2B:
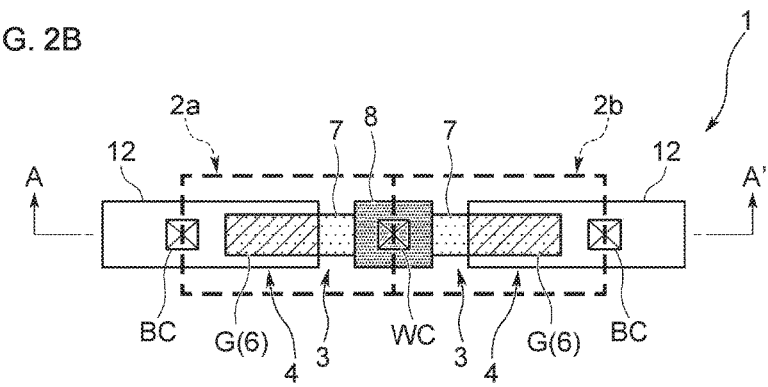
FIG. 2B is a schematic view illustrating a planar layout of the two anti-fuse memories illustrated in FIG. 2A.

FIG. 2B, in which any corresponding part to that in FIG. 2A is denoted by an identical reference sign, illustrates a planar layout configuration of the region illustrated in FIG. 2A, in which the anti-fuse memories 2a and 2b are provided. FIG. 2A illustrates a cross section taken along line A-A' in FIG. 2B. As illustrated in FIG. 2B, each bit line contact BC of the semiconductor memory device 1 is disposed in a corresponding active region 12 of the well S2. The rectangular N-type semiconductor regions 7 provided to the respective anti-fuse memories 2a and 2b adjacent to each other are symmetrically disposed with respect to the word line contact WC disposed at a central position of the rectangular P-type semiconductor region 8. Each N-type semiconductor region 7 has one end joined with a side of the P-type semiconductor region 8, a longitudinal direction thereof extends from the P-type semiconductor region 8 to the active region 12, and the memory gate electrode G joined with a leading end part thereof faces to the corresponding active region 12. The memory gate insulating film 6 of each of the anti-fuse memories 2a and 2b is disposed in a region in which the memory gate electrode G and the active region 12 face to each other.

The semiconductor memory device 1 having such a configuration can be formed by a typical semiconductor manufacturing process using a photolithography technique, a deposition technology such as oxidation or chemical vapor deposition (CVD), an etching technology, and an ion injection technique. Thus, description thereof is omitted.

(1-2) Data Programming Operation

The following describes data programming operation when data is programmed only to, for example, the anti-fuse memory 2c on the second row and the first column in the semiconductor memory device 1 having the configuration described above. In the following, the anti-fuse memory 2c to which data is programmed is also referred to as a selected program memory, and the anti-fuse memories 2a, 2b, and 2d to which no data is programmed are also referred to as nonselected program memories. In this case, as illustrated in FIG. 1, in the semiconductor memory device 1, a breakdown bit voltage of 0 V is applied to the bit line BLa (hereinafter also referred to as a selected programming bit line) connected with the anti-fuse memory 2c as a selected program memory, and a non-breakdown bit voltage of 3 V is applied to the bit line BLb (hereinafter also referred to as a nonselected programming bit line) connected only with the anti-fuse memories 2b and 2d as nonselected program memories.

Simultaneously, in the semiconductor memory device 1, a breakdown word voltage of 5 V is applied to the word line WLb (hereinafter also referred to as a selected programming word line) connected with the anti-fuse memory 2c as a selected program memory, and a non-breakdown word voltage of 0 V is applied to the word line WLa (hereinafter also referred to as a nonselected programming word line) connected only with the anti-fuse memories 2a and 2b as nonselected program memories. In the anti-fuse memory (selected program member) 2c, a breakdown word voltage of 5 V is applied from the word line WLb as a selected programming word line to the P-type semiconductor region 8 of the rectifier element 3, and a breakdown bit voltage of 0 V is applied from the bit line BLa as a selected programming bit line to the diffusion region 5 at one end of the memory capacitor 4.

Accordingly, in the anti-fuse memory 2c, the breakdown word voltage is applied from the rectifier element 3 to the memory gate electrode G of the memory capacitor 4, and the voltage of 0 V is applied from the bit line BLa to the diffusion region 5. As a result, a channel (not illustrated) of the memory capacitor 4 is turned on to have a potential equal to the potential of the bit line BLa. Thus, for example, when the PN junction diode of the rectifier element 3 has a built-in potential of 0.7 V, the anti-fuse memory 2c has a potential difference of 4.3 V between the channel and the memory gate electrode G, which causes dielectric breakdown at the memory gate insulating film 6 below the memory gate electrode G. Accordingly, the memory gate electrode G and the diffusion region 5 become a conductive state at low resistance through the channel, thereby achieving a data programmed state.

In the anti-fuse memory 2d on the other column, which is connected with the word line (selected programming word line) WLb to which the breakdown word voltage of 5 V is applied but to which no data is to be programmed, the non-breakdown bit voltage of 3 V is applied to the diffusion region 5 at one end of the memory capacitor 4 through the bit line (nonselected programming bit line) BLb. Accordingly, the voltage difference between the memory gate electrode G and the diffusion region 5 at the memory capacitor 4 decreases to 1.3 V (with the built-in potential of 0.7 V taken into account). Thus, in the anti-fuse memory 2d, when no dielectric breakdown occurs to the memory gate insulating film 6 below the memory gate electrode G at the memory capacitor 4, the memory gate insulating film 6 remains in an insulation state without dielectric breakdown, thereby maintaining a no-data programmed state.

In the anti-fuse memory 2b connected with the bit line (nonselected programming bit line) BLb to which the non-breakdown bit voltage of 3 V is applied but to which no data is to be programmed, the non-breakdown word voltage of 0 V is applied from the word line (nonselected programming word line) WLa to the memory gate electrode G through the rectifier element 3 when no dielectric breakdown occurs to the memory gate insulating film 6. Accordingly, the voltage difference between the memory gate electrode G and the diffusion region 5 connected with the bit line BLb at the memory capacitor 4 decreases to 3 V.

Thus, in the anti-fuse memory 2b, when no dielectric breakdown occurs to the memory gate insulating film 6 below the memory gate electrode G at the memory capacitor 4, the memory gate insulating film 6 remains in an insulation state without dielectric breakdown, thereby maintaining a no-data programmed state.

In the anti-fuse memory 2b to which the non-breakdown bit voltage of 3 V is applied from the bit line (nonselected programming bit line BLb, since the non-breakdown word voltage of 0 V is applied to the word line (nonselected programming word line) WLa, no channel is formed in the memory capacitor 4 when dielectric breakdown has already occurred to, for example, the memory gate insulating film 6 of the memory capacitor 4, and accordingly, the non-breakdown bit voltage of 3 V applied to the bit line BLb is blocked at the memory capacitor 4. As a result, in the anti-fuse memory 2d, the non-breakdown bit voltage is not applied to the memory gate electrode G through the memory gate insulating film 6 to which dielectric breakdown occurs.

However, when the dielectric breakdown of the memory gate insulating film 6 occurs, for example, at a place extremely close to the diffusion region 5 connected with the bit line (nonselected programming bit line) BLb, the potential of the bit line Bib cannot be blocked by the channel of the memory capacitor 4, and thus the non-breakdown bit voltage of 3 V applied to the diffusion region 5 is potentially applied to the memory gate electrode G.

In such a case, in the anti-fuse memory 2b according to the present invention, since the rectifier element 3 as a PN junction diode having the semiconductor junction structure of the N-type semiconductor region 7 and the P-type semiconductor region 8 is provided between the memory gate electrode G of the memory capacitor 4 and the word line WLa, the non-breakdown bit voltage of 3 V applied from the memory gate electrode G to the rectifier element 3 is reverse-biased voltage from the N-type semiconductor region 7 to the P-type semiconductor region 8 at the rectifier element 3. Accordingly, the voltage application from the memory gate electrode G to the word line WLa is reliably blocked by the rectifier element 3.

When no blocking function is provided by the rectifier element 3 thus configured, the non-breakdown bit voltage of 3 V applied to the bit line BLb is applied to the word line WLa through the anti-fuse memory 2b. In this case, the voltage of 3 V applied to the word line WLa through the anti-fuse memory 2b is applied, through the word line WLa, to the memory gate electrode G of the anti-fuse memory 2a sharing the word line WLa. Thus, when breakdown has already occurred to the memory gate insulating film 6 of the anti-fuse memory 2a, the bit line BLa and the word line WLa are short-circuited to become equipotential, and as a result, the bit line BLa and the bit line BLb cannot maintain desired potentials, and a normal data programming operation cannot be performed on the anti-fuse memory.

The voltage difference between the memory gate electrode G and the diffusion region 5 at the memory capacitor 4 is 0 V in the anti-fuse memory 2a to which no data is to be programmed, the anti-fuse memory 2a being connected with the word line (nonselected programming word line) WLa to which the non-breakdown word voltage of 0 V is applied and the bit line (nonselected programming bit line) BLa to which a non-breakdown bit voltage of 0 V is applied. Accordingly, when no dielectric breakdown occurs to the memory gate insulating film 6, the memory gate insulating film 6 remains in an insulation state without dielectric breakdown, thereby maintaining a no-data programmed state. Thus, in the semiconductor memory device 1, data can be programmed only to the desired anti-fuse memory 2c among the anti-fuse memories 2a, 2b, 2c, and 2d arranged in the matrix.

(1-3) Data Reading Operation

The following describes, for example, a case in which data is read from the anti-fuse memory 2c on the second row and the first column in the semiconductor memory device 1 illustrated in FIG. 1. In this case, the bit line BLa (hereinafter also referred to as a selected reading bit line) connected with the anti-fuse memory 2c as a selected read memory, and the bit line BLb (hereinafter also referred to as a nonselected reading bit line) connected only with the anti-fuse memories 2b and 2d as nonselected read memories from which no data is read are initially charged to a voltage of 1.2 V. Simultaneously, a selected reading word voltage of 1.2 V is applied to the word line WLb (hereinafter also referred to as a selected reading word line) connected with the anti-fuse memory 2c as a selected read memory, and a nonselected reading word voltage of 0 V is applied to the word line WLa (hereinafter also referred to as a nonselected reading word line) connected only with the anti-fuse memories 2a and 2b as nonselected read memories.

Thereafter, a selected reading bit voltage of 0 V is applied to the selected reading bit line BLb. Accordingly, in the anti-fuse memory 2c as a selected read memory, the selected reading word voltage of 1.2 V is applied from the word line WLb to the P-type semiconductor region 8 of the rectifier element 3, and the selected reading bit voltage of 0 V is applied from the bit line BLa to the diffusion region 5 at one end of the memory capacitor 4.

When the memory gate insulating film 6 of the memory capacitor 4 in the anti-fuse memory 2c as a selected reading memory is in a data programmed state due to dielectric breakdown, forward-biased voltage from the P-type semiconductor region 8 to the N-type semiconductor region 7 is applied at the rectifier element 3 due to the selected reading word voltage of 1.2 V applied to the word line WLb. Accordingly, in the anti-fuse memory 2c, the selected reading word voltage applied to the word line WLb is applied from the rectifier element 3 to the bit line BLa through the memory capacitor 4.

As a result, a voltage which is lowered from the selected reading word voltage of 1.2 V by the value of the built-in potential through the anti-fuse memory (the selected read memory) 2c is applied to the bit line BLa. Accordingly, the bit line BLa is electrically connected through the anti-fuse memory 2c to the word line WLb, so that the selected reading bit voltage of 0 V is changed to 0.5 V. Thus, the voltage is changed.

When no dielectric breakdown occurs to the memory gate insulating film 6 of the memory capacitor 4 and thus no data is programmed in the anti-fuse memory 2c as a selected read memory, the electrical connection between the word line WLb and the bit line BLa is blocked by the memory capacitor 4. Accordingly, the selected reading bit voltage of 0 V at the bit line BLa does not change but remains at 0 V.

As described above, the semiconductor memory device 1 allows determination of whether data is programmed to the anti-fuse memory 2c as a selected read memory by detecting whether the selected reading bit voltage applied to the bit line (selected reading bit line) BLa has changed.

In the anti-fuse memory 2a, which is connected with the bit line (read select bit line) BLa and from which no data is read, since the nonselected reading word voltage of 0 V is applied to the word line (nonselected reading word line) WLa, the voltage change of the bit line (selected reading bit line) BLa is not affected by any dielectric breakdown occurring to the memory gate insulating film 6 of the memory capacitor 4.

For example, when the voltage applied to the bit line (selected reading bit line) BLa has a value of 0.5 V due to the anti-fuse memory 2c from which data is read, the selected reading bit voltage of 0.5 V is blocked by the rectifier element 3 and prevented from being applied to the word line (nonselected reading word line) WLa because reverse-biased voltage is applied to the rectifier element 3 in the anti-fuse memory 2a when dielectric breakdown occurs to the memory gate insulating film 6 of the memory capacitor 4 in the anti-fuse memory 2a, which shares the selected reading bit line BLa and from which no data is read.

In the anti-fuse memory 2b connected with the word line (nonselected reading word line) WLb to which a nonselected reading word voltage of 0 V is applied, and the bit line (nonselected reading bit line) BLb to which a nonselected reading bit voltage of 1.2 V is applied, voltage application from the word line (nonselected reading word line) WLb to the bit line (nonselected reading bit Nine) BLb is blocked by the rectifier element 3 when dielectric breakdown occurs to the memory gate insulating film 6 because the voltage application is reverse-biased voltage application at the rectifier element 3.

In the anti-fuse memory 2d connected with the word line (selected reading word line) WLb to which the selected reading word voltage of 1.2 V is applied and the bit line (nonselected reading bit line) BLb to which the nonselected reading bit voltage of 1.2 V is applied, when dielectric breakdown occurs to the memory gate insulating film 6, the word line (selected reading word line) WLb and the bit line (nonselected reading bit line) BLd have identical voltage values, and thus the selected reading word voltage of 1.2 V does not change, which provides no influence on a reading operation on the anti-fuse memory 2c. Thus, in the semiconductor memory device 1, data can be read only from the desired anti-fuse memory 2c among the anti-fuse memories 2a, 2b, 2c, and 2d arranged in the matrix.

(1-4) Operations and Effects of Semiconductor Memory Device Having the Above-described Configuration In the above-described configuration, for example, the anti-fuse memory 2c includes the memory capacitor 4 and the rectifier element 3. In the memory capacitor 4, the memory gate electrode G is provided on the well S2 through the memory gate insulating film 6 and the bit line BLa is connected with, through the bit line contact BC, the diffusion region 5 disposed on the surface of the well S2. The rectifier element 3 is provided between the memory gate electrode G and the word line WLb and configured to allow voltage application from the word line WLb to the memory gate electrode G through the word line contact WC and block voltage application from the memory gate electrode G to the word line contact WC as reverse-biased voltage application.

In the anti-fuse memory 2c, when data is to be programmed to the memory capacitor 4, a program breakdown word voltage applied to the selected programming word line WLa is applied to the memory gate electrode G of the memory capacitor 4 through the rectifier element 3, and dielectric breakdown occurs to the memory gate insulating film 6 of the memory capacitor 4 due to the voltage difference between the memory gate electrode G and the selected programming bit line BLa.

In a no-data programming operation of programming no data on the anti-fuse memory 2b, when a high non-breakdown bit voltage is applied to the bit line BLb connected with the memory capacitor 4 while dielectric breakdown occurs to, for example, the memory gate insulating film 6 of the memory capacitor 4, no channel is formed in the memory capacitor 4 since the non-breakdown word voltage of 0 V is applied to the nonselected programming word line WLb, and accordingly, voltage application from the nonselected programming bit line BLb to the word line WLa is blocked by the memory capacitor 4.

In the anti-fuse memory 2b according to the present invention, when the dielectric breakdown of the memory gate insulating film 6 occurs, for example, at a place extremely close to the diffusion region 5 connected with the nonselected programming bit line BLb, and the potential of the nonselected programming bit line BLb cannot be blocked by the channel of the memory capacitor 4, so that the non-breakdown bit voltage is applied from the nonselected programming bit line BLb to the memory gate electrode G of the memory capacitor 4, the voltage application from the memory gate electrode G to the word line WLa can be reliably blocked by the rectifier element 3 since the non-breakdown bit voltage is reverse-biased voltage at the rectifier element 3.

As described above, the anti-fuse memory 2b according to the present invention can be provided with a double blocking mechanism including (i) a first blocking mechanism for forming no channel in the memory capacitor 4 by applying a non-breakdown word voltage of 0 V to the nonselected programming word line WLb, and (ii) a second blocking mechanism configured to block a non-breakdown bit voltage by achieving a reverse-biased state at the rectifier element 3. The configuration allows execution of a normal data programming operation and thus reliably prevents false operation at data reading.

Thus, the anti-fuse memory 2b is provided with, instead of a conventional control circuit, the rectifier element 3 having a semiconductor junction structure in which the voltage application from the memory gate electrode G to the word line WLa is reverse-biased voltage depending on values of voltages applied to the memory gate electrode G and the word line WLa, and the voltage application from the memory gate electrode G to the word line WLa is blocked by the rectifier element 3. The configuration eliminates the need to provide a switch transistor configured to selectively apply voltage to a memory capacitor, and a switch control circuit for turning on and off the switch transistor as in conventional cases, and accordingly achieves downsizing.

In each of the anti-fuse memories 2a, 2b, 2c, and 2d, the P-type semiconductor region 8 and the N-type semiconductor region 7 of the rectifier element 3 are disposed in a layer same as that of the memory gate electrode G of the memory capacitor 4 as illustrated in FIG. 2A. Thus, a typical semiconductor manufacturing process of forming the memory gate electrode G of the memory capacitor 4 having a single-layer structure can be used to form the P-type semiconductor region 8 and the N-type semiconductor region 7 of the rectifier element 3 in a process of manufacturing the memory gate electrode G.

Figure 3:
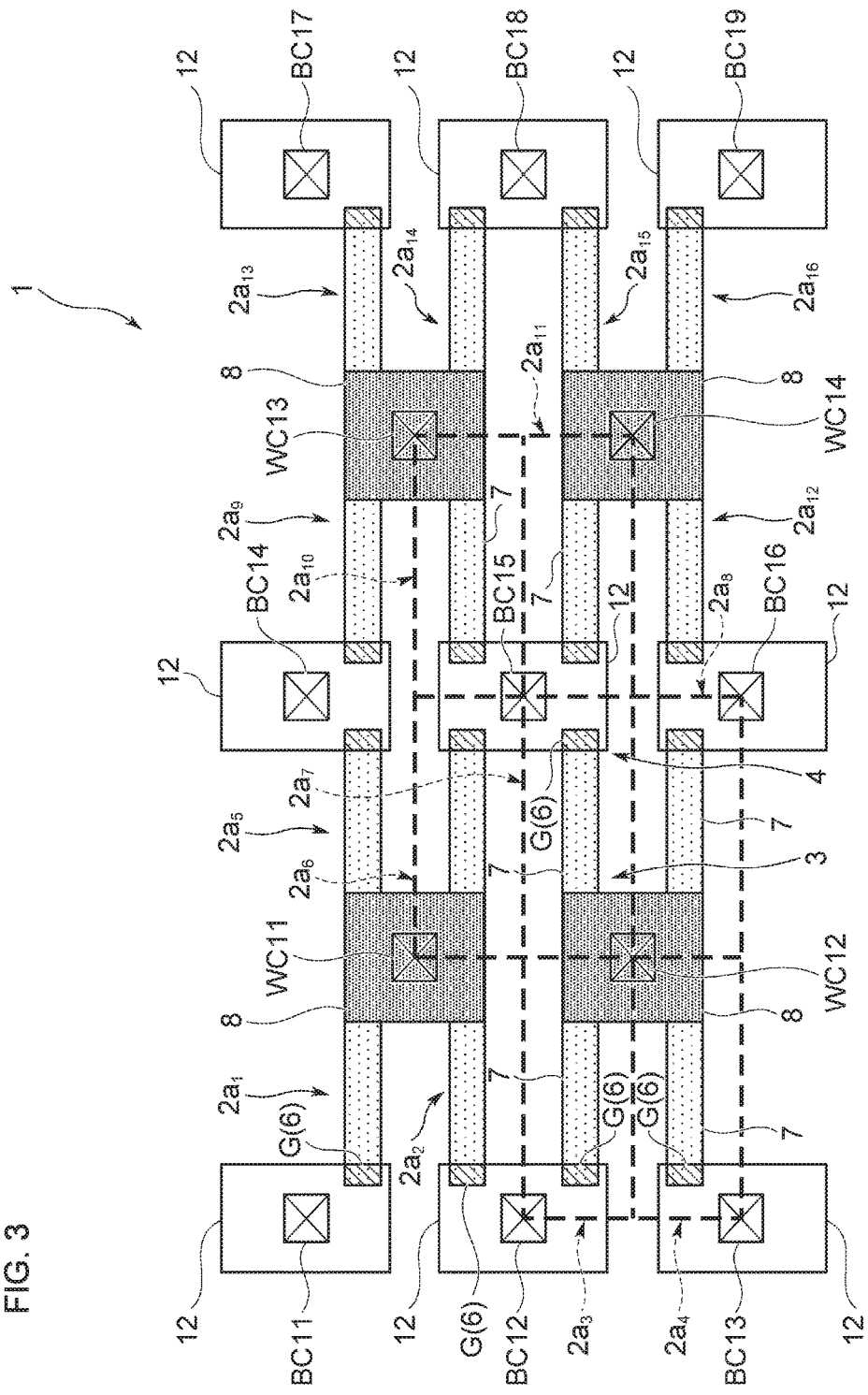
FIG. 3 is a schematic view illustrating a planar layout (1) when each word line contact and each bit line contact are shared by four anti-fuse memories.

(2) Case in Which Each Word Line Contact and Each Bit Line Contact are Shared by Four Anti-fuse Memories
(2-1) Planar Layout Configuration The following describes a planar layout configuration of the above-described semiconductor memory device 1 including anti-fuse memories arranged in a matrix of rows and columns. FIG. 3, in which any corresponding part to that in FIG. 2B is denoted by an identical reference sign, illustrates an exemplary planar layout configuration of a total of sixteen of anti-fuse memories $2a_1$, $2a_2$, $2a_3$, $2a_4$, $2a_5$, $2a_6$, $2a_7$, $2a_8$, $2a_9$, $2a_{10}$, $2a_{11}$, $2a_{12}$, $2a_{13}$, $2a_{14}$, $2a_{15}$, and $2a_{16}$ arranged in a 4×4 matrix. In this case, in the semiconductor memory device 1, the anti-fuse memories $2a_1$, $2a_2$, $2a_3$, $2a_4$, $2a_5$, $2a_6$, $2a_7$, $2a_8$, $2a_9$, $2a_{10}$, $2a_{11}$, $2a_{12}$, $2a_{13}$, $2a_{14}$, $2a_{15}$, and $2a_{16}$ all have identical configurations and each include the rectifier element 3 and the memory capacitor 4 as illustrated in FIGS. 2A and 2B above. In addition, word line contacts WC11, WC12, WC13, and WC14 all have identical configurations, and thus the following description will be made mainly on, for example, the word line contact WC12.

In this case, the P-type semiconductor region 8, on which the word line contact WC12 is erected, has a rectangular shape and is shared by the four anti-fuse memories $2a_3$, $2a_4$, $2a_7$, and $2a_8$ adjacent to each other. The N-type semiconductor regions 7 of the two anti-fuse memories $2a_3$ and $2a_4$ adjacent to each other in the column direction are joined with one side of the P-type semiconductor region 8, on which the word line contact WC12 is erected, and the N-type semiconductor regions 7 of the two anti-fuse memories $2a_7$ and $2a_8$ adjacent to each other in the column direction are joined with another side thereof facing to the one side.

For example, in the anti-fuse memory $2a_7$, the P-type semiconductor region 8 and the N-type semiconductor region 7 are joined with each other to form the rectifier element 3 as a PN junction diode. With the configuration, the word line contact WC12 applies a word voltage from a word line (not illustrated) to the rectifier elements 3 of the four anti-fuse memories $2a_3$, $2a_4$, $2a_7$, and $2a_8$ sharing the P-type semiconductor region 8.

The N-type semiconductor regions 7 of the four anti-fuse memories $2a_3$, $2a_4$, $2a_7$, and $2a_8$ extend in the row direction departing from the P-type semiconductor region 8, and the memory gate electrodes G joined with the leading end parts thereof are disposed in the active regions 12 different from each other. The memory gate insulating film 6 of each of the anti-fuse memories $2a_3$, $2a_4$, $2a_7$, and $2a_8$ is disposed in a region in which the memory gate electrode G integrated with the leading end part of the corresponding N-type semiconductor region 7 faces to the corresponding active region 12.

The following describes bit line contacts BC11, BC12, BC13, BC14, BC15, BC16, BC17, BC18, and BC19. In the present embodiment, a total of nine of the bit line contacts BC11, BC12, BC13, BC14, BC15, BC16, BC17, BC18, and BC19 are arranged in a 3×3 matrix in the semiconductor memory device 1. The bit line contacts BC11, BC12, BC13, BC14, BC15, BC16, BC17, BC18, and BC19 are disposed in the respective different active regions 12 and each apply a bit voltage from a bit line (not illustrated) to the corresponding active region 12.

The four anti-fuse memories $2a_6$, $2a_7$, $2a_{10}$, and $2a_{11}$ connected with the different P-type semiconductor regions 8 and disposed adjacent to each other are provided in the active region 12 including the bit line contact BC15 that is disposed in a central region among the nine bit line contacts BC11, BC12, BC13, BC14, BC15, BC16, BC17, BC18, and BC19. With the configuration, the bit line contact BC15 disposed in the central region is shared by the four anti-fuse memories $2a_6$, $2a_7$, $2a_{10}$, and $2a_{11}$ adjacent to each other and applies a bit voltage from a bit line to the four anti-fuse memories $2a_6$, $2a_7$, $2a_{10}$, and $2a_{11}$.

In this case, in the active region 12 on which the bit line contact BC15 at the center is erected, the anti-fuse memories $2a_6$ and $2a_{10}$ are disposed symmetrically with respect to the bit line contact BC15, and the anti-fuse memories $2a_7$ and $2a_{11}$ are disposed symmetrically with respect to the bit line contact BC15. Specifically, the memory gate electrodes G of the two anti-fuse memories $2a_6$ and $2a_7$ adjacent to each other in the column direction face to each other on one side of the active region 12 on which the bit line contact BC15 is erected, and the memory gate insulating films 6 of the anti-fuse memories $2a_6$ and $2a_7$ are disposed on the one side. The memory gate electrodes G of the other anti-fuse memories $2a_{10}$ and $2a_{11}$ adjacent to each other in the column direction face to each other on the other side of the active region 12, and the memory gate insulating films 6 of the anti-fuse memories $2a_{10}$ and $2a_{11}$ are disposed on the other side.

The four bit line contacts BC11, BC13, BC17, and BC19 disposed at corners in the planar layout of the semiconductor memory device 1 are connected with the corresponding anti-fuse memories $2a_1$, $2a_4$, $2a_{13}$, and $2a_{16}$, respectively. Accordingly, the bit line contacts BC11, BC13, BC17, and BC19 disposed at these corners apply bit voltages only to the corresponding single anti-fuse memories $2a_1$, $2a_4$, $2a_{13}$, and $2a_{16}$.

Among the bit line contacts BC11, BC12, BC13, BC14, BC16, BC17, BC18, and BC19 arranged in the periphery of the planar layout of the semiconductor memory device 1, for example, the bit line contact BC12 disposed at a place other than the corners is connected only with the two anti-fuse memories $2a_2$ and $2a_3$. The bit line contacts BC14, BC16, and BC18 disposed at places other than the corners are connected only with the corresponding pairs of the anti-fuse memories $2a_5$ and $2a_9$, the anti-fuse memories $2a_8$ and $2a_{12}$, and the anti-fuse memories $2a_{14}$ and $2a_{15}$, respectively. In this manner, in the semiconductor memory device 1, the bit line contacts BC12, BC14, BC16, and BC18 disposed at places other than the corners are each shared by two anti-fuse memories, and the bit line contact BC15 disposed in the central region is shared by four anti-fuse memories. The configuration achieves downsizing as compared to a case in which each bit line contact is provided to one anti-fuse memory.

In the above-described configuration, in the anti-fuse memories $2a_1$, $2a_2$, $2a_3$, $2a_4$, $2a_5$, $2a_6$, $2a_7$, $2a_8$, $2a_9$, $2a_{10}$, $2a_{11}$, $2a_{12}$, $2a_{13}$, $2a_{14}$, $2a_{15}$, and $2a_{16}$ of the semiconductor memory device 1 illustrated in FIG. 3, the voltage application from the memory gate electrode G to the word line can be blocked by the rectifier element 3 depending on values of voltages applied to the memory gate electrode G of the memory capacitor 4 and the word line without using a conventional control circuit as described above in "(1-4) Operations and effects of semiconductor memory device having the above-described configuration". The configuration eliminates the need to provide a switch transistor configured to selectively apply voltage to a memory capacitor, and a switch control circuit for turning on and off the switch transistor as in conventional cases, and accordingly achieves downsizing.

As described above in "(1-4) Operations and effects of semiconductor memory device having the above-described configuration", for example, the anti-fuse memory $2a_7$ in the semiconductor memory device 1 according to the present invention can be provided with a double blocking mechanism including (i) a first blocking mechanism for forming no channel in the memory capacitor 4 by applying a non-breakdown word voltage of 0 V to a word line (nonselected programming word line), and (ii) a second blocking mechanism configured to block a non-breakdown bit voltage by achieving a reverse-biased state at the rectifier element 3. The configuration allows execution of a normal data programming operation and thus reliably prevents false operation at data reading.

In the semiconductor memory device 1 illustrated in FIG. 3, the single bit line contact BC15 is shared by the four anti-fuse memories $2a_6$, $2a_7$, $2a_{10}$, and $2a_{11}$ adjacent to each other, and for example, the single word line contact WC12 is shared by the four anti-fuse memories $2a_3$, $2a_4$, $2a_7$, and $2a_8$ adjacent to each other. The configuration achieves downsizing of the entire device as compared to a case in which a bit line contact and a word line contact are individually provided to each anti-fuse memory.

(2-2) Planar Layout Configuration of Bit Lines and Word Lines

Figure 4:
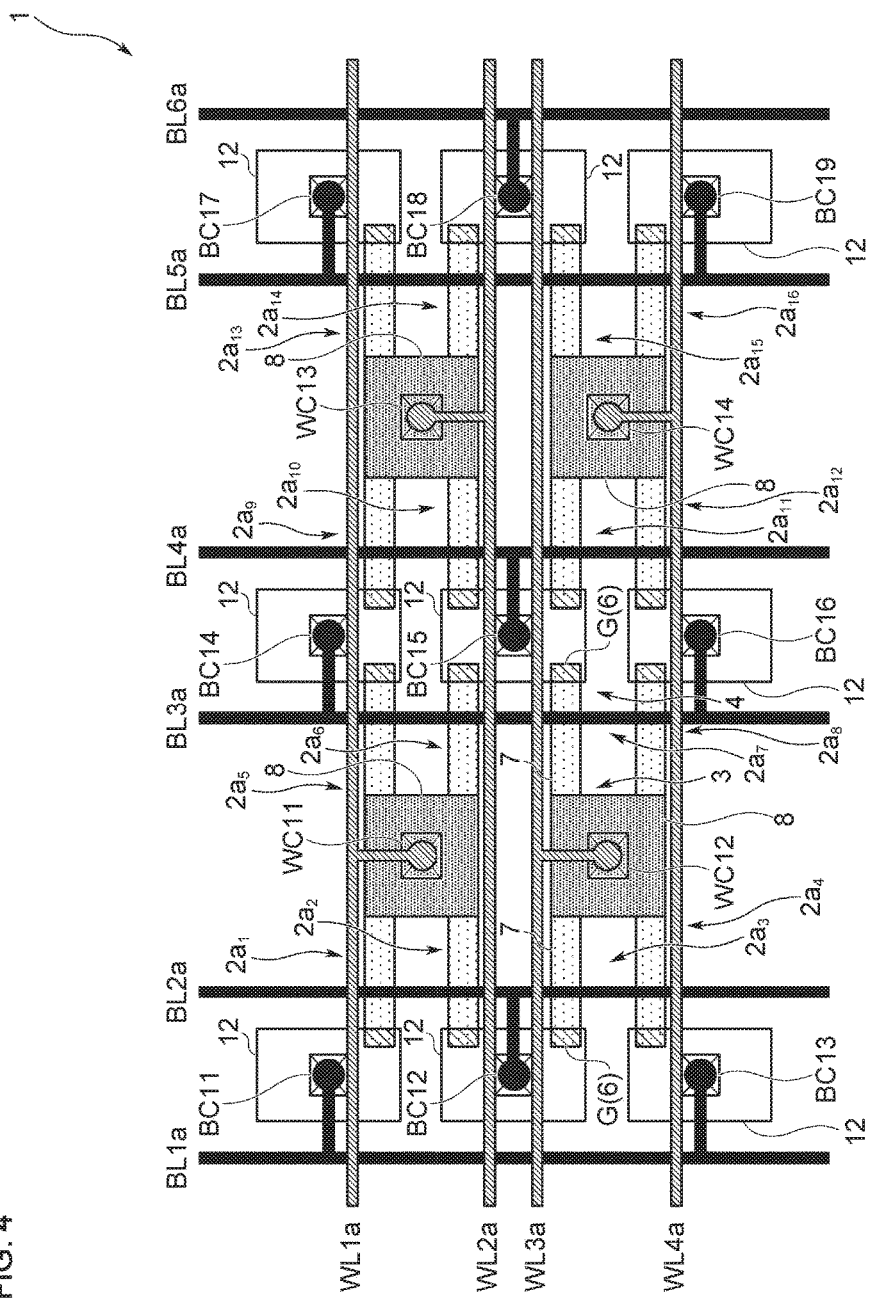
FIG. 4 is a schematic view illustrating the planar layout (1) of word lines and bit lines.

The following describes a planar layout of bit lines and word lines of the semiconductor memory device 1 illustrated in FIG. 3. As illustrated in FIG. 4, in which any corresponding part to that in FIG. 3 is denoted by an identical reference sign, among the bit line contacts BC11, BC12, and BC13 on the first column in the semiconductor memory device 1, the bit line contact Bo11 on the first row and the bit line contact BC13 on the third row are connected with a first bit line BL1a, and the bit line contact BC12 on the second row between the bit line contacts BC11 and BC13 are connected with a second bit line BL2a. Accordingly, in the semiconductor memory device 1, for example, the P-type semiconductor region 8 applies a bit voltage to the different two anti-fuse memories $2a_1$ and $2a_4$ through the first bit line BL1a, and in addition, the P-type semiconductor region 8 applies, to the different two anti-fuse memories $2a_2$ and $2a_3$ through the second bit line BL2a, a bit voltage different from that applied to the first bit line BL1a.

Among the bit line contacts BC14, BC15, and BC16 on the second column, the bit line contact BC14 on the first row and the bit line contact BC16 on the third row are connected with a third bit line BL3a, and the bit line contact BC15 on the second row between the bit line contacts BC14 and BC16 are connected with a forth bit line BL4a. Accordingly, in the semiconductor memory device 1, for example, the P-type semiconductor region 8 applies a bit voltage to the different four anti-fuse memories $2a_5$, $2a_9$, $2a_8$, and $2a_{12}$ through the third bit line BL3a, and in addition, the P-type semiconductor region 8 apples, to the different four anti-fuse memories $2a_6$, $2a_7$, $2a_{10}$, and $2a_{11}$ through the forth bit line BL4a, a bit voltage different from that applied to the third bit line BL3a.

In addition, among the bit line contacts BC17, BC18, and BC19 on the third column, the bit line contact BC17 on the first row and the bit line contact BC19 on the third row are connected with a fifth bit line BL5a, and the bit line contact BC18 on the second row between the bit line contacts BC17 and BC19 are connected with a sixth bit line BL6a. Accordingly, in the semiconductor memory device 1, for example, the P-type semiconductor region 8 applies a bit voltage to the different two anti-fuse memories $2a_{13}$ and $2a_{16}$ through the fifth bit line BL5a, and in addition, the P-type semiconductor region 8 applies, to the different two anti-fuse memories $2a_{14}$ and $2a_{15}$ through the sixth bit line BL6a, a bit voltage different from that applied to the fifth bit line BL5a.

In addition to the configuration, the word line contacts WC11, WC12, WC13, and WC14 are connected with word lines WL1a, WL2a, WL3a, and WL4a, respectively. Different word voltages are applied to the word line contacts WC11, WC12, WC13, and WC14 through the word lines WL1a, WL2a, WL3a, and WL4a. In the present embodiment, for example, the first word line WL1a is connected with the word line contact WC11 on the first row and the first column to apply a word voltage to the four anti-fuse memories $2a_1$, $2a_2$, $2a_5$, and $2a_6$ sharing the word line contact WC11. The other word lines WL2a, WL3a, and WL4a apply word voltages to the four anti-fuse memories $2a_9$, $2a_{10}$, $2a_{13}$, and $2a_{14}$, the four anti-fuse memories $2a_3$, $2a_4$, $2a_7$, and $2a_8$ and the four anti-fuse memories $2a_{11}$, $2a_{12}$, $2a_{15}$, and $2a_{16}$, respectively, through the corresponding word line contacts WC13, WC12, and WC14.

For example, the four anti-fuse memories $2a_6$, $2a_7$, $2a_{10}$, and $2a_{11}$, connected with the single bit line contact BC15 are connected with the electrically independently controllable word lines WL1a, WL2a, WL3a, and WL4a. Different word voltages are applied through the respective word lines WL1a, WL2a, WL3a, and WL4a. For example, the four anti-fuse memories $2a_3$, $2a_4$, $2a_7$, and $2a_8$ connected with the single word line contact WC12 are connected with the electrically independently controllable bit lines BL1a, BL2a, BL3a, and BL4a. Different bit voltages are applied through the respective bit lines BL1a, BL2a, BL3a, and BL4a.

In the semiconductor memory device 1 thus configured, data can be programmed only to, for example, the anti-fuse memory $2a_1$ at a predetermined position through. "(1-2) Data programming operation" described above and data can be read from, for example, the anti-fuse memory $2a_1$ at a predetermined position through "(1-3) Data reading operation" described above, by adjusting voltages applied to the bit lines BL1a, BL2a, BL3a, BL4a BL5a, and BL6a and the word lines WL1a, WL2a, WL3a, and WL4a as appropriate.

Since the semiconductor memory device 1 in FIG. 4 includes the sixteen anti-fuse memories, for example, the word line WL1a is connected only with the single word line contact WC11. When a larger number of anti-fuse memories are provided, for example, the first word line WL1a and the second word line WL2a are alternately connected with a plurality of word line contacts arranged in the row direction. For example, the word line WL1a, which is connected with the word line contact WC11 on the first row and the first column, is also connected with, for example, the word line contact on the first row and the third column and the word line contact on the first row and the fifth column, and the word line WL2a, which is connected with the word line contact WC13 on the first row and the second column, is also connected with, for example, the word line contact on the first row and the forth column and the word line contact on the first row and the sixth column.

(3) Planar Layout Configuration of Bit Lines and Word Lines According to Another Embodiment FIG. 4 illustrates the semiconductor memory device 1 including, for example, a total of sixteen of the anti-fuse memories $2a_1$, $2a_2$, $2a_3$, $2a_4$, $2a_5$, $2a_6$, $2a_7$, $2a_8$, $2a_9$, $2a_{10}$, $2a_{11}$, $2a_{12}$, $2a_{13}$, $2a_{14}$, $2a_{15}$, and $2a_{16}$ arranged in a 4×4 matrix, and the bit lines BL1a, BL2a, BL3a, BL4a, BL5a, and BL6a and the word lines WL1a, WL2a, WL3a, and WL4a disposed in accordance with the arranged positions of the anti-fuse memories $2a_1$, $2a_2$, $2a_3$, $2a_4$, $2a_5$, $2a_6$, $2a_7$, $2a_8$, $2a_9$, $2a_{10}$, $2a_{11}$, $2a_{12}$, $2a_{13}$, $2a_{14}$, $2a_{15}$and $2a_{16}$.

In the semiconductor memory device 1 illustrated in FIG. 4, the column of the bit line contacts BC11, BC12, and BC13 are provided on one end side, and the column of the bit line contacts BC17, BC18, and BC19 are provided on the other end side. In this case, the bit line contact BC11 on the first row and the first column on the one end side and the bit line contact BC13 on the third row and the first column on the one end side are connected only with the single anti-fuse memories $2a_1$ and $2a_4$, respectively, whereas the bit line contact BC12 on the second row and the first column on the one end side is connected with the two anti-fuse memories $2a_2$ and $2a_3$.

Thus, the first bit line BL1a connected with the bit line contacts BC11 and BC13 on the one end side is connected only with a total of two of the anti-fuse memories $2a_1$ and $2a_4$ through the bit line contacts BC11 and BC13. The second bit line BL2a connected with the bit line contact BC12 on the one end side is connected only with the two anti-fuse memories $2a_2$ and $2a_3$ through the bit line contact BC12.

In the column of the bit line contacts BC17, BC18, and BC19 on the other end side, the bit line contact BC17

(BC19) is connected with the single anti-fuse memory $2a_{13}$ ($2a_{16}$), and the remaining bit line contact BC18 is connected with the two anti-fuse memories $2a_{14}$ and $2a_{15}$. Thus, the fifth bit line BL5a, which is connected with the bit line contacts BC17 and BC19 on the other end side, is connected only with a total of two of the anti-fuse memories $2a_{13}$ and $2a_{16}$ through the respective bit line contacts BC17 and BC19, and the sixth bit line BL6a, which is connected with the bit line contact BC18 on the other end side, is connected only with the two anti-fuse memories $2a_{14}$ and $2a_{15}$ through the bit line contact BC18. Accordingly, the number of anti-fuse memories connected with each of the bit line BL1a and BL2a (BL5a and BL6a) provided for the column of the bit line contacts BC11, BC12, and BC13 (BC17, BC18, and BC19) arranged in the periphery is two.

The bit line BL3a arranged in the central region is connected with a total of four of the anti-fuse memories $2a_5$, $2a_9$, $2a_8$, and $2a_{12}$ through the bit line contacts BC14 and BC16, and the bit line BL4a arranged in the central region is connected with a total of four of the anti-fuse memories $2a_6$, $2a_7$, $2a_{10}$, and $2a_{11}$ through the bit line contact BC15. Thus, to efficiently perform control with a row address and a column address in the semiconductor memory device 1 illustrated in FIG. 4, it is desirable to, for example, short-circuit the first bit line BL1a and the fifth bit line BL5a to operate four anti-fuse memories at the same bit voltage, and also short-circuit the second bit line BL2a and the sixth bit line BL6a to operate four anti-fuse memories at the same bit voltage, so that the numbers of the anti-fuse memories operating at the same bit voltages are equal to the numbers (in this case, four) of anti-fuse memories connected with the respective bit lines BL3a and BL4a in the central region.

Specifically, in the semiconductor memory device 1, it is desirable to operate, through the two of the first bit line BL1a and the fifth bit lire BL5a, a total of four of the anti-fuse memories $2a_1$, $2a_4$, $2a_{13}$, and $2a_{16}$ as the sum of a total of two of the anti-fuse memories $2a_1$ and $2a_4$ connected with the first bit line BL1a through the respective bit line contacts BC11 and BC13 and a total of two of the anti-fuse memories $2a_{13}$ and $2a_{16}$ connected with the fifth bit line BL5a through the respective bit line contacts BC17 and BC19.

It is also desirable to operate, through the two of the second bit line BL2a and the sixth bit line BL6a, a total of four of the anti-fuse memories $2a_2$, $2a_3$, $2a_{14}$, and $2a_{15}$ as the sum of the two anti-fuse memories $2a_2$ and $2a_3$ connected with the second bit line BL2a through the bit line contact BC12 and the two anti-fuse memories $2a_{14}$ and $2a_{15}$ connected with the sixth bit line BL6a through the bit line contact BC18.

For example, in the semiconductor memory device 1, capacitance differs between when a bit voltage is applied. to the anti-fuse memories $2a_1$, $2a_4$, $2a_{13}$, and $2a_{16}$ through the two of the first bit line BL1a and the fifth bit line BL5a, and when the four anti-fuse memories $2a_3$, $2a_9$, $2a_8$, and $2a_{12}$ ($2a_6$, $2a_7$, $2a_{10}$, and $2a_{11}$) are operated through the single third bit line BL3a (the single forth bit line BL4a). Thus, at data reading operation, a problem such as reduction of the reading speed potentially occurs to the semiconductor memory device 1.

Figure 5:
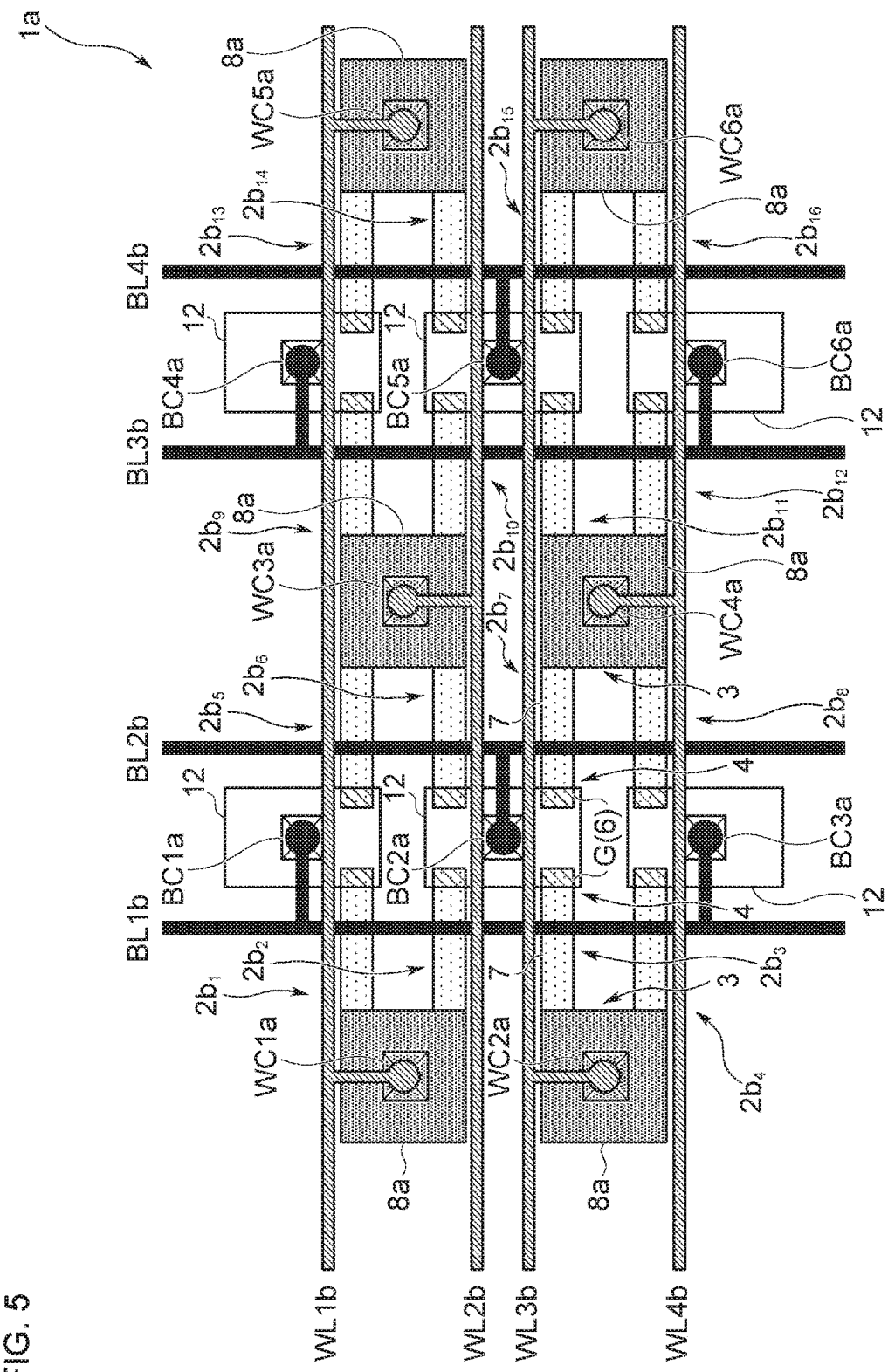
FIG. 5 is a schematic view illustrating the planar layout (1) of word lines and bit lines according to another embodiment.

To solve such a problem, as illustrated in FIG. 5, in which any corresponding part to that in FIG. 4 is denoted by an identical reference sign, a semiconductor memory device 1a includes a column of word line contacts WC1a and WC2a arranged on one end side, a column of word line contacts BC5a and WC6a arranged on the other end side, the column of the bit line contacts BC1a, BC2a, and BC3a provided between the column of the word line contacts WC1a and WC2a on the one end side and a column of word line contacts WC3a and WC4a in a central part, and the column of the bit line contacts BC4a, BC5a, and BC6a provided between the column of the word line contacts WC5a and WC6a on the other end side and the column of the word line contacts WC3a and WC4a in the central part.

In the semiconductor memory device 1a, among the column of the bit tine contacts BC1a, BC2a, and BC3a between the column of the word line contacts WC1a and WC2a on the one end side and the column of the word line contacts WC3a and WC4a in the central part, the bit line contact BC1a on the first row and the bit line contact BC3a on the third row are connected with a first bit line BL1b, and the bit line contact BC2a on the second row is connected with a second bit line BL2b .

In the semiconductor memory device 1a thus configured, the first bit line BL1b is connected with a total of four of anti-fuse memories $2b_1$, $2b_5$, $2b_4$, and $2b_8$ the two anti-fuse memories $2b_1$ and $2b_5$ being connected with the bit line contact BC1a on the first row, and the two anti-fuse memories $2b_4$ and $2b_8$ being connected with a bit line contact BC3a on the third row. With the configuration, the four anti-fuse memories $2b_1$, $2b_5$, $2b_4$, and $2b_8$ can be operated through the single bit line BL1b.

In the semiconductor memory device 1a, the single second bit line BL2b can be connected with the four anti-fuse memories $2b_2$, $2b_3$, $2b_6$, and $2b_7$ connected with the bit line contact BC2a on the second row. With the configuration, the four anti-fuse memories $2b_2$, $2b_3$, $2b_6$, and $2b_7$ can be operated through the single bit line BL1b.

In the semiconductor memory device 1a, among the column of the bit line contacts BC4a, BC5a, and BC6a between the column of the word line contacts WC5a and WC6a on the other end side and the column of the word line contacts WC3a and WC4a in the central part, the bit line contact BC4a on the first row and the bit line contact BC6a on the third row are connected with a third bit line BL3b, and the bit line contact BC5a on the second row are connected with a forth bit line BL4b.

In the semiconductor memory device 1a thus configured, the single third bit line BL3b is connected with a total of four of anti-fuse memories $2b_9$, $2b_{13}$, $2b_{12}$, and $2b_{16}$, the two anti-fuse memories $2b_9$ and $2b_{13}$ being connected with the bit line contact BC4a on the first row, and the two anti-fuse memories $2b_{12}$ and $2b_{16}$ being connected with the bit line contact BC6a on the third row. With the configuration, the four anti-fuse memories $2b_9$, $2b_{13}$, $2b_{12}$, and $2b_{16}$ can be operated through the single bit line BLb.

In the semiconductor memory device 1a, the single forth bit line BL4b is connected with the four anti-fuse memories $2b_{10}$, $2b_{11}$, $2b_{14}$, and $2b_{15}$ connected with the bit line contact BC5a on the second row. With the configuration, the four anti-fuse memories $2b_{10}$, $2b_{11}$, $2b_{14}$, and $2b_{15}$ can be operated through the single bit line BL4b.

Accordingly, the bit lines do not need to be connected with each other in the semiconductor memory device 1a unlike the semiconductor memory device 1 illustrated in FIG. 4. The bit lines BL1b, BL2b, BL3b, and BL4b are all single separated lines and can have identical capacitance, which prevents a problem such as reduction of the reading speed at data reading operation.

In the semiconductor memory device 1a, among the word line contacts WC1a, WC3a, and WC5a on the first row, the word line contact WC1a on the first column and the word line contact WC5a on the third column are connected with an identical word line WL1b, and the word line contact WC3a. on the second column is connected with another word line WL2b different from the word line WL1b. Among the word line contacts WC2a, WC4a, and WC6a on the second row, the word line contact WC2a on the first column and the word line contact WC6a on the third column are connected with identical word line WL3b, and the word line contact WC4a on the second column is connected with another word line WL4b different from the word line WL3b.

The semiconductor memory device 1a thus configured can have the configuration in which, for example, the bit line contact BC2a on the second row and the first column (the bit line contact BC5a on the second row and the second column) is connected with the four anti-fuse memories $2b_2$, $2b_3$, $2b_6$, and $2b_7$ ($2b_{10}$, $2b_{11}$, $2b_{14}$, and $2b_{15}$), thereby achieving downsizing as in the above-described embodiment. In addition, the semiconductor memory device 1a can have the configuration in which, for example, the word line contact WC3a on the first row and the second column (the word line contact WC4a on the second row and the second column) is connected with the four anti-fuse memories $2b_5$, $2b_6$, $2b_9$, and $2b_{10}$ ($2b_7$, $2b_8$, $2b_{11}$, and $2b_{12}$), thereby achieving downsizing as in the above-described embodiment.

In this case, too, for example, the four anti-fuse memories $2b_2$, $2b_3$, $2b_6$, and $2b_7$, which are connected with the single bit line contact BC2a in the central region, are connected with the electrically independently controllable word lines WL1b, WL2b, WL3b, and WL4b. Different word voltages are applied through the respective word lines WL1b, WL2b, WL3b, and WL4b. For example, the four anti-fuse memories $2b_5$, $2b_6$, $2b_9$, and $2b_{10}$ connected with the word line contact WC3a are connected with the electrically independently controllable bit lines BL1b, BL2b, BL3b, and BL4b. Different bit voltages are applied through the respective bit lines BL1b, BL2b, BL3b, and BL4b.

In the semiconductor memory device 1a, too, data can be programmed only to, for example, the anti-fuse memory $2b_1$ at a predetermined position through "(1-2) Data programming operation" described above, and data can be read from the anti-fuse memory $2b_1$ at a predetermined position through "(1-3) Data reading operation" described above, by adjusting voltages applied to the bit lines BL1b, BL2b, BL3b, and BL4b and the word lines WL1b, WL2b, WL3b, and WL4b as appropriate.

With the above-described configuration, in the semiconductor memory device 1a, the bit line contacts BC1a and BC4a (BC3a and BC6a) disposed in the periphery and arranged in one direction (in this case, the row direction) are connected with the two anti-fuse memories $2b_1$ and $2b_5$, and the two anti-fuse memories $2b_9$ and $2b_{13}$ ($2b_4$, $2b_8$, $2b_{12}$, and $2b_{16}$), respectively, and the word line contacts WC1a and WC2a (WC5a and WC6a) disposed in the periphery and arranged in the other direction (in this case, the column direction.) are connected with the two anti-fuse memories $2b_1$ and $2b_2$ and the two anti-fuse memories $2b_3$ and $2b_4$ ($2b_{13}$ and $2b_{14}$, and $2b_{15}$ and $2b_{16}$) respectively. In addition, in the semiconductor memory device 1a, the remaining bit line contact BC2a (BC5a) disposed in the central region is connected with the four anti-fuse memories $2b_2$, $2b_3$, $2b_6$, and $2b_7$ ($2b_{10}$, $2b_{11}$, $2b_{14}$, and $2b_{15}$), and the word line contact WC3a (WC4a) disposed in the central region is connected with the four anti-fuse memories $2b_5$, $2b_6$, $2b_9$, and $2b_{10}$, ($2b_7$, $2b_8$, $2b_{11}$, and $2b_{12}$).

With the configuration, the bit line contacts BC1a to BC6a and the word line contacts WC1a to WC6a are shared by two or more anti-fuse memories in the semiconductor memory device 1a, thereby achieving downsizing of the entire device. In addition, the same number (in this case, four) of anti-fuse memories can be connected with, for example, the single bit line BL1b to have identical capacitance, which prevents a problem such as reduction of the reading speed at data reading operation.

Although the semiconductor memory device 1a illustrated in FIG. 5 includes the sixteen anti-fuse memories, for example, the first word line WL1b and the second word line WL2b are alternately connected with a plurality of word line contacts arranged in the row direction when a larger number of anti-fuse memories are provided. For example, the word line WL1b, which is connected with the word line contact WC1a on the first row and the first column, is also connected with, for example, the word line contact on the first row and the fifth column in addition to the word line contact WC5a on the first row and the third column, whereas the word line WL2b, which is connected with the word line contact WC3a on the first row and the second column, is also connected with, for example, the word line contact on the first row and the forth column and the word line contact on the first row and the sixth column.

In the semiconductor memory device 1a illustrated in FIG. 5, when the number of anti-fuse memories exceeds sixteen, the bit line contacts BC1a, BC4a, . . . (BC3a, BC6a, . . . ) are arranged side by side in the row direction in both peripheries, a bit line contact row and a word line contact row are alternately arranged in the column direction from one of the peripheries. When n bit line contacts are arranged per row, the number of word line contacts arranged per row is (n+1). In FIG. 5, which illustrates the semiconductor memory device 1a including the sixteen anti-fuse memories, the number of bit line contacts arranged per row is two and the number of word line contacts arranged per row is three.

Figure 6:
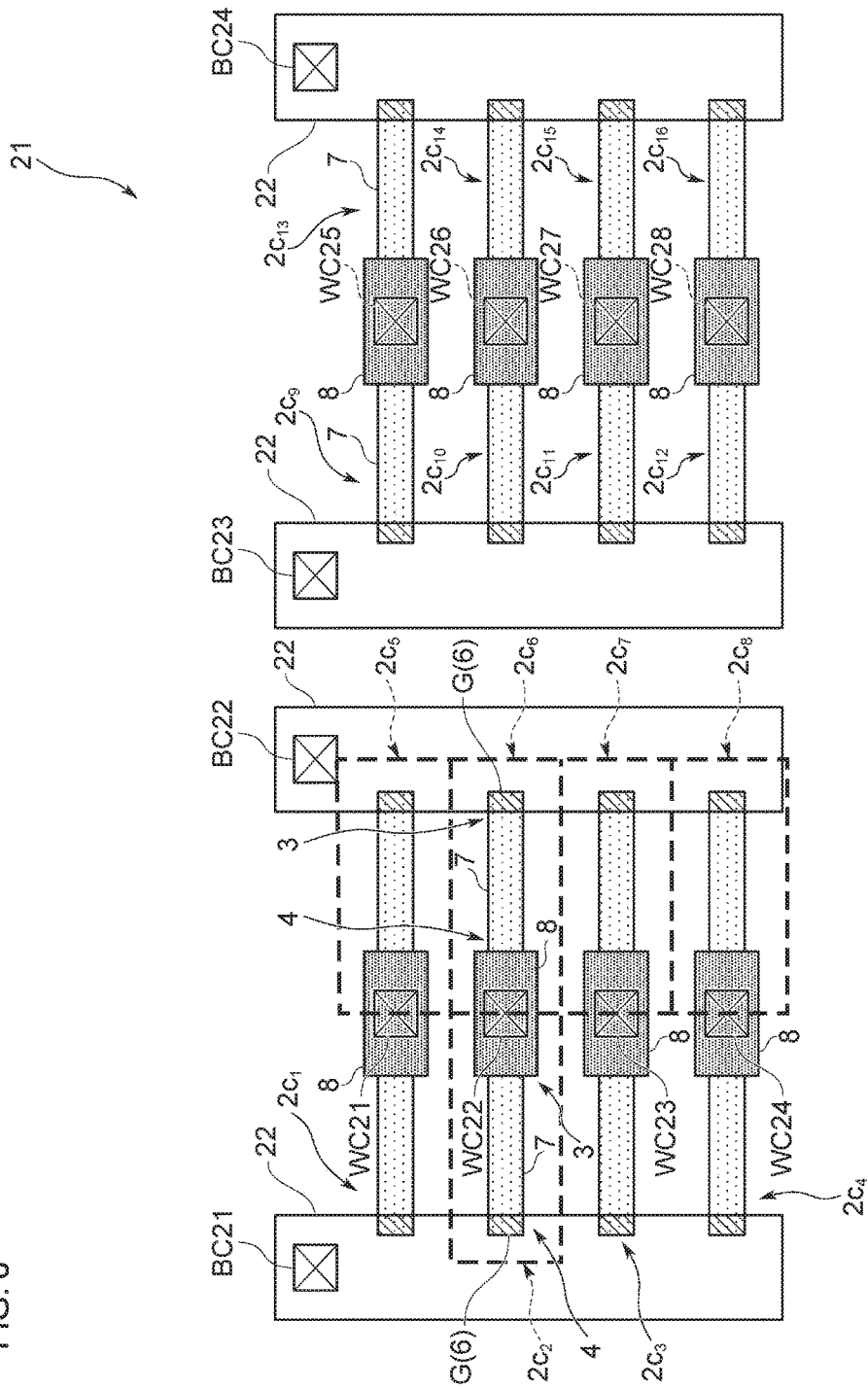
FIG. 6 is a schematic view illustrating the planar layout (1) when each word line contact is shared by two anti-fuse memories arranged in a row direction and each bit line contact is shared by a plurality of anti-fuse memories arranged in a column direction.

(4) Case in which Each Word Line Contact is Shared by Two Anti-fuse Memories and Each Bit Line Contact is Shared by a Plurality of Anti-fuse Memories Arranged in Column Direction FIG. 6, in which any corresponding part to that in FIG. 3 is denoted by an identical reference sign, illustrates a planar layout configuration of a semiconductor memory device 21 including, for example, a total of sixteen the of anti-fuse memories $2c_1$, $2c_2$, $2c_3$, $2c_4$, $2c_5$, $2c_6$, $2c_7$, $2c_8$, $2c_9$, $2c_{10}$, $2c_{11}$, $2c_{12}$, $2c_{13}$, $2c_{14}$, $2c_{15}$ and $2c_{16}$ arranged in a 4×4 matrix. In this case, the anti-fuse memories $2c_1$, $2c_2$, $2c_3$, $2c_4$, $2c_5$, $2c_6$, $2c_7$, $2c_8$, $2c_9$, $2c_{10}$, $cc_{11}$, $2c_{12}$, $2c_{13}$, $2c_{14}$, $2c_{15}$ and $2c_{16}$ in the semiconductor memory device 21 all have identical configurations and each include the rectifier element 3 and the memory capacitor 4, similarly to FIGS. 2A and 2B described above. In addition, word line contacts WC21, WC22, WC23, WC24, WC25, WC26, WC27, and WC28 all have identical configurations, and thus the following description will be made mainly on, for example, the word line contact WC22.

In this case, the P-type semiconductor region 8 on which the word line contact WC22 is erected has a rectangular shape and is shared by the two anti-fuse memories $2c_2$ and $2c_6$ adjacent to each other in the row direction. The N-type semiconductor region 7 of the anti-fuse memory $2c_2$ is joined with one side of the P-type semiconductor region 8 on which the word line contact WC22 is erected, and the N-type semiconductor region 7 of the anti-fuse memory $2c_6$ adjacent to the anti-fuse memory $2c_2$ in the row direction is joined with another side thereof facing to the one side.

In, for example, the anti-fuse memory $2c_2$, the P-type semiconductor region 8 and the N-type semiconductor region 7 are joined with each other to form the rectifier element 3 as a PN junction diode. With the configuration, the word line contact WC22 applies a word voltage from a word line to the rectifier elements 3 of the two anti-fuse memories $2c_2$ and $2c_6$ sharing the P-type semiconductor region 8.

The N-type semiconductor regions 7 of the two anti-fuse memories $2c_2$ and $2c_6$ each extend in the row direction departing from the P-type semiconductor region 8, and the memory gate electrodes G joined with the leading end parts thereof are disposed in respective active regions 22 different from each other. The memory gate insulating film 6 of each of the anti-fuse memories $2c_2$ and $2c_6$ is disposed in a region in which the memory gate electrode G integrated with the leading end part of the corresponding N-type semiconductor region 7 faces to the corresponding active region 22.

The following describes the bit line contacts BC21, BC22, BC23, and BC24. In the present embodiment, the semiconductor memory device 21 includes a total of four of the bit line contacts BC21, BC22, BC23, and BC24 arranged side by side in the row direction. The bit line contacts BC21, BC22, BC23, and BC24 are disposed in the respective different active regions 22 and each apply a bit voltage from a bit line (not illustrated) to the corresponding active region 22.

In this case, in the semiconductor memory device 21, the eight anti-fuse memories $2c_1$, $2c_2$, $2c_3$, $2c_4$, $2c_5$, $2c_6$, $2c_7$, and $2c_8$ arranged in a matrix of rows and columns are disposed between the active region 22 in which the bit line contact BC21 on the first column is disposed and the active region 22 in which the bit line contact BC22 on the second column is disposed. The four anti-fuse memories $2c_1$, $2c_2$, $2c_3$, and $2c_4$ arranged in the column direction are disposed in the active region 22 in which the bit line contact BC21 on the first column is disposed, whereas the anti-fuse memories $2c_5$, $2c_6$, $2c_7$, and $2c_8$ arranged in the column direction are disposed in the active region 22 in which the bit line contact BC22 on the second column is disposed.

In the semiconductor memory device 21, the active region 22 in which the bit line contact BC22 on the second column is disposed and the active region 22 in which the bit line contact BC23 on the third column is disposed extend side by side. Similarly to the above-described configuration, the eight anti-fuse memories $2c_9$, $2c_{10}$, $2c_{11}$, $2c_{12}$, $2c_{13}$, $2c_{14}$, $2c_{15}$, and $2c_{16}$ are arranged in a matrix of rows and columns between the active regions 22 of the bit line contact BC23 on the third column and the bit line contact BC24 on the forth column.

In the present embodiment, the four bit line contacts BC21, BC22, BC23, and BC24 all have identical configurations, and thus the following description will be made mainly on the bit line contact BC22. In this case, the active region 22 in which the bit line contact BC22 is disposed has a rectangular shape extending in the column direction along the four anti-fuse memories $2c_5$, $2c_6$, $2c_7$, and $2c_8$ arranged in the column direction, and includes the memory gate electrodes G of the four anti-fuse memories $2c_5$, $2c_6$, $2c_7$, and $2c_8$, arranged in the column direction. With the configuration, the bit line contact BC22 is connected with the different word line contacts WC21, WC22, WC23, and WC24 and applies a bit voltage from a bit line to the four anti-fuse memories $2c_5$, $2c_6$, $2c_7$, and $2c_8$ arranged in the column direction through the active region 22.

With the above-described configuration, in each of the anti-fuse memories $2c_1$, $2c_2$, $2c_3$, $2c_4$, $2c_5$, $2c_6$, $2c_7$, $2c_8$, $2c_9$, $2c_{10}$, $2c_{11}$, $2c_{12}$, $2c_{13}$, $2c_{14}$, $2c_{15}$, and $2c_{16}$ of the semiconductor memory device 21 illustrated in FIG. 6, the voltage application from the memory gate electrode G to the word line can be blocked by the rectifier element 3 depending on values of voltages applied to the memory gate electrode G of the memory capacitor 4 and the word line without using a conventional control circuit as described above in "(1-4) Operations and effects of semiconductor memory device having the above-described configuration". The configuration eliminates the need to provide a switch transistor configured to selectively apply voltage to a memory capacitor, and a switch control circuit for turning on and off the switch transistor as in conventional cases, and accordingly achieves downsizing.

As described above in "(1-4) Operations and effects of semiconductor memory device having the above-described configuration", for example, the anti-fuse memory $2a_6$ in the semiconductor memory device 21 according to the present invention can be provided with a double blocking mechanism including (i) a first blocking mechanism for forming no channel in the memory capacitor 4 by applying a non-breakdown word voltage of 0 V to a word line (nonselected programming word line), and (ii) a second blocking mechanism configured to block a non-breakdown bit voltage by achieving a reverse-biased state at the rectifier element 3. The configuration allows execution of a normal data programming operation and thus reliably prevents false operation at data reading.

In the semiconductor memory device 21 illustrated in FIG. 6, the single bit line contact BC22 is shared by the four anti-fuse memories $2c_5$, $2c_6$, $2c_7$, and $2c_8$ arranged in the column direction, and for example, the single word line contact WC22 is shared by the two anti-fuse memories $2c_2$ and $2c_6$ adjacent to each other in the row direction. The configuration achieves downsizing of the entire device as compared to a case in which a bit line contact and a word line contact are individually provided to each anti-fuse memory.

Figure 7:
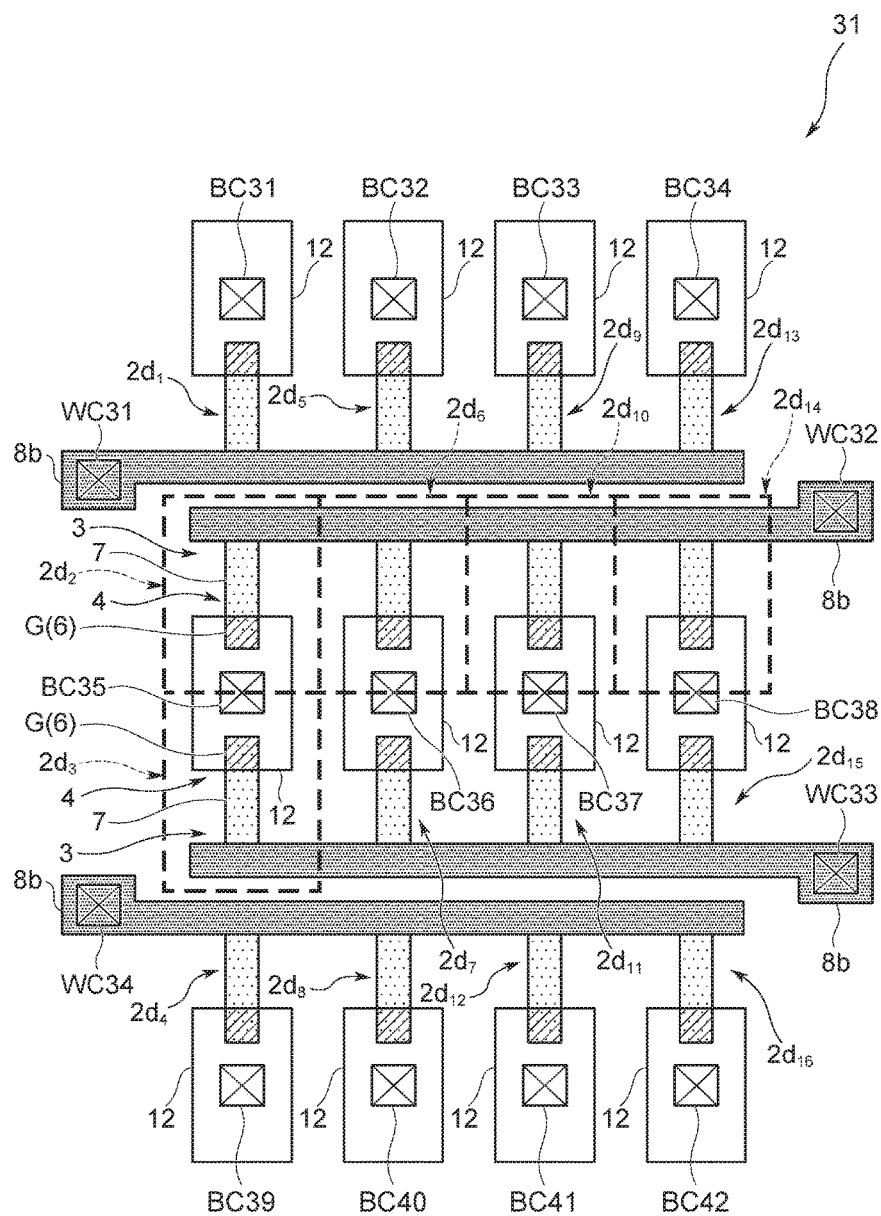
FIG. 7 is a schematic view illustrating the planar layout (1) when each word line contact is shared by a plurality of ant-fuse memories arranged in the row direction and each bit line contact is shared by two anti-fuse memories arranged in the column direction.

(5) Case in which Each Word Line Contact is Shared by a Plurality of Anti-fuse Memories Arranged in Row Direction and Each Bit Line Contact is Shared by Two Anti-fuse Memories FIG. 7, in which any corresponding part to that in FIG. 3 is denoted by an identical reference sign, illustrates a planar layout configuration of a semiconductor memory device 31 including, for example, a total of sixteen of anti-fuse memories $2d_1$, $2d_2$, $2d_3$, $2d_4$, $2d_5$, $2d_6$, $2d_7$, $2d_8$, $2d_9$, $2d_{10}$, $2d_{11}$, $2d_{12}$, $2d_{13}$, $2d_{14}$, $2d_{15}$, and $2d_{16}$ arranged in a 4×4 matrix. In this case, in the semiconductor memory device 31, the anti-fuse memories $2d_1$, $2d_2$, $2d_3$, $2d_4$, $2d_5$, $2d_6$, $2d_7$, $2d_8$, $2d_9$, $2d_{10}$, $2d_{11}$, $2d_{12}$, $2d_{13}$, $2d_{14}$, $2d_{15}$, and $2d_{16}$ all have identical configurations and each include the rectifier element 3 and the memory capacitor 4 similarly to FIGS. 2A and 2B described above. In addition, the word line contacts WC31, WC32, WC33, and WC34 all have identical configurations, and thus the following description will be made mainly on, for example, the word line contact WC32.

In this case, the word line contact WC32 is disposed in the P-type semiconductor region 8b having a longitudinal direction extending in the row direction, and is shared by the four anti-fuse memories $2d_2$, $2d_6$, $2d_{10}$, and $2d_{14}$ arranged in the row direction along the P-type semiconductor region 8b. The N-type semiconductor regions 7 of the four anti-fuse memories $2d_2$, $2d_6$, $2d_{10}$, and $2d_{14}$ arranged in the row direction are joined with one side of the P-type semiconductor region 8b on which the word line contact WC32 is erected.

For example, in the anti-fuse memory $2d_2$, the P-type semiconductor region 8b and the N-type semiconductor region 7 are joined with each other to form the rectifier element 3 as a PN junction diode. With the configuration, the word line contact WC32 applies a word voltage from a word line to the rectifier elements 3 of the four anti-fuse memories $2d_2$, $2d_6$, $2d_{10}$, and $2d_{14}$ sharing the P-type semiconductor region 8b.

The N-type semiconductor regions 7 of the four anti-fuse memories $2d_2$, $2d_6$, $2d_{10}$, and $2d_{14}$ extend in the column direction departing from the P-type semiconductor region 8b, and the memory gate electrodes G joined with the leading end parts thereof are disposed in the active regions 12 different from each other. The memory gate insulating film 6 of each of the anti-fuse memories $2d_2$, $2d_6$, $2d_{10}$, and $2d_{14}$ is disposed in a region in which the memory gate electrode G integrated with the leading end part of the corresponding N-type semiconductor region 7 faces to the corresponding active region 12.

In this case, in the semiconductor memory device 31, the P-type semiconductor region 8b on which the word line contact WC32 on the second row is erected and the P-type semiconductor region 8b on which the word line contact WC33 on the third row is erected extend side by side. The eight anti-fuse memories $2d_2$, $2d_3$, $2d_6$, $2d_7$, $2d_{10}$, $2d_{11}$, $2d_{14}$, and $2d_{15}$ are arranged in a matrix of rows and columns between the two P-type semiconductor regions 8b.

In the present embodiment, in the semiconductor memory device 31, one side of the P-type semiconductor region 8b on which the word line contact WC31 on the first row is erected is provided adjacent to another side of the P-type semiconductor region 8b on which the word line contact WC32 on the second row is erected. The other side of the P-type semiconductor region 8b on which the word line contact WC31 on the first row is erected is joined with the N-type semiconductor regions 7 of the four anti-fuse memories $2d_1$, $2d_5$, $2d_9$, and $2d_{13}$ arranged in the row direction.

In the semiconductor memory device 31, one side of the P-type semiconductor region 8b on which the word line contact WC34 on the forth row is erected is provided adjacent to another side of the P-type semiconductor region 8b on which the word line contact WC33 on the third row is erected. Another side of the P-type semiconductor region 8b on which the word line contact WC34 on the forth row is erected is joined with the N-type semiconductor regions 7 of the four anti-fuse memories $2d_4$, $2d_8$, $2d_{12}$, and $2d_{16}$ arranged in the row direction.

The following describes bit line contacts BC31, BC32, BC33, BC34, BC35, BC36, BC37, BC38, BC39, BC40, BC41, and BC42. In the present embodiment, the semiconductor memory device 31 includes a total of twelve of the bit line contacts BC31, BC32, BC33, BC34, BC35, BC36, BC37, BC38, BC39, BC40, BC41, and BC42 arranged in a 3×4 matrix. The bit line contacts BC31, BC32, BC33, BC34, BC35, BC36, BC37, BC38, BC39, BC40, BC41, and BC42 are disposed in the active regions 12 different from each other and each apply a bit voltage from a bit line (not illustrated) to the corresponding active region 12.

The bit line contacts BC35, BC36, BC37, and BC38 disposed in the central region and arranged in the row direction all have identical configurations, and thus the following description will be made mainly on, for example, the bit line contact BC35. In this case, the two anti-fuse memories $2d_2$ and $2d_3$ connected with the different P-type semiconductor regions 8b and arranged in the column direction are provided in the active region 12 in which the bit line contact BC35 is disposed. With the configuration, the bit line contact BC35 is shared by the two anti-fuse memories $2d_2$ and $2d_3$ and applies a bit voltage from a bit line to the two anti-fuse memories $2d_2$ and $2d_3$.

In the active region 12 on which the bit line contact BC35 is erected, the anti-fuse memory $2d_2$ and the anti-fuse memory $2d_3$ are disposed symmetrically with respect to the bit line contact BC35 in the column direction. Specifically, the active region 12 on which the bit line contact BC35 is erected faces to the memory gate electrode G of the anti-fuse memory $2d_2$ on one side where the memory gate insulating film 6 of the anti-fuse memory $2d_2$ is disposed. The active region 12 faces to the memory gate electrode G of the anti-fuse memory $2d_3$ on the other side where the memory gate insulating film 6 of the anti-fuse memory $2d_3$ is disposed.

The four bit line contacts BC31, BC32, BC33, and BC34 (BC39, BC40, BC41, and BC42) arranged in the row direction in the periphery of the planar layout of the semiconductor memory device 31 are connected with the corresponding single anti-fuse memories $2d_1$, $2d_5$, $2d_9$, and $2d_{13}$ ($2d_4$, $2d_8$, $2d_{12}$, and $2d_{16}$), respectively. With the configuration, the bit line contacts BC31, BC32, BC33, and BC34 (BC39, BC40, BC41, and BC42) arranged in the row direction in the periphery apply bit voltages only to the respective single anti-fuse memories $2d_1$, $2d_5$, $2d_9$, and $2d_{13}$ ($2d_4$, $2d_8$, $2d_{12}$, and $2d_{16}$).

In this manner, the bit line contacts BC31, BC32, BC33, BC34, BC39, BC40, BC41, and BC42 in the periphery apply bit voltages only to the respective single anti-fuse memories $2d_1$, $2d_5$, $2d_9$, $2d_{13}$, $2d_4$, $2d_8$, $2d_{12}$, and $2d_{16}$. However, the bit line contacts BC35, BC36, BC37, and BC38 arranged in the central region apply bit voltages to the two anti-fuse memories $2d_2$ and $2d_3$, the two anti-fuse memories $2d_6$ and $2d_7$, the two anti-fuse memories $2d_{10}$ and $2d_{11}$, and the two anti-fuse memories $2d_{14}$ and $2d_{15}$, respectively. In other words, the single bit line contacts BC35, BC36, BC37, and BC38 are shared by the two anti-fuse memories $2d_2$ and $2d_3$, the two anti-fuse memories $2d_6$ and $2d_7$, the two anti-fuse memories $2d_{10}$ and $2d_{11}$, and the two anti-fuse memories $2d_{14}$ and $2d_{15}$, respectively, which leads to downsizing of the entire device accordingly.

With the above-described configuration, in each of the anti-fuse memories $2d_1$, $2d_2$, $2d_3$, $2d_4$, $2d_5$, $2d_6$, $2d_7$, $2d_8$, $2d_9$, $2d_{10}$, $2d_{11}$, $2d_{12}$, $2d_{13}$, $2d_{14}$, $2d_{15}$, and $2d_{16}$ of the semiconductor memory device 31 illustrated in FIG. 7, the voltage application from the memory gate electrode G to the word line can be blocked by the rectifier element 3 depending on values of voltages applied to the memory gate electrode G of the memory capacitor 4 and the word line without using a conventional control circuit as described above in "(1-4) Operations and effects of semiconductor memory device having the above-described configuration". The configuration eliminates the need to provide a switch transistor configured to selectively apply voltage to a memory capacitor, and a switch control circuit for turning on and off the switch transistor as in conventional cases, and accordingly achieves downsizing.

As described above in "(1-4) Operations and effects of semiconductor memory device having the above-described configuration", for example, the anti-fuse memory $2d_2$ in the semiconductor memory device 31 according to the present invention can be provided with a double blocking mechanism including (i) a first blocking mechanism for forming no channel in the memory capacitor 4 by applying a non-breakdown word voltage of 0 V to a word line (nonselected programming word line), and (ii) a second blocking mechanism configured to block a non-breakdown bit voltage by achieving a reverse-biased state at the rectifier element 3. The configuration allows execution of a normal data programming operation and thus reliably prevents false operation at data reading.

In the semiconductor memory device 31 illustrated in FIG. 7, for example, the single word line contact WC32 is shared by the four anti-fuse memories $2d_2$, $2d_6$, $2d_{10}$, and $2d_{14}$ arranged in one direction (in this case, the row direction), and for example, the single bit line contact BC35 is shared by the two anti-fuse memories $2d_2$ and $2d_3$ adjacent to each other. The configuration achieves downsizing of the entire device as compared to a case in which a bit line contact and a word line contact are individually provided to each anti-fuse memory.

(6) Anti-fuse Memory including Rectifier Element as N-type Metal-oxide-semiconductor (MOS) Transistor (6-1) Basic Configuration A rectifier element according to the above-described embodiment is the diode-type rectifier element 3 having a semiconductor junction structure of a P-type semiconductor region and an N-type semiconductor region and configured to block voltage from a memory gate electrode as reverse-biased voltage, but the present invention is not limited thereto. For example, a MOS transistor-type rectifier element having a semiconductor junction structure of a rectifier element gate electrode, a drain region, and a source region and configured to block voltage from a memory gate electrode of a memory capacitor as reverse-biased voltage is applicable.

Figure 8:
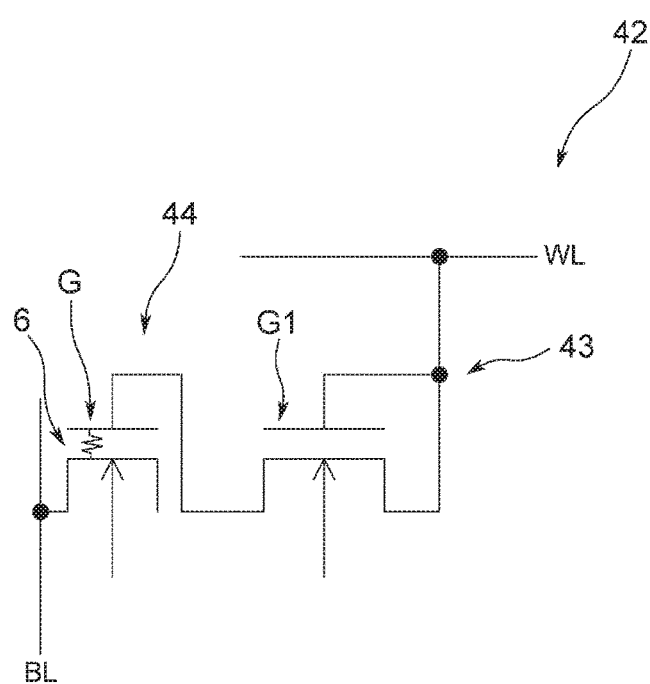
FIG. 8 is a circuit diagram illustrating a circuit configuration of an anti-fuse memory according to another embodiment including a rectifier element having an N-type MOS transistor configuration.

FIG. 8 illustrates an anti-fuse memory 42 including a rectifier element 43 having a semiconductor junction structure of an N-type MOS transistor, and a memory capacitor 44 including the memory gate insulating film 6 to which dielectric breakdown occurs depending on a voltage difference between a word line WL and a bit line BL. In this case, the bit line BL is connected with a diffusion region at one end of the memory capacitor 44, and the rectifier element 43 is connected with the memory gate electrode G. The rectifier element 43 includes a rectifier element gate electrode G1 and a drain region both connected with the word line WL, and a source region connected with the memory gate electrode G of the memory capacitor 44. With the configuration, the transistor of the rectifier element 43 is turned off while an off voltage is applied from the word line WL, thereby blocking voltage application from the memory gate electrode G to the word line WL.

Figure 9A:
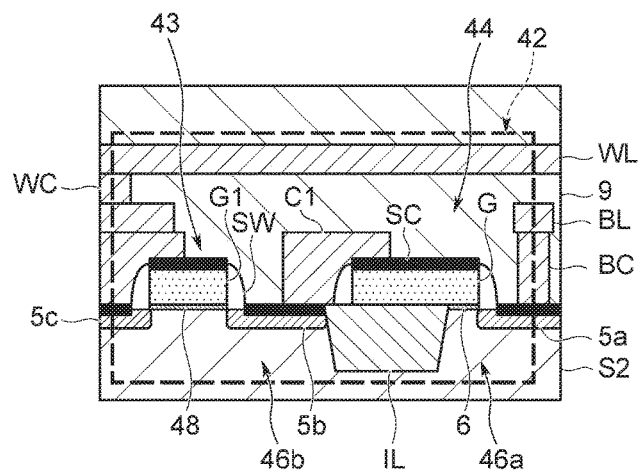
FIG. 9A is a schematic view illustrating a sectional configuration of the anti-fuse memory illustrated in FIG. 8.

As illustrated in FIG. 9A, the anti-fuse memory 42 includes an element isolation layer IL made of an insulating material and disposed on the surface of the P-type or N-type well S2 made of, for example, Si. On the well S2, the rectifier element 43 is disposed in a region on one side of the element isolation layer IL, and the memory capacitor 44 is disposed in a region on the other side of the element isolation layer IL. A diffusion region 5b is disposed adjacent to the element isolation layer IL on the surface of the well S2 on the one side of the element isolation layer IL, and a diffusion region 5c is disposed on the surface thereof at a predetermined interval from the diffusion region 5b.

The rectifier element gate electrode G1 is disposed on the surface of the well S2 between the diffusion regions 5b and 5c through a gate insulating film 48, and the word line contact WC is erected across the diffusion region 5c serving as a drain region and the rectifier element gate electrode G1. In the present embodiment, the word line contact WC extends from the silicide SC of the diffusion region 5c surface serving as a drain region to the silicide SC on the surface of the rectifier element gate electrode G1 through a sidewall of the rectifier element gate electrode G1, and is connected with the word line WL at a leading end part. With the configuration, the word line contact WC applies a word voltage applied from the word line WL to both of the diffusion region 5c serving as the drain region of the rectifier element 43 and the rectifier element gate electrode G1.

A diffusion region 5a is disposed on the surface of the well S2 on the other side of the element isolation layer IL at a predetermined interval from the element isolation layer IL. The bit line contact BC connected with the bit line BL at a leading end is erected on the silicide SC on the surface of the diffusion region 5a. In addition, the memory gate electrode G is disposed on the surface between the element isolation layer IL and the diffusion region 5a through the memory gate insulating film 6. The memory gate electrode G extends from a partial region on the element isolation layer IL to the surface of the memory gate insulating film 6, and includes sidewall structures SW on both sidewalls.

The anti-fuse memory 42 includes a contact C1 extending across the diffusion region 5b serving as the source region of the rectifier element 43 and the memory gate electrode G on the element isolation layer IL. The contact C1 electrically connects the diffusion region 5b of the rectifier element 43 and the memory gate electrode G of the memory capacitor 44. With the configuration, the rectifier element 43 has a channel in a non-conductive state while an off voltage is applied from the word line WL, thereby blocking voltage application from the memory gate electrode G to the word line WL.

In the anti-fuse memory 42 including the rectifier element 43 having such a MOS transistor configuration, the rectifier element gate electrode G1 of the rectifier element 43 and the memory gate electrode G of the memory capacitor 44 are disposed within one wiring layer (within the same layer) and have identical thicknesses. The configuration leads to reduction of the thickness of the entire anti-fuse memory 42. The bit line contact BC, the word line contact WC, the contact C1, the rectifier element gate electrode G1, the memory gate electrode G, the bit line BL, and the word line WL formed on the well S2 are covered by the interlayer insulation layer 9.

Figure 9B:
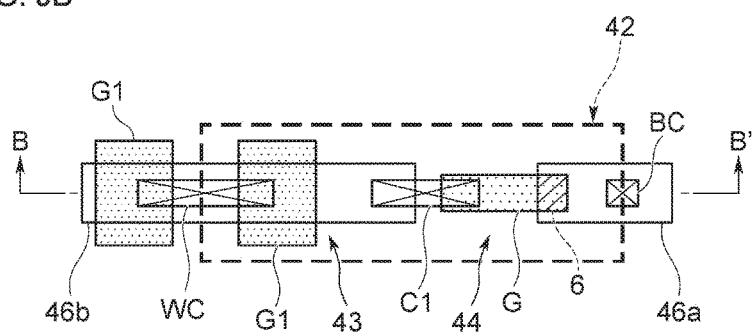
FIG. 9B is a schematic view illustrating a planar layout of the anti-fuse memory illustrated in FIG. 9A.

FIG. 9B, in which any corresponding part to that in FIG. 9A is denoted by an identical reference sign, illustrates a planar layout configuration of a region in which the anti-fuse memory 42 illustrated in FIG. 9A is provided. FIG. 9A illustrates a cross section taken along line B-B' in FIG. 9B. As illustrated in FIG. 9B, in the anti-fuse memory 42, the bit line contact BC is disposed in a corresponding active region 46a of the well S2, and the word line contact WC is disposed in a corresponding active region 46b of the well. In the memory capacitor 44, the memory gate electrode G partially faces to the active region 46a, and the memory gate insulating film 6 is disposed in a region in which the memory gate electrode G faces to the active region 46a. The rectifier element gate electrode G1 of the rectifier element 43 is disposed in the active region 46a, which includes the rectifier element gate electrode G1 of the rectifier element 43 in another anti-fuse memory (not illustrated) adjacent to the anti-fuse memory 42.

The anti-fuse memory 42 thus configured can be formed through a typical semiconductor manufacturing process using a photolithography technique, a deposition technology such as oxidation or chemical vapor deposition (CVD), an etching technology, or an ion injection technique. Thus, description thereof is omitted.

(6-2) Data Programming Operation

To program data only to some of the anti-fuse memories 42 arranged in a matrix of rows and columns, similarly to the semiconductor memory device 1 illustrated in FIG. 1, a breakdown bit voltage of 0 V is applied to the bit line BL connected with the anti-fuse memory 42 to which data is to be programmed, and a non-breakdown bit voltage of 3 V is applied to the bit line BL connected only with the anti-fuse memory 42 to which no data is to be programmed.

Simultaneously, a breakdown word voltage of 5 V is applied to the word line WL connected with the anti-fuse memory 42 to which data is to be programmed, and a non-breakdown word voltage of 0 V is applied to the word line WL connected only with the anti-fuse memory 42 to which no data is to be programmed. A voltage of 0 V, which is equal to the breakdown bit voltage, is applied to the well on which the anti-fuse memory 42 is disposed.

For example, in the anti-fuse memory 42 to which data is to be programmed, the breakdown bit voltage of 0 V is applied to the bit line BL, and the breakdown word voltage of 5 V is applied to the word line WL. The breakdown word voltage of 5 V is applied from the word line WL to the rectifier element gate electrode G1, and thus the rectifier element 43 is turned on due to a voltage difference between the rectifier element gate electrode G1 and the source region. As a result, forward-biased voltage is applied from the drain region to the source region, and thus the breakdown word voltage decreased by a threshold voltage (Vth) is applied from the drain region to the memory gate electrode G of the memory capacitor 44 through the source region. Accordingly, the memory capacitor 44 is turned on to form a channel due to a relation between the breakdown word voltage applied to the memory gate electrode G and the breakdown bit voltage applied to the bit line BL, and as a result, the potential of the bit line BL is induced to the channel.

Accordingly, a voltage difference due to the breakdown bit voltage and the breakdown word voltage is generated between the memory gate electrode G and the channel in the memory capacitor 44. As a result, in the anti-fuse memory 42 to which data is to be programmed, dielectric breakdown occurs to the memory gate insulating film 6 below the memory gate electrode G in the memory capacitor 44, and the memory gate electrode G and the diffusion region become a conductive state at low resistance, thereby achieving a data programmed state of the memory capacitor 44.

In the anti-fuse memory 42 to which no data is to be programmed and in which the non-breakdown bit voltage of 3 V is applied to the bit line BL and the non-breakdown word voltage of 0 V is applied to the word line WL, the non-breakdown bit voltage of 3 V applied to the bit line BL is applied to the source region of the rectifier element 43 through the memory gate electrode G of the memory capacitor 44 when dielectric breakdown has already occurred to, for example, the memory gate insulating film 6 of the memory capacitor 44. In the anti-fuse memory 42, since the non-breakdown word voltage of 0 V is applied to the word line WL, the rectifier element gate electrode G1 and the drain region of the rectifier element 43 are at 0 V, and accordingly, the rectifier element 43 is turned off (in a non-conductive state) (second blocking mechanism).

The potential of a wire between the memory gate electrode G of the memory capacitor 44 and the source region of the rectifier element 43 is not externally supplied and thus is supposed to be at 0 V, which is equipotential to a well potential in a stationary state. Thus, when a high non-breakdown bit voltage (in this case, 3 V) is applied to the bit line PI connected with the memory capacitor 44, no channel formed in the memory capacitor 44 despite of dielectric breakdown occurring to, for example, the memory gate insulating film 6 of the memory capacitor 44, due to the non-breakdown word voltage of 0 V applied to the word line (nonselected programming word line) WL. Accordingly, the memory capacitor 44 blocks voltage application from the bit line (nonselected programming bit line) BL to the word line WI (first blocking mechanism).

Thus, in the anti-fuse memory 42, for example, when the dielectric breakdown of the memory gate insulating film 6 occurs at a place extremely close to the diffusion region 5a connected with the bit line (nonselected programming bit line) EL to which the non-breakdown bit voltage (3 V) is applied, and the potential of the nonselected programming bit line BL cannot be blocked by the channel of the memory capacitor 44, so that the non-breakdown bit voltage is applied from the nonselected programming bit line BL to the memory gate electrode G of the memory capacitor 44, the voltage application from the memory gate electrode G to the word line WL can be reliably blocked by the rectifier element 43 since the rectifier element 43 connected with the memory gate electrode G is turned off (in a non-conductive state). In this manner, the non-breakdown bit voltage of 3 V applied from the bit line BL can be blocked by the anti-fuse memory 42 through the operation (first blocking mechanism) of turning off the channel of the memory capacitor 44 and the operation (second blocking mechanism) of turning off the rectifier element 43, thereby reliably preventing application of the non-breakdown bit voltage to the word line WL.

In the anti-fuse memory 42 to which no data is to be programmed and to which the breakdown word voltage of 5 V is applied from the word line WI and the non-breakdown bit voltage of 3 V is applied from the bit line BL, the breakdown word voltage decreased by the threshold voltage is applied from the rectifier element 43 to the memory gate electrode G of the memory capacitor 44. However, due to the decreased voltage difference between the memory gate electrode G and each of the channel and the diffusion region, the memory gate insulating film. 6 of the memory capacitor 44, to which no dielectric breakdown has occurred, remains in an insulation state without dielectric breakdown, thereby maintaining a no-data programmed state.

In a semiconductor memory device including a matrix of rows and columns of the anti-fuse memories 42 thus configured, data can be read from desired one of the anti-fuse memories 42 through "(1-3) Data reading operation" described above, and thus a description thereof is omitted.

(6-3) Operations and Effects of Semiconductor Memory Device having the Above-described Configuration Similarly to the anti-fuse memories 2a and 2b described above with reference to FIGS. 2A and 2B, in the anti-fuse memory 42 thus configured to which no data is to be programmed, at application of a high non-breakdown bit voltage to the bit line BL connected with the memory capacitor 44, the channel of the rectifier element 43 is turned off (non-conductive state) to block application of the non-breakdown bit voltage from the memory gate electrode G of the memory capacitor 44 to the word line WL when dielectric breakdown has occurred to, for example, the memory gate insulating film 6 of the memory capacitor 44.

Thus, similarly to the anti-fuse memories 2a and 2b described above with reference to FIGS. 2A and 2B, the anti-fuse memory 42 includes the rectifier element 43 having a transistor configuration and configured to be turned off to block the voltage application from the memory gate electrode G to the word line WI depending on values of voltages applied to the memory gate electrode G and the word line WL without using a conventional control circuit. The configuration eliminates the need to provide a switch transistor configured to selectively perform each voltage application to the memory capacitor 44 and a switch control circuit for turning on and off the switch transistor, and accordingly achieves downsizing.

Such an anti-fuse memory 42 can be provided with a double blocking mechanism including (i) a first blocking mechanism of applying a non-breakdown word voltage of 0 V to a word line (nonselected programming word line) to form no channel in the memory capacitor 44, and a second blocking mechanism of turning off the rectifier element 43 to block the non-breakdown bit voltage. The configuration allows execution of a normal data programming operation and thus reliably prevents false operation at data reading.

Figure 10:
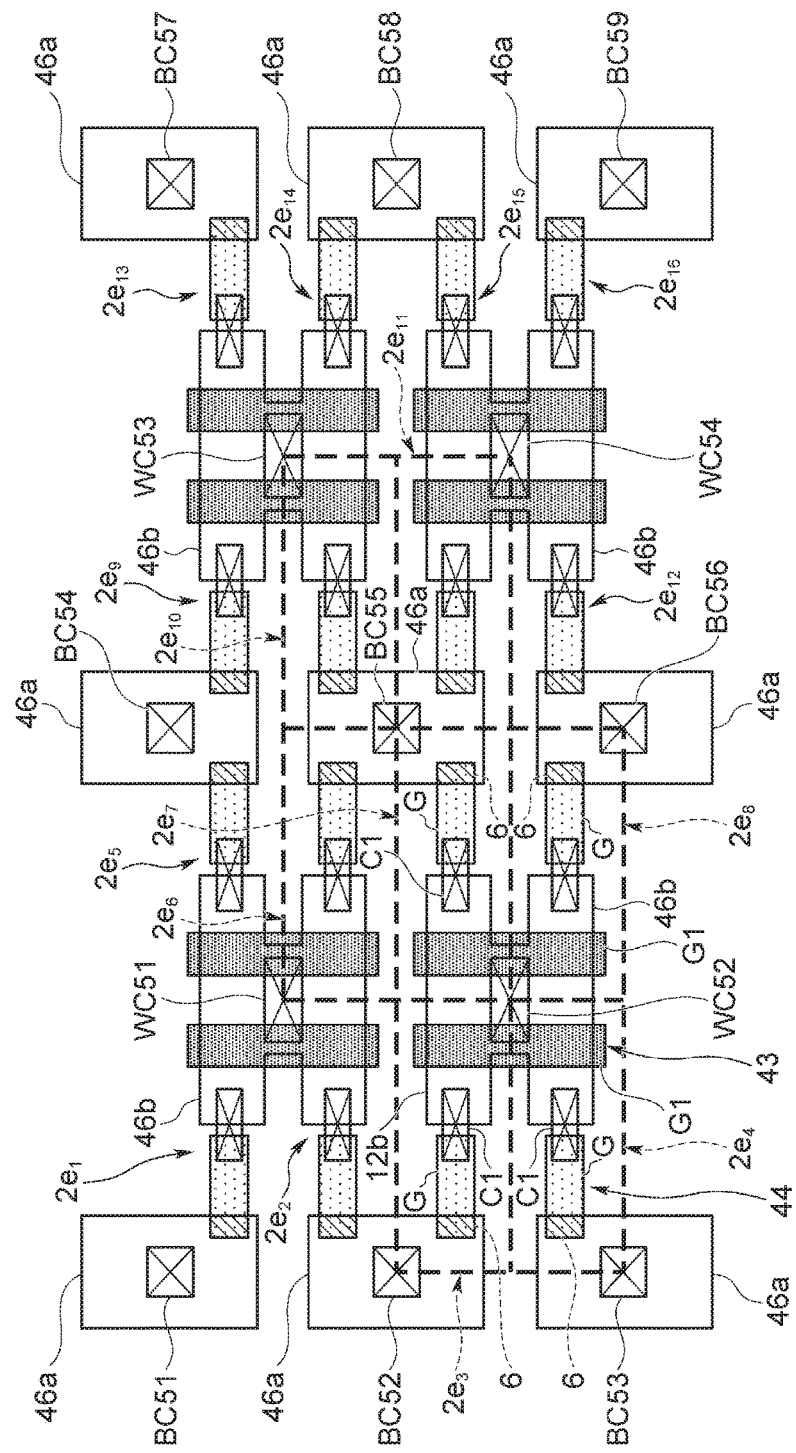
FIG. 10 is a schematic view illustrating a planar layout (2) when each word line contact and each bit line contact are shared by four anti-fuse memories.

(7) Case in which Each Word Line Contact and Each Bit Line Contact are Shared by Four Anti-fuse Memories
(7-1) Planar Layout Configuration The following describes a planar layout configuration of a semiconductor memory device including the above-described anti-fuse memories 42 arranged in a matrix of rows and columns. FIG. 10, in which any corresponding part to that in FIG. 9B is denoted by an identical reference sign, illustrates a planar layout configuration of, for example, a total of sixteen of anti-fuse memories $2e_1$, $2e_2$, $2e_3$, $2e_4$, $2e_5$, $2e_6$, $2e_7$, $2e_8$, $2e_9$, $2e_{10}$, $2e_{11}$, $2e_{12}$, $2e_{13}$, $2e_{14}$, $2e_{15}$, and $2e_{16}$ arranged in a 4×4 matrix. In this case, in a semiconductor memory device 41, the anti-fuse memories $2e_1$, $2e_2$, $2e_3$, $2e_4$, $2e_5$, $2e_6$, $2e_7$, $2e_8$, $2e_9$, $2e_{10}$, $2e_{11}$, $2e_{12}$, $2e_{13}$, $2e_{14}$, $2e_{15}$, and $2e_{16}$ all have identical configurations, and each include the rectifier element 43 and the memory capacitor 44 similarly to FIGS. 9A and 9B described above. In addition, word line contacts WC51, WC52, WC53, and WC54 all have identical configurations, and thus the following description will be made mainly on, for example, the word line contact WC52.

In this case, the active region 46b on which the word line contact WC52 is erected is shared by the four anti-fuse memories $2e_3$, $2e_4$, $2e_7$, and $2e_8$ adjacent to each other. The rectifier element gate electrode G1 shared by the two anti-fuse memories $2e_3$ and $2e_4$ adjacent to each. other in the column direction, and the rectifier element gate electrode G1 shared by the two anti-fuse memories $2e_7$ and $2e_8$ adjacent to each other in the column direction are disposed in the active region 46b on which the word line contact WC52 is erected. The word line contact WC52 is disposed across the two rectifier element gate electrodes G1 and the active region 46b. With the configuration, the word line contact WC52 applies a bit voltage from a bit line to the rectifier element gate electrodes G1 and the drain regions of the anti-fuse memories $2e_3$, $2e_4$, $2e_7$, and $2e_8$ of the rectifier elements 43.

In the active region 46b on which the word line contact WC52 is erected, the source regions of the rectifier elements 43 of the anti-fuse memories $2e_3$, $2e_4$, $2e_7$, and $2e_8$ are connected with the memory gate electrodes G of the anti-fuse memories $2e_3$, $2e_4$, $2e_7$, and $2e_8$ through the respective contacts C1.

The following describes bit line contacts BC51, BC52, BC53, BC54, BC55, BC56, BC57, BC58, and BC59. In the present embodiment, the semiconductor memory device 41 includes a total of nine of the bit line contacts BC51, BC52, BC53, BC54, BC55, BC56, BC57, BC58, and BC59 arranged in a 3×3 matrix. The bit line contacts BC51, BC52, BC53, BC54, BC55, BC56, BC57, BC58, and BC59 are disposed in the respective different active regions 46a, and each apply a bit voltage from a bit line (not illustrated) to the corresponding active region 46a.

The four anti-fuse memories $2e_6$, $2e_7$, $2e_{10}$, and $2e_{11}$ disposed adjacent to each other and connected with the different active regions 46b are provided in the active region 46a on which the bit line contact BC55 arranged in a central region is disposed among the nine bit line contacts BC51, BC52, BC53, BC54, BC55, BC56, BC57, BC58, and BC59. Accordingly, the bit line contact BC55 arranged in the central region is shared by the four anti-fuse memories $2e_6$, $2e_7$, $2e_{10}$, and $2e_{11}$ adjacent to each other, and applies the bit voltage from the bit line to the four anti-fuse memories $2e_6$, $2e_7$, $2e_{10}$, and $2e_{11}$.

In this case, in the active region 46a on which the bit line contact BC55 at the center is erected, the anti-fuse memories $2e_6$ and $2e_{10}$ are disposed symmetrically with respect to the bit line contact BC55, and the anti-fuse memories $2e_7$ and $2e_{11}$ are disposed symmetrically with respect to the bit line contact BC55. Specifically, the memory gate electrodes G of the two anti-fuse memories $2e_6$ and $2e_7$ adjacent to each other in the column direction face to each other on one side of the active region 46a on which the bit line contact BC55 is erected, and the memory gate insulating films 6 of the anti-fuse memories $2e_6$ and $2e_7$ are disposed on the one side. The memory gate electrodes G of the anti-fuse memories $2e_{10}$ and $2e_{11}$ adjacent to each other in the column direction face to each other on the other side of the active region 46a, and the memory gate insulating films 6 of the anti-fuse memories $2e_{10}$ and $2e_{11}$ are disposed on the other side.

The four bit line contacts BC51, BC53, BC57, and BC59 disposed at corners in the planar layout of the semiconductor memory device 41 are connected only with the corresponding single anti-fuse memories $2e_1$, $2e_4$, $2e_{13}$, and $2e_{16}$. Accordingly, the bit line contacts BC51, BC53, BC57, and BC59 disposed at the corners apply bit voltages only to the corresponding single anti-fuse memories $2e_1$, $2e_4$, $2e_{13}$, and $2e_{16}$.

Among the bit line contacts BC51, BC52, BC53, BC54, BC56, BC57, BC58, and BC59 arranged in the periphery of the planar layout of the semiconductor memory device 41, the bit line contact BC52 disposed at a place other than the corners is connected only with the two anti-fuse memories $2e_2$ and $2e_3$. The bit line contacts BC54, BC56, and BC58 disposed at places other than the corners are connected only with the corresponding pairs of the two anti-fuse memories $2e_5$ and $2e_9$, the two anti-fuse memories $2e_8$ and $2e_{12}$, and the two anti-fuse memories $2e_{14}$ and $2e_{15}$. In this manner, in the semiconductor memory device 41, the bit line contacts BC52, BC54, BC56, and BC58 disposed at places other than the corners are each shared by two anti-fuse memories, and the bit line contact BC55 arranged in the central region is shared by four anti-fuse memories. The configuration achieves downsizing as compared to a case in which each bit line contact is provided to one anti-fuse memory.

In the above-described configuration, in each of the anti-fuse memories $2e_1$, $2e_2$, $2e_3$, $2e_4$, $2e_5$, $2e_6$, $2e_7$, $2e_8$, $2e_9$, $2e_{10}$, $2e_{11}$, $2e_{12}$, $2e_{13}$, $2e_{14}$, $2e_{15}$and $2e_{16}$ of the semiconductor memory device 41 illustrated in FIG. 10, the rectifier element 43 having a transistor configuration is configured to turned off to block the voltage application from the memory gate electrode G to the word line WL depending on values of voltages applied to the memory gate electrode G and the word line WL without using a conventional control circuit, as described above in "(6-3) Operations and effects of semiconductor memory device having the above-described configuration". The configuration eliminates the need to provide a switch transistor configured to selectively perform each voltage application to the memory capacitor 44 and a switch control circuit for turning on and off the switch transistor, and accordingly achieves downsizing.

As described above in "(6-3) Operations and effects of semiconductor memory device having the above-described configuration", for example, the anti-fuse memory $2e_4$ in the semiconductor memory device 41 can be provided with a double blocking mechanism including (i) a first blocking mechanism of applying a non-breakdown word voltage of 0 V to a word line (nonselected programming word line) to form no channel in the memory capacitor 44, and (ii) a second blocking mechanism of turning off the rectifier element 43 to block the non-breakdown bit voltage. The configuration allows execution of a normal data programming operation and thus reliably prevents false operation at data reading.

In the semiconductor memory device 41 illustrated in FIG. 10, the single bit line contact BC55 is shared by the four anti-fuse memories $2e_6$, $2e_7$, $2e_{10}$, and $2e_{11}$ adjacent to each other, and for example, the single word line contact WC52 is shared by the four anti-fuse memories $2e_3$, $2e_4$, $2e_7$, and $2e_8$ adjacent to each other. The configuration achieves downsizing of the entire device as compared to a case in which a bit line contact and a word line contact are individually provided to each anti-fuse memory.

(7-2) Planar Layout Configuration of Bit Lines and Word Lines

Figure 11:
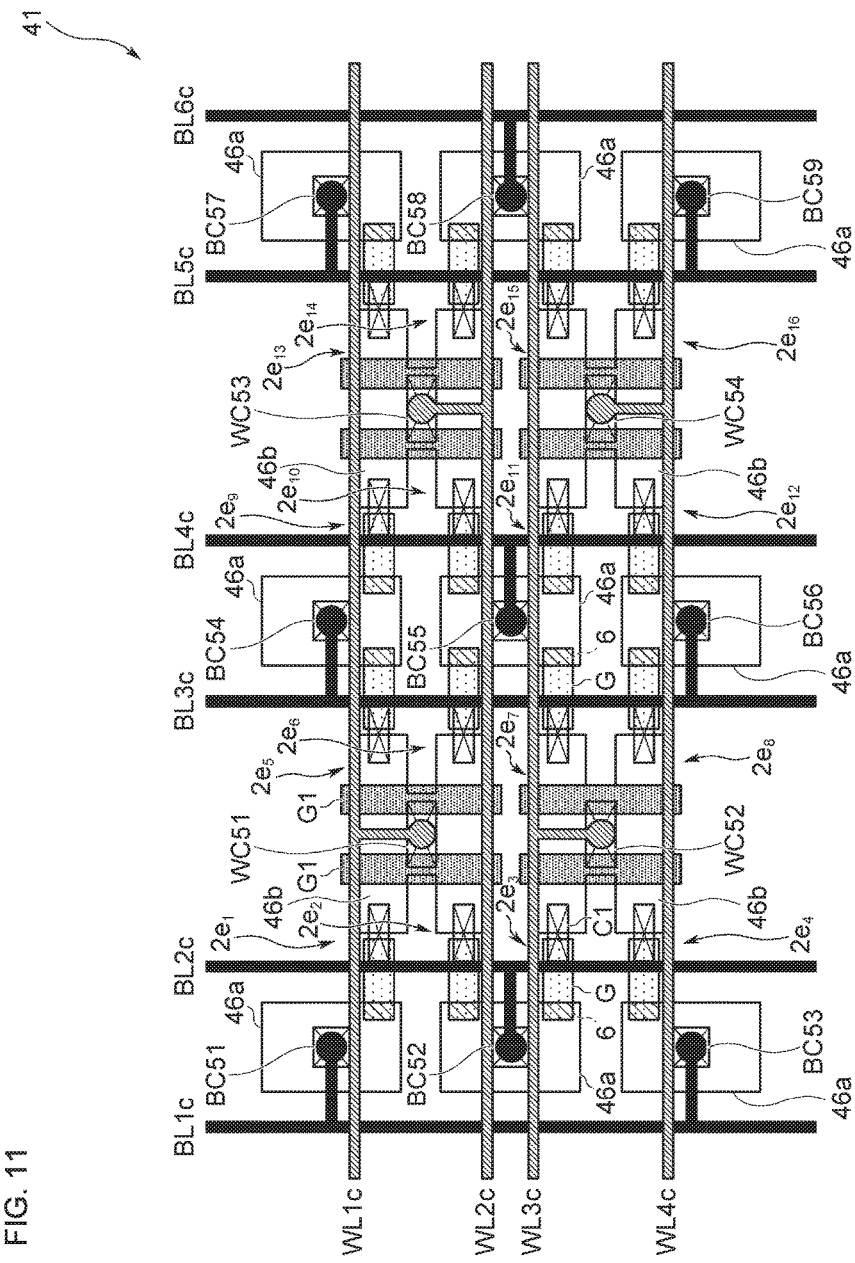
FIG. 11 is a schematic view illustrating the planar layout (2) of word lines and bit lines.

The following describes a planar layout of bit lines and word lines of the semiconductor memory device 41 illustrated in FIG. 10. As illustrated in FIG. 11, in which any corresponding part to that in FIG. 10 is denoted by an identical reference sign, among the bit line contacts BC51, BC52, and BC53 on the first column in the semiconductor memory device 41, the bit line contact BC51 on the first row and the bit line contact BC53 on the third row are connected with a first bit line BL1c, and the bit line contact BC52 on the second row between the bit line contacts BC51 and BC53 are connected with a second bit line BL2c. Accordingly, in the semiconductor memory device 41, for example, the active region 46b of the rectifier element 43 applies a bit voltage to the two different anti-fuse memories $2e_1$ and $2e_4$ through the first bit line BL1c, and in addition, the active region 46b of the rectifier element 43 applies, to the two different anti-fuse memories $2e_2$ and $2e_3$ through the second bit line BL2c, a bit voltage different from that applied to the first bit line BL1c.

Among the bit line contacts BC54, BC55, and BC56 on the second column, the bit line contact BC54 on the first row and the bit line contact BC56 on the third row are connected with a third bit line BL3c, and the bit line contact BC55 on the second row between the bit line contacts BC54 and BC56 is connected with a forth bit line BL4c. Accordingly, in the semiconductor memory device 41, for example, the active region 46b of the rectifier element 43 applies a bit voltage to the different four anti-fuse memories $2e_5$, $2e_9$, $2e_8$, and $2e_{12}$ through the third bit line BL3c, and in addition, the active region 46b of the rectifier element 43 applies, to the different four anti-fuse memories $2e_6$, $2e_7$, $2e_{10}$, and $2e_{11}$ through the forth bit line BL4c, a bit voltage different from that applied to the third bit line BL3c.

In addition, among the bit line contacts BC57, BC58, and BC59 on the third column, the bit line contact BC57 on the first row and the bit line contact BC59 on the third row are connected with a fifth bit line BL5c, and the bit line contact BC58 on the second row between the bit line contacts BC57 and BC59 is connected with a sixth bit line BL6c. Accordingly, in the semiconductor memory device 41, for example, the active region 46b of the rectifier element 43 applies a bit voltage to the different two anti-fuse memories $2e_{13}$ and $2e_{16}$ through the fifth bit line BL5c, and in addition, the active region 46b of the rectifier element 43 applies, to the different two anti-fuse memories $2e_{14}$ and $2e_{15}$ through the sixth bit line BL6c, a bit voltage different from that applied to the fifth bit line BL5c.

In addition to the configuration, the word line contacts WC51, WC52, WC53, and BC54 are connected with word lines WL1c, WL2c, WL3c, and WL4c, respectively. Different word voltages are applied to the word line contacts WC51, WC52, WC53, and WC54 through the word lines WL1c, WL2c, WL3c, and WL4c. In the present embodiment, for example, the first word line WL1c is connected with the word line contact WC51 on the first row and the firsts column to apply a word voltage to the four anti-fuse memories $2e_1$, $2e_2$, $2e_5$, and $2e_6$ sharing the word line contact WC51. The other word lines WL2c, WL3c, and WL4c apply word voltages to the four anti-fuse memories $2e_9$, $2e_{10}$, $2e_{13}$, and $2e_{14}$, the four anti-fuse memories $2e_3$, $2e_4$, $2e_7$, and $2e_8$, and the four anti-fuse memories $2e_{11}$, $2e_{12}$, $2e_{15}$, and $2e_{16}$, respectively, through the corresponding word line contacts WC53, WC52, and WC54.

For example, the four anti-fuse memories $2e_6$, $2e_7$, $2e_{10}$, and $2e_{11}$ connected with the single bit line contact BC55 in the central region are connected with the electrically independently controllable word lines WL1c, WL2c, WL3c, and WL4c. Different word voltages are applied through the respective word lines WL1c, WL2c, WL3c, and WL4c. For example, the four anti-fuse memories $2e_3$, $2e_4$, $2e_7$, and $2e_8$ connected with the single word line contact WC52 are connected with the bit lines BL1c, BL2c, BL3c, and BL4c electrically independently controllable. Different bit voltages are applied through the respective bit lines BL1c, BL2c, BL3c, and BL4c.

In the semiconductor memory device 41 thus configured, data can be programmed only to, for example, the anti-fuse memory $2e_1$ at a predetermined position through "(6-2) Data programming operation" described above and data can be read from, for example, the anti-fuse memory $2e_1$ at a predetermined position through. "(1-3) Data reading operation" described above, by adjusting voltages applied to the bit lines BL1c, BL2c, BL3c, BL4c, BL5c, and BL6c and the word lines WL1c, WL2c, WL3c, and WL4c as appropriate.

Since the semiconductor memory device 41 in FIG. 11 includes the sixteen anti-fuse memories, for example, the word line WL1c is connected only with the single word line contact WC51. When a larger number of anti-fuse memories are provided, for example, the first word line WL1c and the second word line WL2c are alternately connected with a plurality of word line contacts arranged in the row direction. For example, the word line WL1c, which is connected with the word line contact WC51 on the first row and the first column, is connected with, for example, the word line contact on the first row and the third column and the word line contact on the first row and the fifth column, and the word line WL2c, which is connected with the word line contact WC53 on the first row and the second column, is also connected with, for example, the word line contact on the first row and the forth column and the word line contact on the first row and the sixth column.

(8) Planar Layout Configuration of Bit Lines and Word Lines According to Another Embodiment FIG. 11 illustrates the semiconductor memory device 41 including, for example, a total of sixteen of the anti-fuse memories $2e_1$, $2e_2$, $2e_3$, $2e_4$, $2e_5$, $2e_6$, $2e_7$, $2e_8$, $2e_9$, $2e_{10}$, $2e_{11}$, $2e_{12}$, $2e_{13}$, $2e_{14}$, $2e_{15}$, and $2e_{16}$ arranged in a 4×4 matrix, and the bit lines BL1c, BL2c, BL3c, BL4c, BL5c, and BL6c and the word lines WL1c, WL2c, WL3c, and WL4c disposed in accordance with the arranged positions of the anti-fuse memories $2e_1$, $2e_2$, $2e_3$, $2e_4$, $2e_5$, $2e_6$, $2e_7$, $2e_8$, $2e_9$, $2e_{10}$, $2e_{11}$, $2e_{12}$, $2e_{13}$, $2e_{14}$, $2e_{15}$ and $2e_{16}$.

In the semiconductor memory device 41 illustrated in FIG. 11, the column of the bit line contacts BC51, BC52, and BC53 are provided on one end side, and the column of the bit line contacts BC57, BC58, and BC59 are provided on the other end side. In this case, the bit line contact BC51 on the first row and the first column on the one end side and the bit line contact BC53 on the third row and the first column on the one end side are connected only with the single anti-fuse memories $2e_1$ and $2e_4$, respectively, whereas the bit line contact BC52 on the second row and the first column on the one end side is connected with the two anti-fuse memories $2e_2$ and $2e_3$.

Thus, the first bit line BL1c connected with the bit line contacts BC51 and BC53 on the one end side is connected only with a total of two of the anti-fuse memories $2e_1$ and $2e_4$ through the bit line contacts BC51 and BC53. The second bit line BL2c connected with the bit line contact BC52 on the one end side is connected only with the two anti-fuse memories $2e_2$ and $2e_3$ through the bit line contact BC52.

In the column of the bit line contacts BC57, BC58, and BC59 on the other end side, the bit line contact BC57 (BC59) is connected with the single anti-fuse memory $2e_{13}$ ($2e_{16}$), and the remaining bit line contact BC58 is connected with the two anti-fuse memories $2e_{14}$ and $2e_{15}$. Thus, the fifth bit line BL5c, which is connected with the bit line contacts BC57 and BC59 on the other end side, is connected only with a total of two of the anti-fuse memories $2e_{13}$ and $2e_{16}$ through the bit line contacts BC57 and BC59, and the sixth bit line BL6c, which is connected with the bit line contact BC58 on the other end side, is connected only with the two anti-fuse memories $2e_{14}$ and $2e_{15}$ through the bit line contact BC58. Accordingly, the number of anti-fuse memories connected with each of the bit lines BL1c and BL2c (BL5c and BL6c) provided for the column of the bit line contacts BC51, BC52, and BC53 (BC57, BC58, and BC59) arranged in the periphery is two.

The bit line BL3c arranged in the central region is connected with a total of four of the anti-fuse memories $2e_5$, $2e_9$, $2e_8$, and $2e_{12}$ through the bit line contacts BC54 and BC56, and the bit line BL4c arranged in the central region is connected with the four anti-fuse memories $2e_6$, $2e_7$, $2e_{10}$, and $2e_{11}$ through the bit line contact BC55. Thus, to efficiently perform control with a row address and a column address in the semiconductor memory device 41 illustrated in FIG. 11, it is desirable to, for example, short-circuit the first bit line BL1a and the fifth bit line BL5a to operate four anti-fuse memories at the same bit voltage, and also short-circuit the second bit line BL2a and the sixth bit line BL6a to operate four anti-fuse memories at the same bit voltage, so that the numbers of the anti-fuse memories operating at the same bit voltages are equal to the number (in this case, four) of anti-fuse memories connected with the bit lines BL3c and BL4c in the central region.

Specifically, in the semiconductor memory device 41, it is desirable to operate, through the two of the first bit line BL1c and the fifth bit line BL5c, a total of four of the anti-fuse memories $2e_1$, $2e_4$, $2e_{13}$, and $2e_{16}$ as the sum of a total of two of the anti-fuse memories $2e_1$ and $2e_4$ connected with the first bit line BL1c through the respective bit line contacts BC51 and BC53 and a total of two of the anti-fuse memories $2e_{13}$ and $2e_{16}$ connected with the fifth bit line BL5c through the respective bit line contacts BC57 and BC59.

It is also desirable to operate, through the two of the second bit line BL2a and the sixth bit line BL6a, a total of four of the anti-fuse memories $2a_2$, $2a_3$, $2a_{14}$, and $2a_{15}$ as the sum of the two anti-fuse memories $2a_2$ and $2a_3$ connected with the second bit line BL2a through the bit line contact BC12 and the two anti-fuse memories $2a_{14}$ and $2a_{15}$ connected with the sixth bit line BL6a through the bit line contact BC18.

For example, in the semiconductor memory device 41, capacitance differs between when a bit voltage is applied to the anti-fuse memories $2e_1$, $2e_4$, $2e_{13}$, and $2e_{16}$ through the two of the first bit line BL1c and the fifth bit line BL5c, and when the four anti-fuse memories $2e_5$, $2e_9$, $2e_8$, and $2e_{12}$ ($2e_6$, $2e_7$, $2e_{10}$, $2e_{11}$) are operated through the single third bit line BL3c (the single forth bit line BL4c). Thus, at data reading operation, a problem such as reduction of the reading speed potentially occurs to the semiconductor memory device 41.

Figure 12:
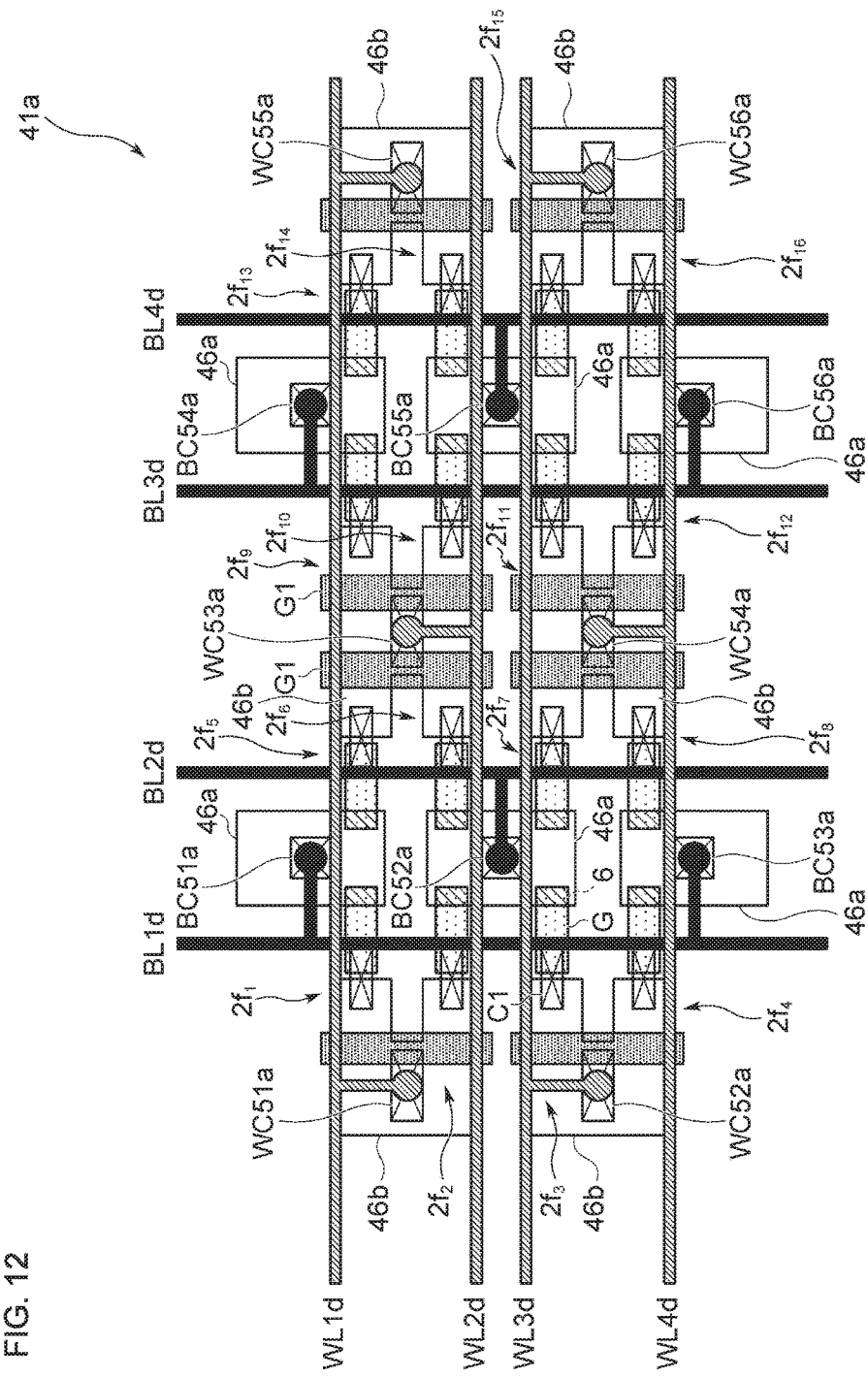
FIG. 12 is a schematic view illustrating the planar layout (2) of word lines and bit lines according to another embodiment.

To solve such a problem, as illustrated in FIG. 12, in which any corresponding part to that in FIG. 11 is denoted by an identical reference sign, a semiconductor memory device 41a includes a column of word line contacts WC51a and WC52a arranged one end side, a column of word line contacts WC55a and WC56a arranged on the other end side, the column of the bit line contacts BC51a, BC52a, and BC53a between the column of the word line contacts WC51a and WC52a on the one end side and a column of word line contacts WC53a and WC54a in a central part, and the column of the bit line contacts BC54a, BC55a, and BC56a between the column of the word line contacts WC55a and WC56a on the other end side and the column of the word line contacts WC53a and BC54a in the central part.

In the semiconductor memory device 41a, among the column of the bit line contacts BC51a, BC52a, and BC53a between the column of the word line contacts WC51a and WC52a on the one end side and the column of the word line contacts WC53a and WC54a in the central part, the bit line contact BC51a on the first row and the bit line contact BC53a on the third row are connected with a first bit line BL1d, and the bit line contact BC52a on the second row is connected with a second bit line BL2d.

In the semiconductor memory device 41a thus configured, the first bit line BL1d is connected with a total of four of anti-fuse memories $2f_1$, $2f_5$, $2f_4$, and $2f_8$, the two anti-fuse memories $2f_1$ and $2f_5$ being connected with the bit line contact BC51a on the first row, and the two anti-fuse memories $2f_4$ and $2f_8$ being connected with the bit line contact BC53a on the third row. With the configuration, the four anti-fuse memories $2f_1$, $2f_5$, $2f_4$ and $2f_8$ can be operated through the single the bit line BL1d.

In the semiconductor memory device 41a, the single second bit line BL2d can be connected with the four anti-fuse memories $2f_2$, $2f_3$, $2f_6$, and $2f_7$ connected with the bit line contact BC52a on the second row. With the configuration, the four anti-fuse memories $2f_2$, $2f_3$, $2f_6$, and $2f_7$ can be operated through the single bit line BL2d.

In the semiconductor memory device 41a, among the column of the bit line contacts BC54a, BC55a, and BC56a between the column of the word line contacts WC55a and WC56a on the other end side and the column of the word line contacts WC53a and WC54a in the central part, the bit line contact BC54a on the first row and the bit line contact BC56a on the third row are connected with a third bit line BL3d, and the bit line contact BC55a on the second row is connected with a forth bit line BL4d.

In the semiconductor memory device 41a thus configured, the single third bit line BL3d is connected with a total of four of anti-fuse memories $2f_9$, $2f_{13}$, $2f_{12}$, and $2f_{16}$, the two anti-fuse memories $2f_9$ and $2f_{13}$ being connected with the bit line contact BC54a on the first row, and the two anti-fuse memories $2f_{12}$ and $2f_{16}$ being connected with the bit line contact BC56a on the third row. With the configuration, the four anti-fuse memories $2f_9$, $2f_{13}$, $2f_{12}$, and $2f_{16}$ can be operated through the single bit line BL3d.

In the semiconductor memory device 41a, the single forth bit line BL4d is connected with the four anti-fuse memories $2f_{10}$, $2f_{11}$, $2f_{14}$, and $2f_{15}$ connected with the bit line contact BC55a on the second row. With the configuration, the four anti-fuse memories $2f_{10}$, $2f_{11}$, $2f_{14}$, and $2f_{15}$ can be operated through the single bit line BL4d.

Accordingly, the bit lines do not need to be connected in the semiconductor memory device 41a unlike the semiconductor memory device 41 illustrated in FIG. 11. The bit lines BL1d, BL2d, BL3d, and BL4d are all single separated lines and can have identical capacitance, which prevents a problem such as reduction of the reading speed at data reading operation.

In the semiconductor memory device 41a, among the word line contacts WC51a, WC53a, and WC55a on the first row, the word line contact WC51a on the first column and the word line contact WC55a on the third column are connected with identical word line WL1d, and the word line contact BC53a on the second column is connected with another word line WL2d different from the word line WL1d. Among the word line contacts WC52a, WC54a, and WC56a on the second row, the word line contact WC52a on the first column and the word line contact WC56a on the third column are connected with identical word line WL3d, and the word line contact WC54a on the second column is connected with another word line WL4d different from the word line WL3d.

The semiconductor memory device 41a thus configured can have the configuration in which, for example, the bit line contact BC52a on the second row and the first column (the bit line contact BC55a on the second row and the second column) is connected with the four anti-fuse memories $2f_2$, $2f_3$, $2f_6$, and $2f_7$ ($2f_{10}$, $2f_{11}$, $2f_{14}$, and $2f_{15}$), thereby achieving downsizing as in the above-described embodiment. In addition, the semiconductor memory device 41a can have the configuration in which, for example, the word line contact WC53a on the first row and the second column (the word line contact WC54a on the second row and the second column) is connected with the four anti-fuse memories $2f_5$, $2f_6$, $2f_9$, and $2f_{10}$ ($2f_7$, $2f_8$, $2f_{11}$, and $2f_{12}$), thereby achieving downsizing as in the above-described embodiment.

In this case, too, for example, the four anti-fuse memories $2f_2$, $2f_3$, $2f_6$, and $2f_7$ connected with the single bit line contact BC52a in the central region are connected with the electrically independently controllable word lines WL1d, WL2d, WL3d, and WL4d. Different word voltages are applied through the respective word lines WL1d, WL2d, WL3d, and WL4d. For example, the four anti-fuse memories $2f_5$, $2f_6$, $2f_9$, and $2f_{10}$ connected with the single word line contact WC53a are connected with the electrically independently controllable bit lines BL1d, BL2d, BL3d, and BL4d. Different bit voltages are applied through the respective bit lines BL1d, BL2d, BL3d, and BL4d.

In the semiconductor memory device 41a, too, data can be programmed only to, for example, the anti-fuse memory $2f_1$ at a predetermined position through "(6-2) Data programming operation" described above, and data can be read from the anti-fuse memory $2f_1$ at a predetermined position through "(1-3) Data reading operation" described above, by adjusting voltages applied to the bit lines BL1d, BL2d, BL3d, and BL4d and the word lines WL1d, WL2d, WL3d, and WL4d as appropriate.

With the above-described configuration, in the semiconductor memory device 41a, the bit line contacts BC51a and BC54a (BC53a and BC56a) disposed in the periphery and arranged in one direction (in this case, the row direction) are connected with the two anti-fuse memories $2f_1$ and $2f_5$ and the two anti-fuse memories $2f_9$ and $2f_{13}$ ($2f_4$ and $2f_8$, and $2f_{12}$ and $2f_{16}$, respectively, and the word line contacts WC51a and WC52a (WC55a and WC56a) disposed in the periphery and arranged in the other direction (in this case, the column direction) are connected with the two anti-fuse memories $2f_1$ and $2f_2$ and the two anti-fuse memories $2f_3$ and $2f_4$ ($2f_{13}$ and $2f_{14}$, and $2f_{15}$ and $2f_{16}$), respectively. In addition, in the semiconductor memory device 41a, the remaining bit line contact BC52a (BC55a) arranged in the central region is connected with the four anti-fuse memories $2f_2$, $2f_3$, $2f_6$, and $2f_7$ ($2f_{10}$, $2f_{11}$, $2f_{14}$, $_{and}$ $_2f_{15}$), and the word line contact WC53a (WC54a) arranged in the central region is connected with the four anti-fuse memories $2f_5$, $2f_6$, $2f_9$, and $2f_{10}$ ($2f_7$, $2f_8$, $2f_{11}$, and $2f_{12}$).

With the configuration, the bit line contacts BC51a to BC56a and the word line contacts WC51a to WC56a are shared by two or more anti-fuse memories in the semiconductor memory device 41a, thereby achieving downsizing of the entire device. In addition, the same number (in this case, four) of anti-fuse memories can be connected with, for example, the single bit line BL1d to have identical capacitance, which prevents a problem such as reduction of the reading speed at data reading operation.

Although the semiconductor memory device 41a illustrated in FIG. 12 includes the sixteen anti-fuse memories, for example, the first word line WL1d and the second word line WL2d are alternately connected with a plurality of word line contacts arranged in the row direction when a larger number of anti-fuse memories are provided. For example, the word line WL1d, which is connected with the word line contact WC51a on the first row and the first column, is also connected with, for example, the word line contact on the first row and the fifth column in addition to the word line contact WC55a on the first row and the third column, whereas the word line WL2d, which is connected with the word line contact WC53a on the first row and the second column, is also connected with, for example, the word line contact on the first row and the forth column and the word line contact on the first row and the sixth column.

In the semiconductor memory device 41a illustrated in FIG. 12, when the number of anti-fuse memories exceeds sixteen, the bit line contacts BC51a, BC54a, . . . (BC53a, BC56a, . . . ) are arranged side by side in the row direction in both peripheries, and a bit line contact row and a word line contact row are alternately arranged in the column direction from one of the peripheries. When n bit line contacts are arranged per row, the number of word line contacts arranged per row is (n+1). In FIG. 12, which illustrates the semiconductor memory device 41a including the sixteen anti-fuse memories, the number of bit line contacts arranged per row is two and the number of word line contacts arranged per row is three.

Figure 13:
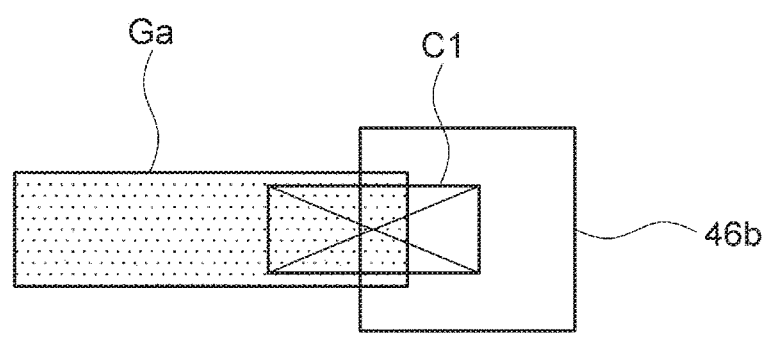
FIG. 13 is a schematic view illustrating a planar layout (1) of a contact according to another embodiment.

In the above-described embodiment, as illustrated in FIG. 10, the active region 46b of the rectifier element 43 and the memory gate electrode G of the memory capacitor 44 are separated from each other in, for example, the anti-fuse memory $2e_4$, and the contact C1 is disposed across the active region 46b and the memory gate electrode G to electrically connect the active region 46b and the memory gate electrode G. However, the present invention is not limited thereto. As illustrated in FIG. 13, a memory gate electrode Ga may be disposed on the active region 46b of the rectifier element, and the contact C1 may be disposed across the active region 46*b* and the memory gate electrode Ga.

Figure 15:
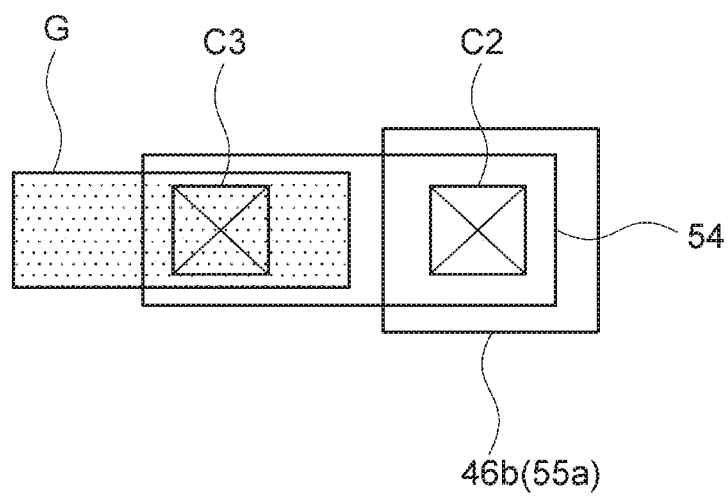
FIG. 15 is a schematic view illustrating a planar layout (2) of the contact according to another embodiment.

Alternatively, as illustrated in FIG. 15, a contact C2 may be provided to the source region of the rectifier element 43 on the active region 46*b* and another contact C3 may be provided on the memory gate electrode G, whereas the active region 46*b* of the rectifier element 43 is separated from the memory gate electrode G of the memory capacitor 44. With the configuration, the contacts C2 and C3 may be connected with each other through a wire 54.

Figure 14:
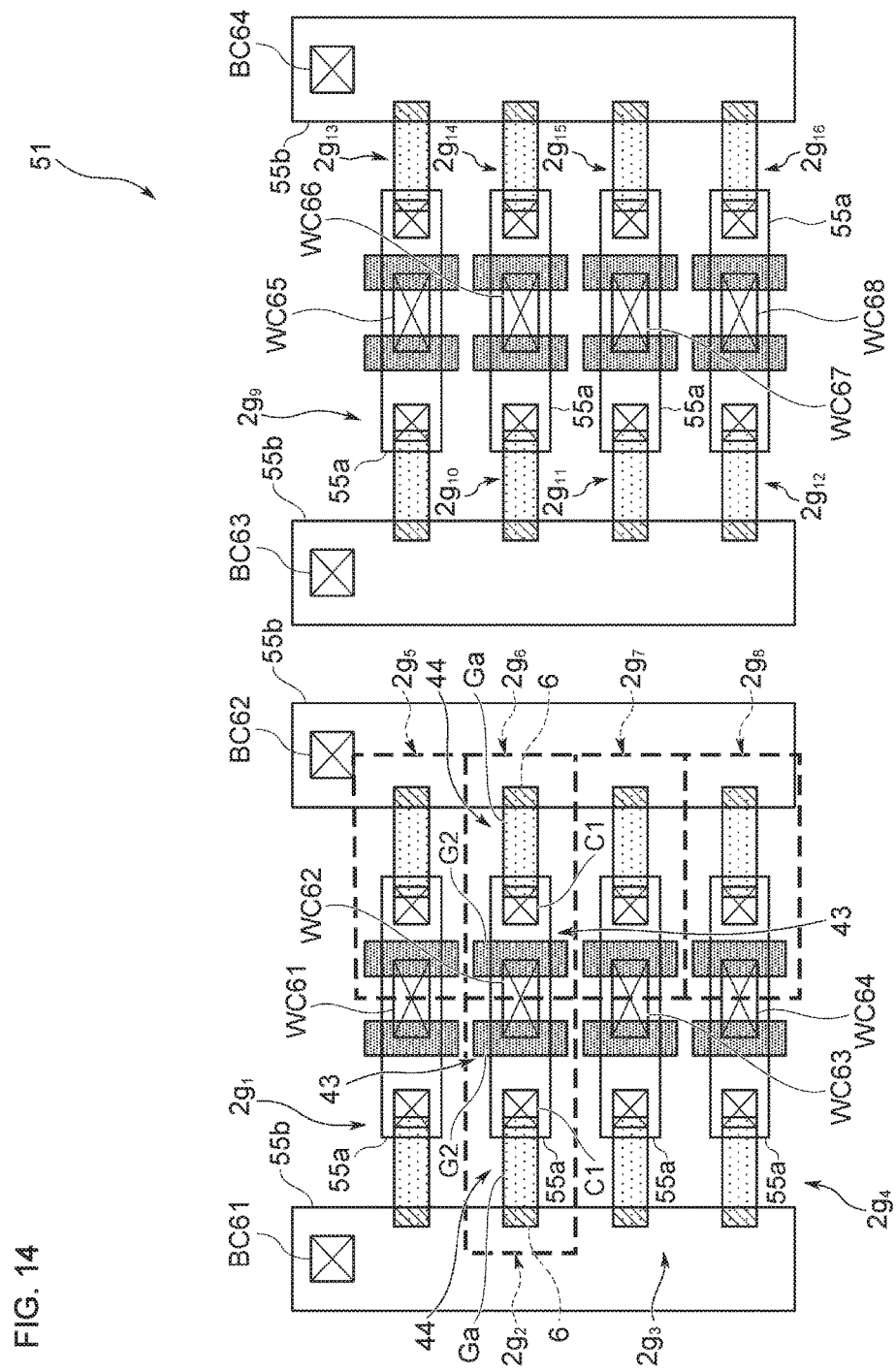
FIG. 14 is a schematic view illustrating a planar layout (2) when each word line contact is shared by two anti-fuse memories arranged in the row direction and each bit line contact is shared by a plurality of anti-fuse memories arranged in the column direction.

(9) Case in which Each Word Line Contact is Shared by Two Anti-fuse Memories and Each Bit Line Contact is Shared by a Plurality of Anti-fuse Memories Arranged in Column Direction FIG. 14, in which any corresponding part to that in FIG. 10 is denoted by an identical reference sign, illustrates a planar layout configuration of a semiconductor memory device 51 including, for example, a total of sixteen of anti-fuse memories $2g_1$, $2g_2$, $2g_3$, $2g_4$, $2g_5$, $2g_6$, $2g_7$, $2g_8$, $2g_9$, $2g_{10}$, $2g_{11}$, $2g_{12}$, $2g_{13}$, $2g_{14}$, $2g_{15}$, and $2g_{16}$ arranged in a 4×4 matrix. In this case, in the semiconductor memory device 51, the anti-fuse memories $2g_1$, $2g_2$, $2g_3$, $2g_4$, $2g_5$, $2g_6$, $2g_7$, $2g_8$, $2g_9$, $2g_{10}$, $2g_{11}$, $2g_{12}$, $2g_{13}$, $2g_{14}$, $2g_{15}$, and $2g_{16}$ all have identical configurations and each include the rectifier element 43 and the memory capacitor 44 similarly to FIGS. 9A and 9B described above. In addition, word line contacts WC61, WC62, WC63, WC64, WC65, WC66, WC67, and WC68 all have identical configurations, and thus the following description will be made mainly on, for example, the word line contact WC62.

In this case, an active region 55*a* of the rectifier element 43 on which the word line contact WC62 is erected has a rectangular shape and is shared by the two anti-fuse memories $2g_2$ and $2g_6$ adjacent to each other in the row direction. Rectifier element gate electrodes G2 of the adjacent anti-fuse memories $2g_2$ and $2g_6$ in the row direction are disposed in the active region 55*a* of the rectifier element 43 on which the word line contact WC62 is erected.

For example, in the anti-fuse memory $2g_2$, the word line contact WC62 is erected across the drain region of the rectifier element 43 in the active region 55*a* and the rectifier element gate electrode G2, and applies a word voltage to the drain region and the rectifier element gate electrode G2. In the anti-fuse memory $2g_2$, the contact C1 is erected across the source region of the rectifier element 43 in the active region 55*a* and the memory gate electrode Ga of the memory capacitor 44 to electrically connect the source region of the rectifier element 43 and the memory gate electrode Ga of the memory capacitor 44.

The word line contact WC62 is also erected across the drain region of the rectifier element 43 and the rectifier element gate electrode G2 in the anti-fuse memory $2g_6$ adjacent to the anti-fuse memory $2g_2$ in the row direction. With the configuration, the word line contact WC62 applies a word voltage from a word line to the two anti-fuse memories $2g_2$ and $2g_6$.

The memory gate electrodes Ga of the two anti-fuse memories $2g_2$ and $2g_6$ each extend in the row direction departing from the active region 55*a* and have leading end parts disposed in different active regions 55*b*. The memory gate insulating films 6 of the anti-fuse memories $2g_2$ and $2g_6$ are disposed in respective regions in which the memory gate electrodes Ga face to the corresponding active regions 55*b*.

The following describes bit line contacts BC61, BC62, BC63, and BC64. In the present embodiment, the semiconductor memory device 51 includes a total of four of the bit line contacts BC61, BC62, BC63, and BC64 arranged side by side in the row direction. The bit line contacts BC61, BC62, BC63, and BC64 are disposed on the active regions 55*b* different from each other and each apply a bit voltage from a bit line (not illustrated) to the corresponding active region 55*b*.

In this case, in the semiconductor memory device 51, the eight anti-fuse memory $2g_1$, $2g_2$, $2g_3$, $2g_4$, $2g_5$, $2g_6$, $2g_7$, and $2g_8$ are arranged in a matrix of rows and columns between the active region 55*b* on which the bit line contact BC61 on the first column is disposed and the active region 55*b* on which the bit line contact BC62 on the second column is disposed. The four anti-fuse memories $2g_1$, $2g_2$, $2g_3$, and $2g_4$ arranged in the column direction are disposed in the active region 55*b* on which the bit line contact BC61 on the first column is disposed, and the anti-fuse memories $2g_5$, $2g_6$, $2g_7$, and $2g_8$ arranged in the column direction are disposed in the active region 55*b* on which the bit line contact BC62 on the second column is disposed.

In the semiconductor memory device 51, the active region 55*b* on which the bit line contact BC62 on the second column is disposed and the active region 55*b* on which the bit line contact BC63 on the third column is disposed extend side by side. Similarly to the above-described configuration, the eight anti-fuse memories $2g_9$, $2g_{10}$, $2g_{11}$, $2g_{12}$, $2g_{13}$, $2g_{14}$, $2g_{15}$ and $2g_{16}$ are arranged in a matrix of rows and columns between the active regions 55*b* of the bit line contact BC63 on the third column and the bit line contact BC64 on the forth column.

In the present embodiment, the four bit line contacts BC61, BC62, BC63, and BC64 all have identical configurations, and thus the following description will be made mainly on the bit line contact BC62. In this case, the active region 55*b* on which the bit line contact BC62 is disposed has a rectangular shape extending in the column direction along the four anti-fuse memories $2g_5$, $2g_6$, $2g_7$, and $2g_8$ arranged in the column direction, and includes the memory gate electrodes Ga of the four anti-fuse memories $2g_5$, $2g_6$, $2g_7$, and $2g_8$ arranged in the column direction. With the configuration, the bit line contact BC62 s connected with the respective different word line contacts WC61, WC62, WC63, and WC64 and applies a bit voltage from a bit line to the four anti-fuse memories $2g_5$, $2g_6$, $2g_7$, and $2g_8$ arranged in the column direction through the active region 55*b*.

With the above-described configuration, in each of the anti-fuse memories $2g_1$, $2g_2$, $2g_3$, $2g_4$, $2g_5$, $2g_6$, $2g_7$, $2g_8$, $2g_9$, $2g_{10}$, $2g_{11}$, $2g_{12}$, $2g_{13}$, $2g_{14}$, $2g_{15}$, and $2g_{16}$ of the semiconductor memory device 51 illustrated in FIG. 14, the voltage application from the memory gate electrode Ga to the word line can be blocked by the rectifier element 43 depending on the values of voltages applied to the memory gate electrode Ga of the memory capacitor 44 and the word line without using a conventional control circuit, as described above in "(6-3) Operations and effects of semiconductor memory device having the above-described configuration". The configuration eliminates the need to provide a switch transistor configured to selectively apply voltage to a memory capacitor, and a switch control circuit for turning on and off the switch transistor as in conventional cases, and accordingly achieves downsizing.

As described above in "(6-3) Operations and effects of semiconductor memory device having the above-described configuration", for example, the anti-fuse memory $2g_6$ in the semiconductor memory device 51 can be provided with a double blocking mechanism including (i) a first blocking mechanism of applying a non-breakdown word voltage of 0 V to a word line (nonselected programming word line) to form no channel in the memory capacitor 44, and (ii) a second blocking mechanism of turning off the rectifier element 43 to block the non-breakdown bit. voltage. The configuration allows execution of a normal data programming operation and thus reliably prevents false operation at data reading.

In the semiconductor memory device 51 illustrated in FIG. 14, the single bit line contact BC62 is shared by the four anti-fuse memories $2g_5$, $2g_6$, $2g_7$, and $2g_8$ arranged in the column direction, and for example, the single word line contact WC62 is shared by the two anti-fuse memories $2g_2$ and $2g_6$ adjacent to each other in the row direction. The configuration achieves downsizing of the entire device as compared to a case in which a bit line contact and a word line contact are individually provided to each anti-fuse memory.

In the above-described embodiment, as illustrated in FIG. 14, the memory gate electrode Ga of the memory capacitor 44 is placed over the active region 55a of the rectifier element 43, and the contact C1 is disposed across the source region of the rectifier element 43 in the active region 55a and the memory gate electrode Ga, but the present invention is not limited thereto. As illustrated in FIG. 15, the contact C2 may be provided to the source region of the rectifier element 43 in the active region 55a and the contact C3 may be provided to the memory gate electrode G whereas the active region 55a of the rectifier element 43 is separated from the memory gate electrode G of the memory capacitor 44, and the contacts C2 and C3 may be connected with each other through a wire 54.

In FIG. 9B described above, the active region 46a is disposed separately from the memory gate electrode G of the memory capacitor 44, and the active region 46b and the memory gate electrode G are connected through the single contact C1. Such a connection configuration is applicable to the semiconductor memory device 51 illustrated in FIG. 14. In this case, for example, the active region 55a in the anti-fuse memory $2g_6$ is disposed separately from the memory gate electrode Ga, and the active region 55a and the memory gate electrode Ga are connected through the single contact C1.

Figure 16:
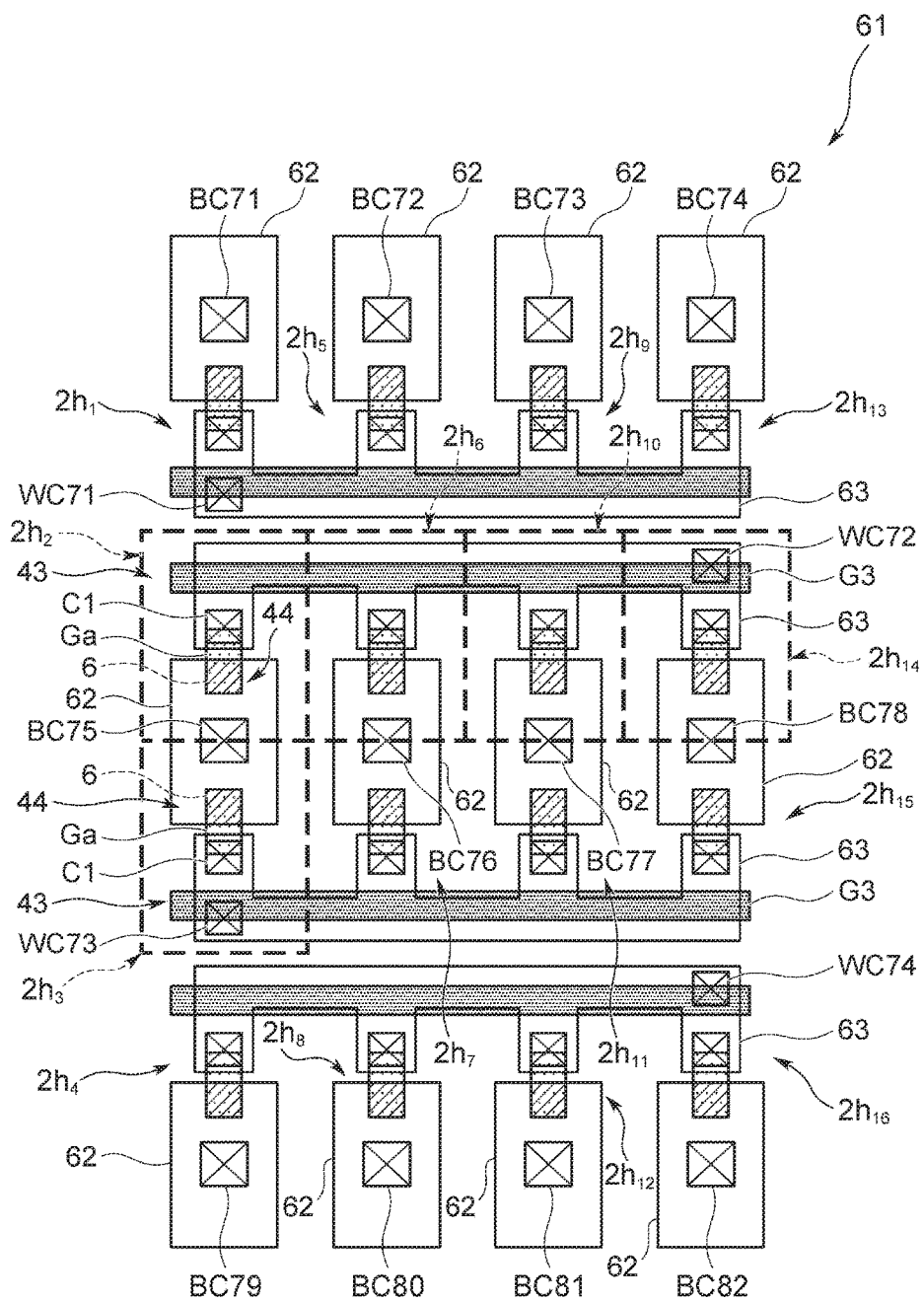
FIG. 16 is a schematic view illustrating a planar layout (2) when each word line contact is shared by a plurality of anti-fuse memories arranged in the row direction and each bit line contact is shared by two anti-fuse memories arranged in the column direction.

(10) Case in which Each Word Line Contact is Shared by a Plurality of Anti-fuse Memories Arranged in Row Direction and Each Bit Line Contact is Shared by Two Anti-fuse Memories FIG. 16, in which any corresponding part to that in FIG. 10 is denoted by an identical reference sign, illustrates a planar layout configuration of a semiconductor memory device 61 including, for example, a total of sixteen of anti-fuse memories $2h_1$, $2h_2$, $2h_3$, $2h_4$, $2h_5$, $2h_6$, $2h_7$, $2h_8$, $2h_9$, $2h_{10}$, $2h_{11}$, $2h_{12}$, $2h_{13}$, $2h_{14}$, $2h_{15}$, and $2h_{16}$ arranged in a 4×4 matrix. In this case, in the semiconductor memory device 61, the anti-fuse memories $2h_1$, $2h_2$, $2h_3$, $2h_4$, $2h_5$, $2h_6$, $2h_7$, $2h_8$, $2h_9$, $2h_{10}$, $2h_{11}$, $2h_{12}$, $2h_{13}$, $2h_{14}$, $2h_{15}$, and $2h_{16}$ all have identical configurations and each include the rectifier element 43 and the memory capacitor 44 similarly to FIGS. 9A and 9B described above. In addition, the word line contacts WC71, WC72, WC73, and WC74 all have identical configurations, and thus the following description will be made mainly on, for example, the word line contact WC72.

In this case, the word line contact WC72 is disposed in an active region 63 having a longitudinal direction extending in the row direction, and is shared by the four anti-fuse memories $2h_2$, $2h_6$, $2h_{10}$ and $2h_{14}$ disposed in the row direction along the active region 63. The drain regions and source regions of the rectifier elements 43 of the four anti-fuse memories $2h_2$, $2h_6$, $2h_{10}$, and $2h_{14}$ arranged in the row direction are disposed in the active region 63 on which the word line contact WC72 is erected, and in addition, a rectifier element gate electrode G3 shared by the four anti-fuse memories $2h_2$, $2h_6$, $2h_{10}$, and $2h_{14}$ is disposed in the active region 63.

In this case, the rectifier element gate electrode G3 has a longitudinal direction extending in the row direction side by side with the longitudinal direction of the active region 63 extending in the row direction. The rectifier element gate electrode G3 is disposed so as to divide the active region 63 into upper and lower parts. With the configuration, each source region is disposed in a region of the active region 63 on one side of the rectifier element gate electrode G3, which is closer to the memory capacitor 44, and each drain region is disposed in a region on the other side. On the active region 55a, the word line contact WC72 is erected across the drain region of the rectifier element 43 and the rectifier element gate electrode G3, and applies a word voltage to the drain region and the rectifier element gate electrode G3.

In this case, the rectifier element gate electrode G3 on which the word line contact WC72 is erected and the drain regions of the active region 63 are shared by the four anti-fuse memories $2h_2$, $2h_6$, $2h_{10}$, and $2h_{14}$ disposed along the active region 63. With the configuration, the word line contact WC72 applies a word voltage from a word line to the four anti-fuse memories $2h_2$, $2h_6$, $2h_{10}$, and $2h_{14}$.

For example, in the anti-fuse memory $2h_2$, the contact C1 is erected across the source region of the rectifier element 43 in the active region 63 and the memory gate electrode Ga of the memory capacitor 44 to electrically connect the source region of the rectifier element 43 and the memory gate electrode Ga. The memory gate electrodes Ga of the anti-fuse memories $2h_2$ and $2h_3$ are disposed in an identical active region 62, and the memory gate insulating films 6 of the anti-fuse memories $2h_2$ and $2h_3$ are disposed in regions facing to the active region 62.

In the semiconductor memory device 61, the active region 63 on which the word line contact WC72 on the second row is erected extend side by side with the active region 63 on which the word line contact WC73 on the third row is erected. The eight anti-fuse memories $2h_2$, $2h_3$, $2h_6$, $2h_7$, $2h_{10}$, $2h_{11}$, $2h_{14}$, and $2h_{15}$ are arranged in a matrix of rows and columns between the two active regions 63 extending side by side.

In the present embodiment, in the semiconductor memory device 61, the drain region of each rectifier element 43 in the active region 63 on which the word line contact WC72 on the second row is erected is provided adjacent to the drain region of the corresponding rectifier element 43 in the active region 63 on which the word line contact WC71 on the first row is erected. The source regions of the rectifier elements 43 in the active region 63 on which the word line contact WC71 on the first row is erected are connected with the memory gate electrodes Ga of the four anti-fuse memories $2h_1$, $2h_5$, $2h_9$, and $2h_{13}$ arranged in the row direction, respectively, through the contacts C1. The drain region of each rectifier element 43 in the active region 63 on which the word line contact WC73 on the third row is erected is provided adjacent to the drain region of the corresponding rectifier element in the active region 63 on which the word line contact WC74 on the forth row is erected. The source regions of the rectifier elements 43 in the active region 63 on which the word line contact WC74 on the forth row is erected are connected with the memory gate electrodes Ga of the four anti-fuse memories $2h_4$, $2h_8$, $2h_{12}$, and $2h_{16}$ arranged in the row direction, respectively, through the contacts C1.

The following describes bit line contacts BC71, BC72, BC73, BC74, BC75, BC76, BC77, BC78, BC79, BC80, BC81, and BC82 in the present embodiment, the semiconductor memory device 61 includes a total of 12 of the bit line contacts BC71, BC72, BC73, BC74, BC75, BC76, BC77, BC78, BC79, BC80, BC81, and BC82 arranged in a 3×4 matrix. The bit line contacts BC71, BC72, BC73, BC74, BC75, BC76, BC77, BC78, BC79, BC80, BC81, and BC82 are disposed in the respective different active regions 62, and each apply a bit voltage from a bit line (not illustrated) to the corresponding active region 62.

The bit line contacts BC75, BC76, BC77, and BC78 arranged in a central region and arranged in the row direction all have identical configurations, and thus the following description will be made mainly on, for example, the bit line contact BC75. In this case, the two anti-fuse memories $2h_2$ and $2h_3$ arranged in the column direction and connected with the different word line contacts WC72 and WC73 are provided in the active region 62 in which the bit line contact BC75 is disposed. With the configuration, the bit line contact BC75 is shared by the two anti-fuse memories $2h_2$ and $2h_3$ and applies a bit voltage from a bit line to the two anti-fuse memories $2h_2$ and $2h_3$.

In the active region 62 on which the bit line contact BC75 is erected, the anti-fuse memories $2h_2$ and $2h_3$ are disposed symmetrically in the column direction. with respect to the bit line contact BC75. Specifically, the active region 62 on which the bit line contact BC75 is erected faces to the memory gate electrode Ga of the anti-fuse memory $2h_2$ on one side where the memory gate insulating film 6 of the anti-fuse memory $2h_2$ is disposed. The active region 62 faces to the memory gate electrode Ga of the anti-fuse memory $2h_3$ on the other side where the memory gate insulating film 6 of the anti-fuse memory $2h_3$ is disposed.

The four the bit line contacts BC71, BC72, BC73, and BC74 (BC79, BC80, BC81, and BC82) arranged in the row direction in the periphery of the planar layout of the semiconductor memory device 61 are connected only with the respective single anti-fuse memories $2h_1$, $2h_5$, $2h_9$, and $2h_{13}$ ($2h_4$, $2h_8$, $2h_{12}$, and $2h_{16}$). With the configuration, the bit line contacts BC71, BC72, BC73, and BC74 (BC79, BC80, BC81, and BC82) arranged in the row direction in the periphery apply bit voltages only to the respective single anti-fuse memories $2h_1$, $2h_5$, $2h_9$, and $2h_{13}$ ($2h_4$, $2h_8$, $2h_{12}$, and $2h_{16}$).

In this manner, the bit line contacts BC71, BC72, BC73, BC74, BC79, BC80, BC81, and BC82 in the periphery apply bit voltages only to the respective single anti-fuse memories $2h_1$, $2h_5$, $2h_9$, $2h_{13}$, $2h_4$, $2h_8$, $2h_{12}$, and $2h_{16}$. However, the bit line contacts BC75, BC76, BC77, and BC78 arranged in the central region apply bit voltages to the two anti-fuse memories $2h_2$ and $2h_3$, the two anti-fuse memories $2h_6$ and $2h_7$, the two anti-fuse memories $2h_{10}$ and $2h_{11}$, and the two anti-fuse memories $2h_{14}$ and $2h_{15}$, respectively. In other words, the single bit line contacts BC75, BC76, BC77, and BC78 are shared by the two anti-fuse memories $2h_2$ and $2h_3$, the two anti-fuse memories $2h_6$ and $2h_7$, the two anti-fuse memories $2h_{10}$ and $2h_{11}$, and the two anti-fuse memories $2h_{14}$ and $2h_{15}$, respectively, which leads to downsizing of the entire device accordingly.

In the above-described configuration, in each of the anti-fuse memories $2h_1$, $2h_2$, $2h_3$, $2h_4$, $2h_5$, $2h_6$, $2h_7$, $2h_8$, $2h_9$, $2h_{10}$, $2h_{11}$, $2h_{12}$, $2h_{13}$, $2h_{14}$, $2h_{15}$, and $2h_{16}$ of the semiconductor memory device 61 illustrated in FIG. 16, the voltage application from the memory gate electrode Ga to the word line can be blocked by the rectifier element 43 depending on values of voltages applied to the memory gate electrode Ga of the memory capacitor 44 and the word line without using a conventional control circuit, as described above in "(6-3) Operations and effects of semiconductor memory device having the above-described configuration". The configuration eliminates the need to provide a switch transistor configured to selectively apply voltage to a memory capacitor, and a switch control circuit for turning on and off the switch transistor as in conventional cases, and accordingly achieves downsizing.

As described above in "(6-3) Operations and effects of semiconductor memory device having the above-described configuration", for example, the anti-fuse memory $2h_2$ in the semiconductor memory device 61 can be provided with a double blocking mechanism including (i) a first blocking mechanism of applying a non-breakdown word voltage of 0 V to a word line (nonselected programming word line) to form no channel in the memory capacitor 44, and (ii) a second blocking mechanism of turning off the rectifier element 43 to block the non-breakdown bit voltage. The configuration allows execution of a normal data programming operation and thus reliably prevents false operation at data reading.

In the semiconductor memory device 61 illustrated in FIG. 16, for example, the single word line contact WC72 is shared by the four anti-fuse memories $2h_2$, $2h_6$, $2h_{10}$, and $2h_{14}$ arranged in one direction (in this case, the row direction), and for example, the single bit line contact BC75 is shared by the two anti-fuse memories $2h_2$ and $2h_3$ adjacent to each other. The configuration achieves downsizing of the entire device as compared to a case in which a bit line contact and a word line contact are individually provided to each anti-fuse memory.

In the semiconductor memory device 61 illustrated in FIG. 16, too, the active region 63 of the rectifier element 43 may be separated from the memory gate electrode Ga of the memory capacitor 44 in, for example, the anti-fuse memory $2h_2$, and a contact provided on the active region 63 and another contact provided on the memory gate electrode Ga may be connected with each other by wiring. Alternatively, as in the configuration illustrated in FIG. 9B, the active region 63 of the rectifier element 43 may be separated from the memory gate electrode Ga of the memory capacitor 44, and the active region 63 and the memory gate electrode Ga may be connected with each other through the single contact C1.

Figure 17:
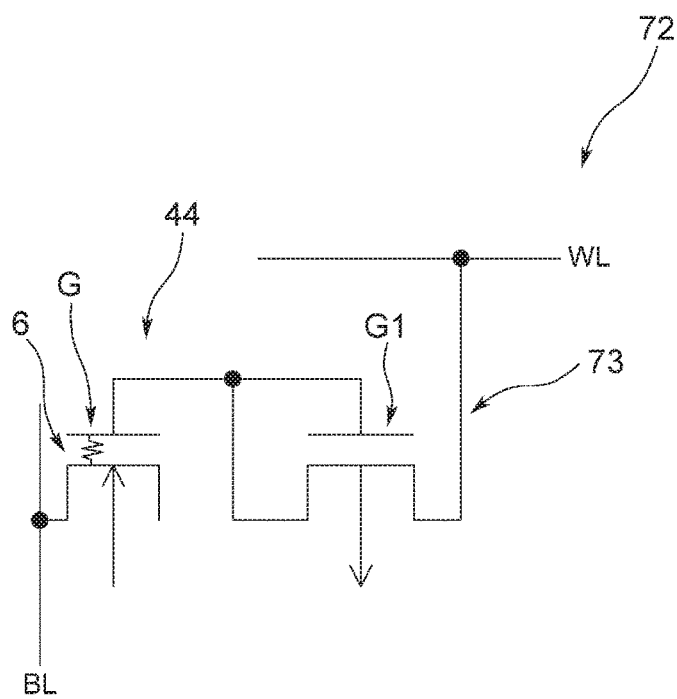
FIG. 17 is a schematic diagram illustrating a circuit configuration of an anti-fuse memory according to another embodiment including a rectifier element having a P-type MOS transistor configuration.

(11) Other Embodiments (11-1) Anti-fuse Memory Including Rectifier Element as P-type MOS Transistor In "(6) Anti-fuse memory including rectifier element as N-type Metal-oxide-semiconductor (MOS) transistor" described above, the anti-fuse memory 42 includes the rectifier element 43 as an N-type MOS transistor, but the present invention is not limited thereto. As illustrated in FIG. 17, in which any corresponding part in FIG. 8 is denoted by an identical reference sign, an anti-fuse memory 72 including a rectifier element 73 as a P-type MOS transistor is applicable. In this case, the anti-fuse memory 72 includes the rectifier element 73 having a semiconductor junction structure of a P-type MOS transistor, and a memory capacitor 44 including a memory gate insulating film 6 to which dielectric breakdown occurs depending on a voltage difference between a bit line BL and a memory gate electrode G.

In this case, the bit line BL is connected with a diffusion region at one end of the memory capacitor 44, and the rectifier element 73 is connected with the memory gate electrode G. In the rectifier element 73, a rectifier element gate electrode G1 and a drain region are both connected with the memory gate electrode G of the memory capacitor 44, a well is connected with a well control terminal, and a source region is connected with a word line WL. With the configuration, the rectifier element 73 is turned off unless an on voltage is applied from the word line WL, thereby blocking voltage application from the memory gate electrode G to the word line WL.

The anti-fuse memory 72 including the rectifier element 73 having such a MOS transistor configuration can be formed to have the sectional configuration as illustrated in FIG. 9A, and thus the rectifier element gate electrode G1 of the rectifier element 73 and the memory gate electrode G of the memory capacitor 44 are disposed within one wiring layer (within the same layer) and have identical thicknesses. The configuration leads to reduction of the thickness of the entire anti-fuse memory 72.

In the anti-fuse memory 72 thus configured, at data programming operation, a breakdown word voltage of 5 V is applied to the word line WL, and a breakdown bit voltage of 0 V is applied to the bit line BL. A voltage of 5 V, which is equal to the breakdown word voltage, is applied from the well control terminal to the well on which the rectifier element 73 is disposed. When the source region of the rectifier element 73 has a potential of 0 V approximately, the rectifier element 73 with a threshold voltage of −0.7 V is turned on to charge the source region to a potential of 4.3 V.

With the configuration, the breakdown word voltage of 5 V is applied from the rectifier element 73 to the memory gate electrode G, and the memory capacitor 44 is turned on to have a channel at a potential of 0 V since the bit line is at 0 V. As a result, in the memory capacitor 44, a large voltage difference is generated between the memory gate electrode G and each of the channel and the diffusion region due to the breakdown bit voltage and the breakdown word voltage. Accordingly, in the anti-fuse memory 72 to which data is to be programmed, dielectric breakdown occurs to the memory gate insulating film 6 below the memory gate electrode G at the memory capacitor 44, and the memory gate electrode G and the diffusion region become a conductive state at low resistance, thereby achieving a data programmed state of the memory capacitor 44.

Similarly to "(6-2) Data programming operation" described above, in the anti-fuse memory 72 to which no data is to be programmed and in which a non-breakdown bit voltage of 3 V is applied to the bit line BL and a non-breakdown word voltage of 0 V is applied to the word line WL, the non-breakdown bit voltage of 3 V applied to the bit line BL is applied to the source region of the rectifier element 73 through the memory gate electrode G of the memory capacitor 44 when dielectric breakdown has already occurred to, for example, the memory gate insulating film 6 of the memory capacitor 44. However, since the rectifier element 73 is turned off in this case, the non-breakdown bit voltage of 3 V applied to the bit line BL is prevented from being applied to the word line WL in the anti-fuse memory 72, and thus the potential of the word line WI does not change.

In the anti-fuse memory 72 to which no data is to be programmed and in which the breakdown word voltage of 5 V is applied to the word line WL and the non-breakdown bit voltage of 3 V is applied to the bit line BL, the voltage difference between the memory gate electrode G and the diffusion region decreases in the memory capacitor 44. Accordingly, the memory gate insulating film 6 of the memory capacitor 44, to which no dielectric breakdown occurs, remains in an insulation state without dielectric breakdown, thereby maintaining a no-data programmed state.

In a semiconductor memory device including a matrix of rows and columns of the anti-fuse memories 72 thus configured, data can be read from desired one of the anti-fuse memories 72 through "(1-3) Data reading operation" described above, and thus a description thereof is omitted.

In the above-described configuration, as described above, in the anti-fuse memory 72 to which no data is to be programmed, when a high non-breakdown bit voltage is applied to the bit line BL connected with the memory capacitor 44 while dielectric breakdown occurs to, for example, the memory gate insulating film 6 of the memory capacitor 44, the channel of the rectifier element 73 is turned off (in a non-conductive state) to block application of the non-breakdown bit voltage from the memory gate electrode G of the memory capacitor 44 to the word line WL.

Thus, as described above, the anti-fuse memory 72 includes the rectifier element 73 having a transistor configuration and configured to be turned off to block the voltage application from the memory gate electrode G to the word line WL depending on values of voltages applied to the memory gate electrode G and the word line WL without using a conventional control circuit. The configuration eliminates the need to provide a switch transistor configured to selectively perform each voltage application to the memory capacitor 44 and a switch control circuit for turning on and off the switch transistor, and accordingly achieves downsizing.

Such an anti-fuse memory 72 can be provided with a double blocking mechanism including (i) a first blocking mechanism of applying a non-breakdown word voltage of 0 V to the word line (nonselected programming word line) WL to form no channel in the memory capacitor 44, and (ii) a second blocking mechanism of turning off the rectifier element 73 to block the non-breakdown bit voltage. The configuration allows execution of a normal data programming operation and thus reliably prevents false operation at data reading.

In addition, the anti-fuse memory 72 achieves a configuration same as those described above in "(7) Case in which each word line contact and each bit line contact are shared by four anti-fuse memories", "(8) Planar layout configuration of bit lines and word lines according to another embodiment", "(9) Case in which each word line contact is shared by two anti-fuse memories and each bit line contact is shared by a plurality of anti-fuse memories arranged in column direction", and "(10) Case in which each word line contact is shared by a plurality of anti-fuse memories arranged in row direction and each bit line contact is shared by two anti-fuse memories". Thus, similarly to each embodiment, a single bit line contact and a single word line contact can be shared by a plurality of the anti-fuse memories 72, which leads to downsizing of the entire device as compared to a case in which the bit line contact and the word line contact are individually provided to each anti-fuse memory.

Figure 18A:
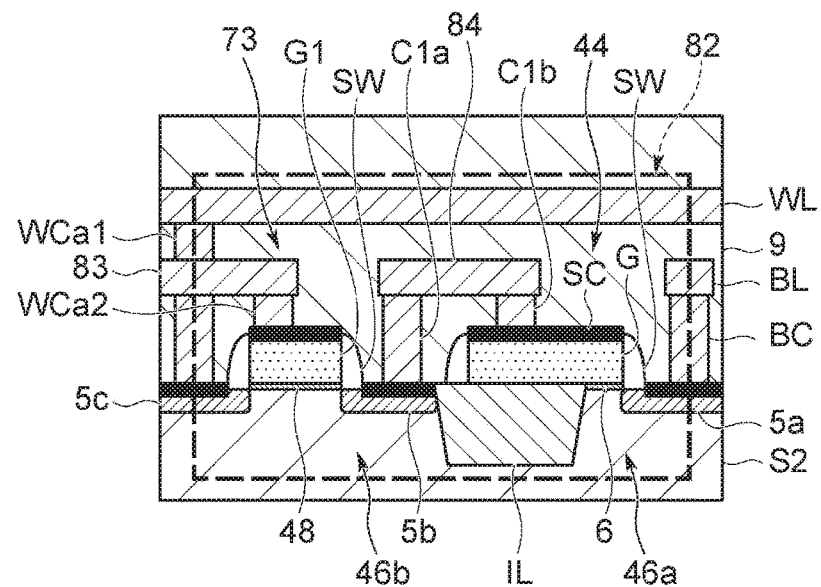
FIG. 18A is a schematic view illustrating a sectional configuration of the anti-fuse memory according to another embodiment.

(11-2) Configurations of Anti-fuse Memory Including Rectifier Element Having Transistor Configuration According to Other Embodiments In the above-described embodiment, as illustrated in FIGS. 9A and 9B, the single word line contact WC is erected across the diffusion region 5c serving as the drain region of the rectifier element 43 and the rectifier element gate electrode G1, but the present invention is not limited thereto. As illustrated in FIG. 18A, in which any corresponding part to that in FIG. 9A. is denoted by an identical reference sign, and FIG. 18B, in which any part identical to that in FIG. 9B is denoted by an identical reference sign. (FIG. 18A illustrates a cross section taken along line C-C' in FIG. 18B), a word line contact WCa1 may be provided to connect the word line WL with the diffusion region 5c serving as the drain region of the rectifier element 43, and may be connected with the rectifier element gate electrode G1 through another word line contact WCa2 and a wire 83.

Figure 18B:
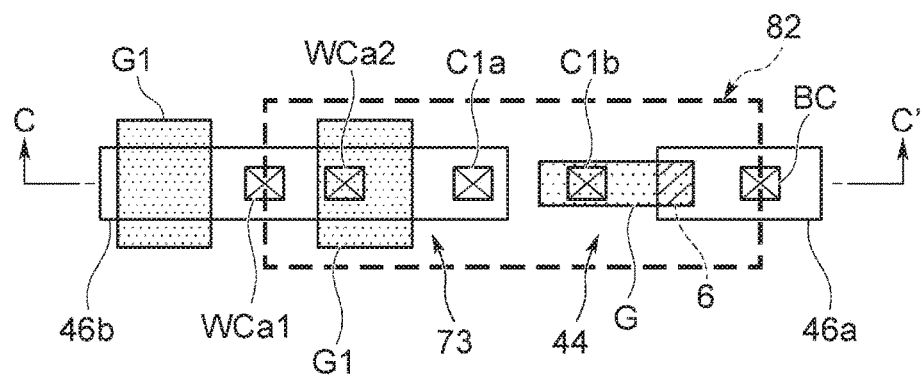
FIG. 18B is a schematic view illustrating a planar layout of the anti-fuse memory illustrated in FIG. 18A.

In the above-described embodiment, as illustrated in FIGS. 9A and 9B, the single contact C1 is erected across the diffusion region 5b serving as the source region of the rectifier element 43 and the memory gate electrode G of the memory capacitor 44, but the present invention is not limited thereto. As illustrated in FIGS. 18A and 18B, a pillar-shaped contact C1a may be provided on the diffusion region 5b serving as the source region of the rectifier element 43, and another contact C1b may be provided on the memory gate electrode G of the memory capacitor 44, the two contacts C1a and C1b being connected with each other through a wire 84. Then, an anti-fuse memory 82 having a configuration as illustrated in FIGS. 18A and 18B can achieve effects same as the above-described embodiments.

(11-3) Others

The present invention is not limited to the present embodiments, but various kinds of modifications are possible without departing from the scope of the present invention. For example, the anti-fuse memories described in the above-described embodiments may be combined as appropriate. In another embodiment, each above-described embodiment may be combined with, for example, the anti-fuse memory 42 including the rectifier element 43 as an N-type transistor illustrated in FIGS. 9A and 9B, the anti-fuse memory 72 including the rectifier element 73 as a P-type transistor illustrated in FIG. 17, and the cross sections illustrated in FIGS. 9A and 18A, as appropriate. In each embodiment, the row direction or the column direction may be taken as one direction, and in this case, the other direction is the column direction or the row direction, which is orthogonal to the one direction.

Various kinds of configurations are applicable that provide electrical connection between the active region (source region) of the rectifier element 43 and the memory gate electrode of the memory capacitor 44. For example, the various above-described embodiments may be combined as appropriate to achieve connections between the active regions (source regions) 46b and 55a of the rectifier element 43 and the memory gate electrodes Ga and G as illustrated in FIGS. 9B, 13, and 15.

In each embodiment, the number of anti-fuse memories may be any number. The numbers of bit line contacts and word line contacts and the numbers of bit lines and word lines change in accordance with the number of anti-fuse memories. Accordingly, the numbers of bit line contacts and word line contacts arranged in the central region change in a semiconductor memory device.

REFERENCE SIGNS LIST

1, 1a, 21, 31, 41, 41a, 51, 61 semiconductor memory device

2a, 2b, 2c, 2d, $2a_1 \ldots 2a_{16}$, $2b_1 \ldots 2b_{16}$, $2c_1 \ldots 2c_{16}$, $2d_1 \ldots 2d_{16}$, $2e_1 \ldots 2e_{16}$, $2f_1 \ldots 2f_{16}$, $2g_1 \ldots 2g_{16}$, $2h_1 \ldots 2h_{16}$, 42, 72, 82 anti-fuse memory

3, 43 rectifier element

4, 44 memory capacitor

G, Ga memory gate electrode

6 memory gate insulating film

S2 well

BC, BC11 . . . BC19, BC1a . . . BC6a, BC21 . . . BC24, BC31 . . . BC42, BC51 . . . BC59, BC51a . . . BC56a, BC61 . . . BC64, BC71 . . . BC82 bit line contact WC, WC11 . . . WC14, WC1a . . . WC6a, WC21 . . . WC28, WC31 . . . WC34, WC51 . . . WC54, WC51a . . . WC56a, WC61 . . . WC68, WC71 . . . WC74 word line contact WLa, WLb, WL1a . . . WL4a, WL1b . . . WL4b, WL1c . . . WL4c, WL1d . . . WL4d word line BLa, BLb, BL1a . . . BL6a, BL1b . . . BL4b, BL1c . . . BL6c, BL1d . . . BL4d bit line

What is claimed is:

1. A semiconductor memory device including anti-fuse memories at intersections between a plurality of word lines and a plurality of bit lines,
   wherein each anti-fuse memory includes:
   a memory capacitor in which a memory gate electrode is disposed through a memory gate insulating film and a bit line of the plurality of bit lines is connected to, through a bit line contact, a diffusion region disposed in a well; and
   a rectifier element disposed between the memory gate electrode and a word line of the plurality of word lines and configured to allow voltage application from the word line to the memory gate electrode through a word line contact and block voltage application from the memory gate electrode to the word line depending on values of voltages applied to the memory gate electrode and the word line, and
   wherein the bit line contact is shared by two or more of the anti-fuse memories.

2. The semiconductor memory device according to claim 1, wherein the word line contact is connected with two or more of the anti-fuse memories.

3. A semiconductor memory device including anti-fuse memories at intersections between a plurality of word lines and a plurality of bit lines,
   wherein each anti-fuse memory includes:
   a memory capacitor in which a memory gate electrode is disposed through a memory gate insulating film and a bit line of the plurality of bit lines is connected to, through a bit line contact, a diffusion region disposed in a well; and
   a rectifier element disposed between the memory gate electrode and a word line of the plurality of word lines and configured to allow voltage application from the word line to the memory gate electrode through a word line contact and block voltage application from the memory gate electrode to the word line depending on values of voltages applied to the memory gate electrode and the word line, and
   wherein the word line contact is shared by two or more of the anti-fuse memories.

4. The semiconductor memory device according to claim 1, wherein the bit line contact is shared by four of the anti-fuse memories adjacent to each other, and the word line contact is shared by four of the anti-fuse memories adjacent to each other.

5. The semiconductor memory device according to claim 4, wherein
   the four anti-fuse memories connected with the bit line contact are connected with the word lines electrically independently controllable, and the four anti-fuse memories connected with the word line contact are connected with the bit lines electrically independently controllable.

6. The semiconductor memory device according to claim 1, wherein each of the bit lines applies voltage to two or more of the anti-fuse memories through the bit line contact, and each of the word lines applies voltage to two or more of the anti-fuse memories through the word line contact.

7. The semiconductor memory device according to claim 1, wherein
the word line contact and additional word line contacts are provided to define a plurality of word line contacts,
the plurality of word line contacts includes first word line contacts and second word line contacts,
the first word line contacts are disposed in a periphery and arranged in a predetermined direction and each of the first word line contacts is connected with two of the anti-fuse memories, and
the second word line contacts are disposed in a central region and each of the second word line contacts is connected with four of the anti-fuse memories.

8. The semiconductor memory device according to claim 1, wherein the bit line contact is shared by two or more of the anti-fuse memories arranged in one direction,
two of the anti-fuse memories disposed adjacent to each other are connected to the bit line contact and another bit line contact, respectively, and
the word line contact is shared by the two of the anti-fuse memories disposed adjacent to each other.

9. The semiconductor memory device according to claim 1, wherein the word line contact is shared by two or more of the anti-fuse memories arranged in one direction,
two of the anti-fuse memories disposed adjacent to each other are connected to the word line contact and another word line contact, respectively, and
the bit line contact is shared by the two of the anti-fuse memories disposed adjacent to each other.

10. The semiconductor memory device according to claim 1, wherein, in each anti-fuse memory,
the voltage applied to the word line is applied through the rectifier element to the memory gate electrode, to cause breakdown of the memory gate insulating film due to a voltage difference between the memory gate electrode and the bit line, so as to program data into the memory capacitor, and
the application of the voltage from the memory gate electrode of the memory capacitor to the word line is blocked in a case where the memory gate electrode has a higher voltage than the word line, so as not to program data into the memory capacitor.

11. The semiconductor memory device according to claim 1, wherein the rectifier element of each anti-fuse memory includes a semiconductor junction structure of a PN junction diode in which a P-type semiconductor region and an N-type semiconductor region are joined with each other, the P-type semiconductor region being connected with the word line through the word line contact, and the N-type semiconductor region being connected with the memory gate electrode.

12. The semiconductor memory device according to claim 11, wherein the P-type semiconductor region and the N-type semiconductor region included in the rectifier element of each anti-fuse memory are formed integrally with the memory gate electrode.

13. The semiconductor memory device according to claim 1, wherein the rectifier element of each anti-fuse memory includes an N-type MOS (Metal-oxide-semiconductor) transistor or a P-type MOS transistor, and
a source region is connected with the memory gate electrode, and
a drain region is connected with the word line, and
a rectifier element gate electrode is connected with one of the word line and the memory gate electrode, and
the rectifier element blocks the application of the voltage from the memory gate electrode to the word line by allowing a channel to be in a non-conductive state.

* * * * *